United States Patent
Teo et al.

(10) Patent No.: US 10,833,102 B2
(45) Date of Patent: Nov. 10, 2020

(54) LOW POWER 2D MEMORY TRANSISTOR FOR FLEXIBLE ELECTRONICS AND THE FABRICATION METHODS THEREOF

(71) Applicant: Mitsubishi Electric Research Laboratories, Inc., Cambridge, MA (US)

(72) Inventors: Koon Hoo Teo, Lexington, MA (US); Pin-Chun Shen, Cambridge, MA (US); Chungwei Lin, Arlington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 16/356,067

(22) Filed: Mar. 18, 2019

(65) Prior Publication Data

US 2020/0303417 A1 Sep. 24, 2020

(51) Int. Cl.
| | | |
|---|---|---|
| *G11C 11/22* | (2006.01) | |
| *G11C 14/00* | (2006.01) | |
| *G06F 12/02* | (2006.01) | |
| *H01L 27/11597* | (2017.01) | |

(Continued)

(52) U.S. Cl.
CPC .... *H01L 27/11597* (2013.01); *G06F 12/0238* (2013.01); *G11C 11/2273* (2013.01); *G11C 11/2275* (2013.01); *G11C 11/2297* (2013.01); *G11C 14/009* (2013.01); *G11C 14/0045* (2013.01); *H01L 27/11502* (2013.01); *H01L 27/11585* (2013.01)

(58) Field of Classification Search
CPC ......... H01L 27/11597; H01L 27/11502; H01L 27/11585; H01L 27/1159; H01L 29/516; H01L 2024/1441; H01L 2924/10722; G11C 11/2273; G11C 11/2275; G11C 11/223
See application file for complete search history.

(56) References Cited

U.S. PATENT DOCUMENTS

| | | | | |
|---|---|---|---|---|
| 10,163,932 B1* | 12/2018 | Sinitskii | ............... | H01L 27/1159 |
| 2011/0096210 A1* | 4/2011 | Koshino | ........... | H01L 27/14627 348/273 |

(Continued)

OTHER PUBLICATIONS

Xu. Enhanced light-matter interaction of a MoS2 monolayer with a gold mirror layer. RSC Ad. 2017, 7, pp. 23109-23013 (Year: 2017).*

(Continued)

*Primary Examiner* — Galina G Yushina
(74) *Attorney, Agent, or Firm* — Gennadiy Vinokur; James McAleenan; Hironori Tsukamoto

(57) ABSTRACT

Devices and methods of a transistor device that include a flexible memory cell. The flexible memory cell having a gate stack with sidewalls provided over a substrate. The gate stack including a metal gate layer provided over the substrate. A buffer layer provided over the metal gate layer. A ferroelectric layer provided over the buffer layer. A dielectric layer provided over the ferroelectric layer. Further, a two-dimensional (2D) material layer provided over a portion of a top surface of the dielectric layer. Source and drain regions provided on separate portions of the top surface of the dielectric layer so as to create a cavity that the 2D material layer are located.

28 Claims, 33 Drawing Sheets

(51) Int. Cl.
  *H01L 27/11502* (2017.01)
  *H01L 27/11585* (2017.01)

(56) References Cited

U.S. PATENT DOCUMENTS

2011/0316059 A1* 12/2011 Ahn .................. H01L 29/78391
  257/295
2014/0077161 A1* 3/2014 Duan .................. H01L 29/4958
  257/29
2017/0199457 A1* 7/2017 Hatakeyama ..... H01L 21/32139

OTHER PUBLICATIONS

Yap et al. Ferroelectric transistors with monolayer molybdenum disulfide and ultra-thin aluminum-doped hafnium oxide, Appl. Phys. Lett, 111, 013103 (2017), pp. 013103-1-013103-5 (Year: 2017).*

Jerry et al. A ferroelectric field effect transistor based synaptic weight cell. J. Phys. D: Appl. Phys. 51 (2018), 434001, pp. 1-7 (Year: 2018).*

Hoffman et al. Ferroelectric Field Effect Transistors for Memory Applications. Advanced Materials, 2010, 22. pp. 2956-2961 (Year: 2010).*

Lipatov et al. Optoelectrical Molybdenum Disulfide (MoS2)—Ferroelectric Memories. American Chemical Society, vol. 9, No. 8, pp. 8089-8098, 2015 (Year: 2015).*

Barmenkov. Effective length of short Fabry-Perot cavity formed by uniform fiber Bragg grating, Optics Express, vol. 14, No. 14, 2006 (Year: 2006).*

Oh et al. HfZrOx-Based Ferroelectric Synapse Device With 32 Levels of Conductance States for Neuromorphic Applications. Ieee Electron Device Letters, vol. 38, No. 6, 2017, pp. 732-735 (Year: 2017).*

* cited by examiner

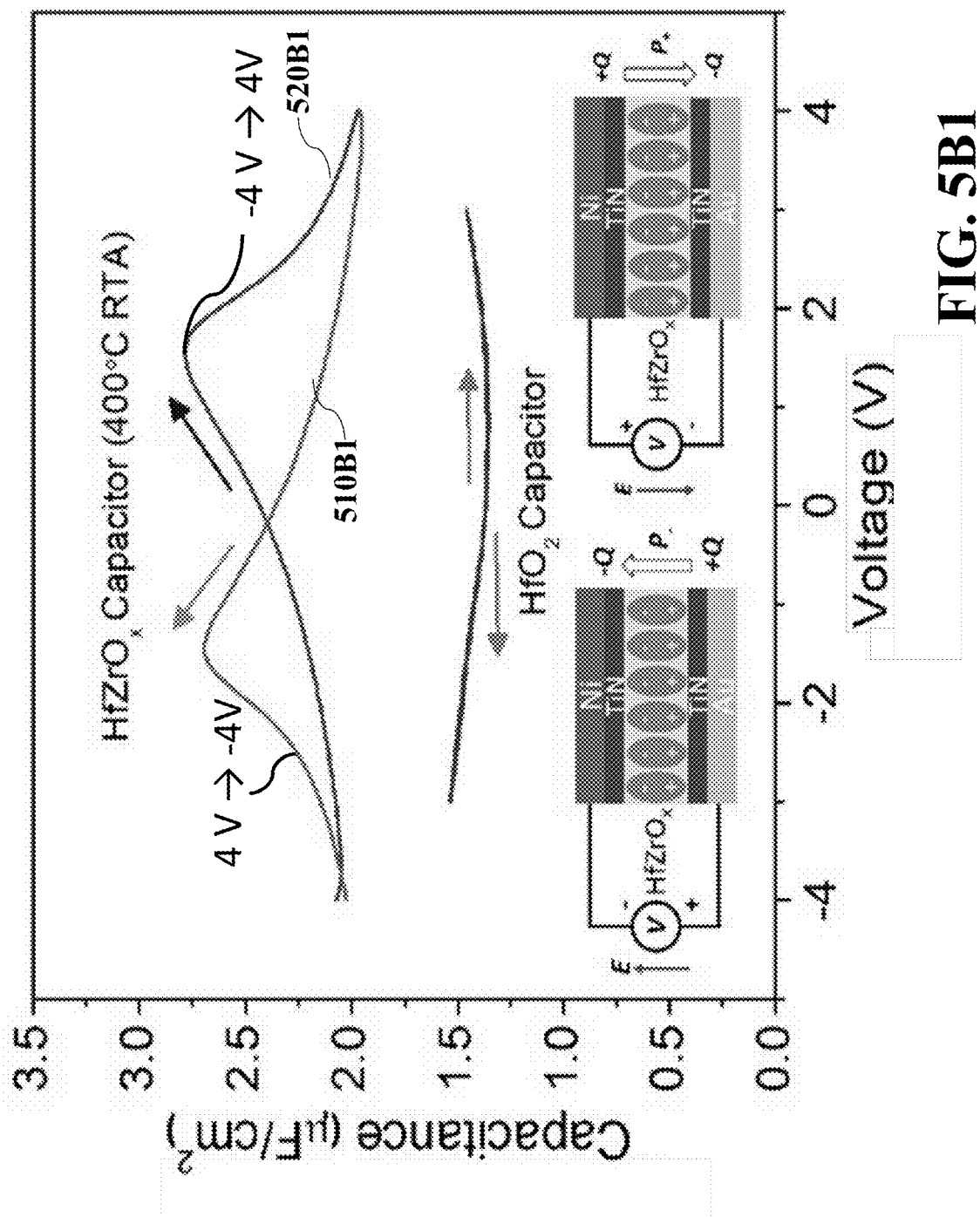
FIG. 5B1

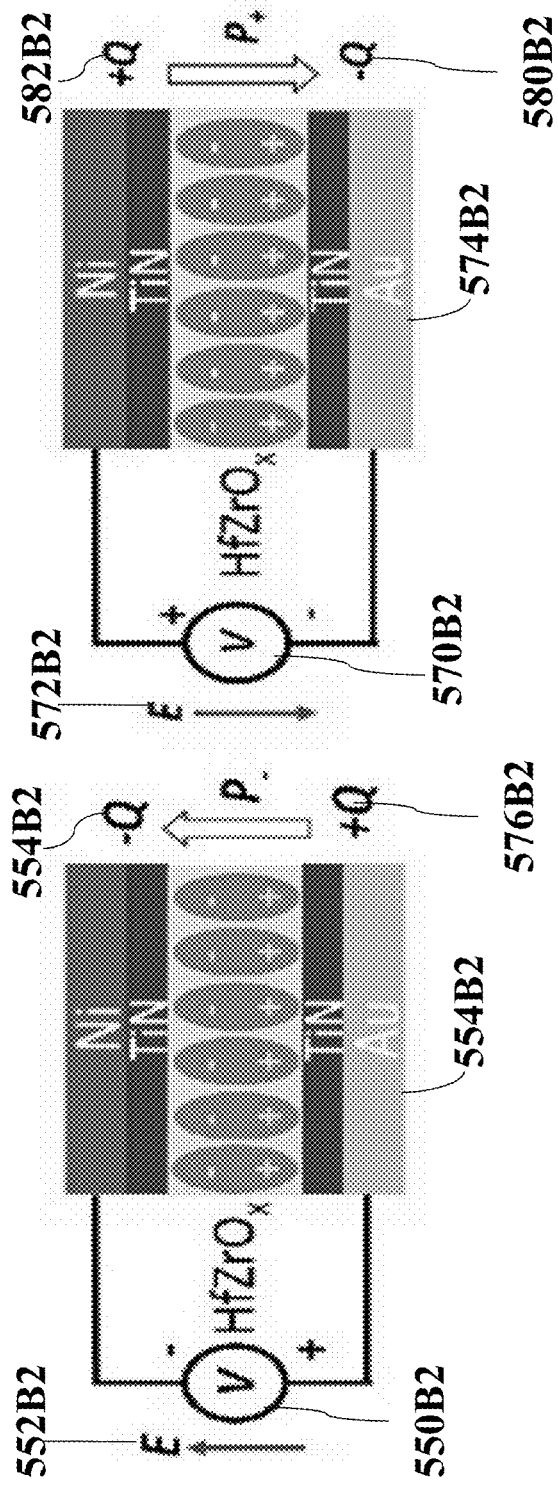
FIG. 5B2

| Channel material | Ferroelectric | Poling voltage | Drain voltage | Drain current | On/off ratio | Reference |
|---|---|---|---|---|---|---|
| CVD MoS$_2$ | HfZrO$_x$ | <3 V | 0.4 V | >10$^{-6}$ A | >10$^3$ | Our work |
| Exfoliated MoS$_2$ | CuInP$_2$S$_6$ | ±5 V | 0.1 V | ~10$^{-7}$ A | >10$^2$ | 16 |
| Exfoliated MoS$_2$ | P(VDF-TrFE) | ±20 V | 1 V | ~10$^{-5}$ A | >10$^3$ | 20 |
| In$_2$O$_3$ nanowires | P(VDF-TrFE) | ±20 V | 1 V | ~10$^{-5}$ A | >10$^6$ | 18 |
| C$_8$-BTBT | P(VDF-TrFE) | ±30 V | -10 V | ~10$^{-4}$ A | ~10$^6$ | 36 |
| Exfoliated MoSe$_2$ | P(VDF-TrFE) | ±35 V | 1 V | ~10$^{-7}$ A | >10$^5$ | 17 |

FIG. 9

LOW POWER 2D MEMORY TRANSISTOR FOR FLEXIBLE ELECTRONICS AND THE FABRICATION METHODS THEREOF

FIELD

The present invention relates generally to device structures and fabrication methods to build flexible electronics including memory devices by using a two-dimensional material layer with an integration of ferroelectric materials.

BACKGROUND

In view of today's compute system demands, there is an urgent demand for lowering power consumption and increasing performance of conventional computing systems. Some conventional strategies, can include scaling of silicon-based device dimension and shrinking the conventional memory cell size can no longer be useful at a certain technology node due to issues like severely tunneling leakage current and high dissipated power.

In addition, todays conventional modern computers are based on architectures, including the von Neumann architecture, wherein data are fetched from a memory unit, transmitted to a processing unit, and then transmitted back to the memory unit to be stored. In other words, the rate at which data can be transmitted between the processing unit and memory unit, represents a fundamental limitation of conventional modern computers.

For example, memories and in particular non-volatile memories are of particular importance of today's computing systems, for instance for being used in personal digital assistants (PDAs) and notebook personal computers (PCs) where high-density, compact, and low power-consumption storage devices are needed to replace the use of bulky hard disk drives. Another example of a conventional non-volatile memory is flash memory, such that, a main problem is that flash memory devices need a lot of voltages (20V) for writing and erasing processes, which are incompatible with a complementary metal-oxide semiconductor (CMOS) baseline. CMOS is the semiconductor technology used in transistors that are manufactured into most of today's computer microchips. Wherein, the semiconductors are made of silicon and germanium, materials which "sort of" conduct electricity, but not really.

Therefore, there is a need for novel and improved compute architectures to overcome some of the fundamental limitations of conventional modern computers and develop a device having a rate at which data can be transmitted between a processing unit and a memory unit resulting in lowering power consumption and increasing performance of computing systems.

SUMMARY

Some embodiments relate generally to device structures and fabrication methods to build flexible electronics including memory devices by using a two-dimensional material layer with an integration of ferroelectric materials.

Some realizations of the present disclosure obtained from experimentation include developing a device architecture and fabrication method that preserves the quality and can unlock a property of flexibility of two-dimensional materials for integration with ferroelectrics to make flexible resistive switching memory devices, among other aspects. At least one feature of some of the embodiments of the present disclosure, among many features, is that a two-dimensional material layer can be placed on top of the gate stack of ferroelectric and dielectric. This unique fabrication process allows for any high-temperature processes that are required to enhance the performance of the ferroelectricity, despite allowing for the high-temperature processes, there is no limitation of decomposition or degradation of the two-dimensional material layer. Further, the quality of the two-dimensional material used in this device also results in its electronic performances being preserved. At least another feature of some of the embodiments of the present disclosure is that some devices can be flexible and operated on flexible substrates. At least one aspect of the configuration of the bottom-gated structures results in allowing the use of metal or conductive foils as the gate and enable transferring to any desired substrates.

After extensive experimentation and learned lessons and realizations, the present disclosure developed a single-layer molybdenum disulfide ($MoS_2$) ferroelectric field-effect transistor (FeFET) including a flexible memory cell. The flexible memory cell includes a gate stack with sidewalls provided over a supporting substrate. The gate stack includes a metal layer acting as a metal gate provided over a supporting substrate. A titanium nitride (TiN) buffer layer provided over the metal layer. Inorganic ferroelectric film of zirconium-doped hafnium oxide ($HfZrO_x$) provided over the TiN buffer. A dielectric hafnium(IV) oxide ($HfO_2$) layer provided over the $HfZrO_x$ film. Two-dimensional (2D) materials including grown $MoS_2$ flakes transferred on to a portion of a top surface of the $HfO_2$ layer forms a two-dimensional material layer. Source and drain regions provided on separate portions on the top surface of the $HfO_2$ layer so as to create a cavity that the 2D material are located.

For example, the $MoS_2$ FeFET device includes a monolayer $MoS_2$ grown by chemical vapor deposition (CVD), with a scalable and manufacturing compatible process, used as a resistive switching channel to fabricate FeFETs. This CVD $MoS_2$ can be integrated with a hybrid gate stack of $HfO_2$/ferroelectric $HfZrO_x$ thin film. Wherein the programming processes in the 2D $MoS_2$ FeFETs originates from the ferroelectric polarization switching, it can yield two distinct write and erase states for memory devices and cumulative channel conductance for artificial synapse applications. In particular, the 2D FeFET's showed a low-voltage-driven feature and gate-tunable ferroelectric hysteresis characteristics. Wherein the thin $HfO_2$ layer in the hybrid gate stack plays crucial roles in preserving the ferroelectricity of the device and lowering the threshold of poling voltages through energy redistribution. Such that the optical properties of the $MoS_2$ placed on the hybrid $HfO_2$/ferroelectric $HfZrO_x$ insulator can also be characterized.

Some experimentation included organic ferroelectric polymers in FeFETs because of some advantages regarding large-scale preparation and mechanical flexibility. For example, one experiment included 2D $MoSe_2$ FeFET using organic ferroelectric poly(vinylidenefluoride-trifluoroethylene (P(VDF-TrFE)). This device displayed a large hysteresis of electronic transport with an over $10^5$ write/erase ratio and good retention and endurance performance, demonstrating the suitability of using 2D materials as the channel material for FeFET technology. However, because organic ferroelectric materials can be usually highly soluble in common organic solvents and show low thermal budgets, integrating organic ferroelectric-based devices into integrated circuits (ICs) gets essentially restricted considering that a high-performance computing systems require complicated semiconductor manufacturing processes. Moreover, the organic FeFETs in general showed a high poling voltages (e.g. ±35

V for the 2D MoSe$_2$ FeFET), likely due to the spin-coating-process-limited thickness of the ferroelectric P(VDF-TrFE) layer (~300 nm) reducing the gate control efficiency. On the other hand, inorganic thin films such as layered In$_2$Se$_3$ and CuInP$_2$S$_6$ appeared to demonstrate some ferroelectricity for memory applications. Some experimentation with FeFETs based on CuInP$_2$S$_6$/few-layer MoS$_2$ heterostructure showed a reasonable write/erase ratio with lower operation voltages of ±5 V, which suggested potential of inorganic ferroelectric thin film/2D TMD heterostructure devices for future low-power-consumption computing applications. However, these attempts at building high-performance FeFETs using 2D TMD channels so far from experimentation, relied on mechanically exfoliated flakes, which was not suitable for large-area memory networks or high-volume scale manufacturing in view of some standards of the present disclosure.

Some embodiments of the present disclosure demonstrate 2D FeFETs using synthetic monolayer semiconducting MoS$_2$ and inorganic ferroelectric thin film of zirconium-doped hafnium oxide (HfZrO$_x$) with a back-gated configuration. The MoS$_2$ channel (a two-dimensional material layer) was produced through chemical vapor deposition (CVD) and the ferroelectric HfZrO$_x$ gate insulator was deposited by atomic layer deposition (ALD). Both the processes and materials are scalable and CMOS-manufacturing compatible. The 2D FeFETs of the present disclosure exhibited data storage nature with a low-voltage-driven feature (<±3 V) at room temperature and the memory hysteresis characteristics that can be further modulated by the gate bias, illustrating that the resistive switching of the single-layer MoS$_2$ channel in the transistor is efficiently controlled by the large remnant polarization of the ferroelectric HfZrO$_x$ thin film. Moreover, the device of the present disclosure shows synaptic-like behavior with potentiation and depression of the channel conductance through sequence of pulsed electrical stimulations. An ultrathin HfO$_2$ dielectric film placed between the semiconducting channel and the ferroelectric in the gate stack was found to act as a passivation layer that stabilizes the ferroelectricity of the device. Meanwhile, the device architecture of the MoS$_2$ FeFETs offers a noticeable amplification of the MoS$_2$ photoluminescence (PL), which originates from Fabry-Perot cavity reflection of the bottom gate mirror. Such results demonstrates the unique potency of CVD-grown TMD/HfO$_2$-based ferroelectric heterostructures for future energy-efficient memory and brain-like computing applications.

Some aspects of the present disclosure exhibit two distinct "on" and "off" states with a high on/off ratio when a gate voltage is applied. The atomically thin and dangling-bond-free natures of two-dimensional materials allows for, among other features, almost perfect electrostatic gate control for the purpose of low-power consumption and benefits the vertically scaling technology for increasing the device density in a given area of a chip. Also, the fabrication methods and device structures offer, by non-limiting example, at least one strategy to preserve the quality and the intrinsic properties of two-dimensional materials (two-dimensional material layer) integrated into a ferroelectric gate stack, among other features. In addition, these fabrication methods of the present disclosure demonstrate, by non-limiting example, a way to build flexible and wearable devices based on the device structures disclosed in the present disclosure. Some other unique features include a ratio between the dielectric material layer and the ferroelectric layer, which allows for tuneability of the operating voltage of the device along with an ability to reduce the operating voltage of the device.

However, in order to develop the devices, systems and methods (i.e. including fabrication methods) for the present disclosure, extensive experimentation was conducted so as to achieve specific performance and operational goals of the present disclosure, as noted above. Some of these specific performance and operational goals of the present disclosure were configured to address some of today's high technological specification requirements for memory applications, and in particular non-volatile memories to be used with many of today's different types of technology products. For example, based upon the present disclosure's specific performance and operational goals, some product applications include, by non-limiting example, high-performance digital cameras, mp3 players, flash drives and cards, mobile phones, personal digital assistants (PDAs) and ultra-portable notebook personal computers (PCs) where high-density, ultra-compact, among other applications and uses.

Other types of applications for the devices, systems and methods of the present disclosure can include applications associated with distributed sensor nodes, concept of the internet of things applications, future ICs requiring local memory that is very low-power operable, as well as switching at low currents related applications.

Upon reviewing some lessons learned from experimentation, some experiments included experimenting with devices that provide computing or in-memory computing which attempted to do the computation in situ, exactly where the data are located. These experiments were similar to the computing scheme in a human brain, where the information is processed in sparse networks of neurons and synapses, without any physical separation between computation and memory. Although, these experimental approaches had great potential, it was learned that these approaches required very low-power consumption which was the critical requirement to make this brain-like computing paradigms feasible in today real world applications. Also learned is that there needs to be a higher operation frequency and a higher device density on a chip, which is required in order to process and store the huge amount of data.

In light of these experimentations, and what was realized is that devices based on two-dimensional materials and ferroelectric materials can be a strong candidate for such applications. The atomic thicknesses and large carrier effective masses of two-dimensional materials potentially offer excellent electrostatic gate control and a reduced source-to-drain leakage current to suppress the power consumption and a higher on-current in the ballistic regime to speed the response up and extend the maximum frequency of oscillation and cutoff frequency. Further, using ferroelectric materials into the gate stack in a field-effect transistor can provide a tunable channel conductance with a ferroelectric-like characteristic for memory applications. Such that, two-dimensional materials (two-dimensional material layer) combine bendability, stretchability, transferability to flexible substrates, and much higher mobility's than the semiconductors such as amorphous silicon organic materials, and polymers traditionally used for conventional flexible electronics.

In trying to combine two-dimensional materials and ferroelectrics to make negative capacitance field-effect transistors or memory devices, some experimental fabrication methods failed, and would not be applicable in practical industrial applications in terms of reliability, degradation, and performance due to the vulnerability of the two-dimensional materials. These experiments includes a two-dimensional material placed underneath the ferroelectric/dielectric gate stacks and is sandwiched between the substrate and the gate stack. This means that a high-temperature deposition of ferroelectrics or dielectrics has to be introduced after the placement of the two-dimensional material. Consequently, these experimented processes resulted several drawbacks that limited the performance of devices fabricated in view of these experimental methods. For example, there at least three issues/problems learned, first, since two-dimensional materials are vulnerable, any high-temperature processes after the placement of the two-dimensional materials will cause decomposition or degradation of the materials due to the formations of defects. Second, two-dimensional materials are atomically thin and thus have high surface-to-volume ratio, any surface contamination or interface impurities may lead to a dramatic change of their physical properties, such as unintentional doping, interface charge scatterings, degraded contact resistance, shifted threshold voltages, and so on. The growth/deposition of ferroelectrics or dielectrics generally requires the use of precursors containing oxygen or waters. Therefore, the oxygen atoms and water molecules created during the growth/deposition of ferroelectrics or dielectrics can significantly affect the properties of two-dimensional materials, decreasing the devices reliability. Third, growth of high-quality ferroelectrics or dielectrics requires a post rapid thermal annealing process to form the desired phases or crystal structures. The mismatch of thermal expansion coefficients between the two-dimensional material and any layers of materials sandwiching it will damage or destroy the two-dimensional material used in the devices. Moreover, these operations were on rigid substrates, limiting use of the devices.

In view of the above experimentation, some experiments led the experimentation to experimenting with a non-volatile memory, such as ferroelectric field-effect transistor (FeFET) memory devices, which have both memory and switching applications. However, one main drawback of FeFETs learned is their non-perfect non-volatile behavior. For example, when the ferroelectric material, which serves as the gate dielectric, is programmed, the gate dielectric is polarized in such a way that the threshold voltage is shifted, similar to a flash device. However, since now that the charge causing this effect is polarization charge, caused by an atom moving within the unit cell of the ferroelectric crystal, there is no direct leakage current causing the cell to discharge. There is, however, another learned effect causing the information to leak away, which may be referred to as the depolarization field. In most cases, the electric field over the materials in contact with the ferroelectric material can be different from zero even in the retention condition when no voltage is applied. Therefore, there can also be an electric field over the ferroelectric material, which is always opposite to the polarization (Gauss' law). That induced electric field will disadvantageously work against the polarization and hence depolarize the cell causing it to lose its content, thus resulting in poor non-volatile properties.

An embodiment of the present disclosure includes a transistor device including a flexible memory cell. The flexible memory cell including a gate stack with sidewalls provided over a substrate. The gate stack including a metal gate layer provided over the substrate. A buffer layer provided over the metal gate layer. A ferroelectric layer provided over the buffer layer. A dielectric layer provided over the ferroelectric layer. Further, a two-dimensional material layer provided over a portion of a top surface of the dielectric layer. Source and drain regions provided on separate portions of the top surface of the dielectric layer to create a cavity that the 2D material layer are located.

According to another embodiment of the present disclosure, a transistor device having a flexible resistive switching memory cell. The flexible resistive switching memory cell including a gate stack with sidewalls provided over a supporting substrate. The gate stack including a metal gate layer provided over the substrate. A buffer layer provided over the metal gate layer. A ferroelectric layer provided over the buffer layer. A dielectric layer provided over the ferroelectric layer. A two-dimensional material layer that are a $MoS_2$ monolayer including grown $MoS_2$ flakes transferred over a portion of a top surface of the dielectric layer. Source and drain regions provided on separate portions of the top surface of the dielectric layer, which create a cavity that the 2D material layer are located.

According to another embodiment of the present disclosure, a single-layer molybdenum disulfide ($MoS_2$) ferroelectric field-effect transistor (FeFET) including a flexible memory cell. The flexible memory cell includes a gate stack with sidewalls provided over a supporting substrate. The gate stack includes a metal layer acting as a metal gate provided over a supporting substrate. A titanium nitride (TiN) buffer layer provided over the metal layer. Inorganic ferroelectric film of zirconium-doped hafnium oxide (HfZ-$rO_x$) provided over the TiN buffer. A dielectric hafnium(IV) oxide ($HfO_2$) layer provided over the $HfZrO_x$ film. A two-dimensional material layer including grown $MoS_2$ flakes transferred on to a portion of a top surface of the $HfO_2$ layer. Source and drain regions provided on separate portions on the top surface of the $HfO_2$ layer so as to create a cavity that the 2D material layer are located.

According to another embodiment of the present disclosure, a method of fabricating a flexible n on-volatile memory cell. The method including providing a gate stack with sidewalls over a supporting substrate. The gate stack including providing a metal gate layer over the supporting substrate. Providing a buffer layer over the metal gate layer. Providing a ferroelectric layer over the buffer layer, then initial a rapid thermal annealing. Providing a dielectric layer over the ferroelectric layer. Providing a two-dimensional material layer over a portion of a top surface of the dielectric layer. Providing source and drain regions on separate portions of the top surface of the dielectric layer creating a cavity, wherein the 2D material layer is positioned in the cavity. Wherein the following aspects below are contemplated as configuring a modified embodiment of the above embodiment.

According to another embodiment of the present disclosure, a method of fabricating a flexible non-volatile memory cell. The method including providing a gate stack with sidewalls over a supporting substrate. The gate stack including providing a metal gate layer over the supporting substrate. Providing a buffer layer over the metal gate layer. Providing a ferroelectric layer over the buffer layer, then initial a rapid thermal annealing. Providing a dielectric layer over the ferroelectric layer. Providing a two-dimensional material layer over a portion of a top surface of the dielectric layer. Providing source and drain regions on separate portions of the top surface of the dielectric layer creating a cavity, wherein the 2D material layer is positioned in the cavity.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 5B1 is a graph illustrating capacitance-voltage (C-V) measurements of the ferroelectric capacitor annealed at 400° C. and a typical dielectric capacitor based on undoped $HfO_2$, with a schematic of polarization orientations with different electric field polarities, according to some embodiments of the present disclosure;

FIG. 5B2 is a schematic illustrating a circuit showing polarization orientations with different electric field polarities, according to some embodiments of the present disclosure;

FIG. 9 shows a table illustrating a comparison of the main features among several types of FeFET memory devices, according to some embodiments of the present disclosure;

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art, which fall within the scope and spirit of the principles of the presently disclosed embodiments.

DETAILED DESCRIPTION

The present disclosure relates to device structures and fabrication methods to build flexible electronics including memory devices by using a two-dimensional material layer with an integration of ferroelectric materials.

Some embodiments of the present disclosure include a single-layer molybdenum disulfide ($MoS_2$) ferroelectric field-effect transistor (FeFET) including a flexible memory cell. The flexible memory cell includes a gate stack with sidewalls provided over a supporting substrate. The gate stack includes a metal layer acting as a metal gate provided over a supporting substrate. A titanium nitride (TiN) buffer layer provided over the metal layer. Inorganic ferroelectric film of zirconium-doped hafnium oxide ($HfZrO_x$) provided over the TiN buffer. A dielectric hafnium(IV) oxide ($HfO_2$) layer provided over the $HfZrO_x$ film. A two-dimensional material layer including grown $MoS_2$ flakes transferred on to a portion of a top surface of the $HfO_2$ layer. Source and drain regions provided on separate portions on the top surface of the $HfO_2$ layer so as to create a cavity that the 2D material layer is located.

Figure 1A:
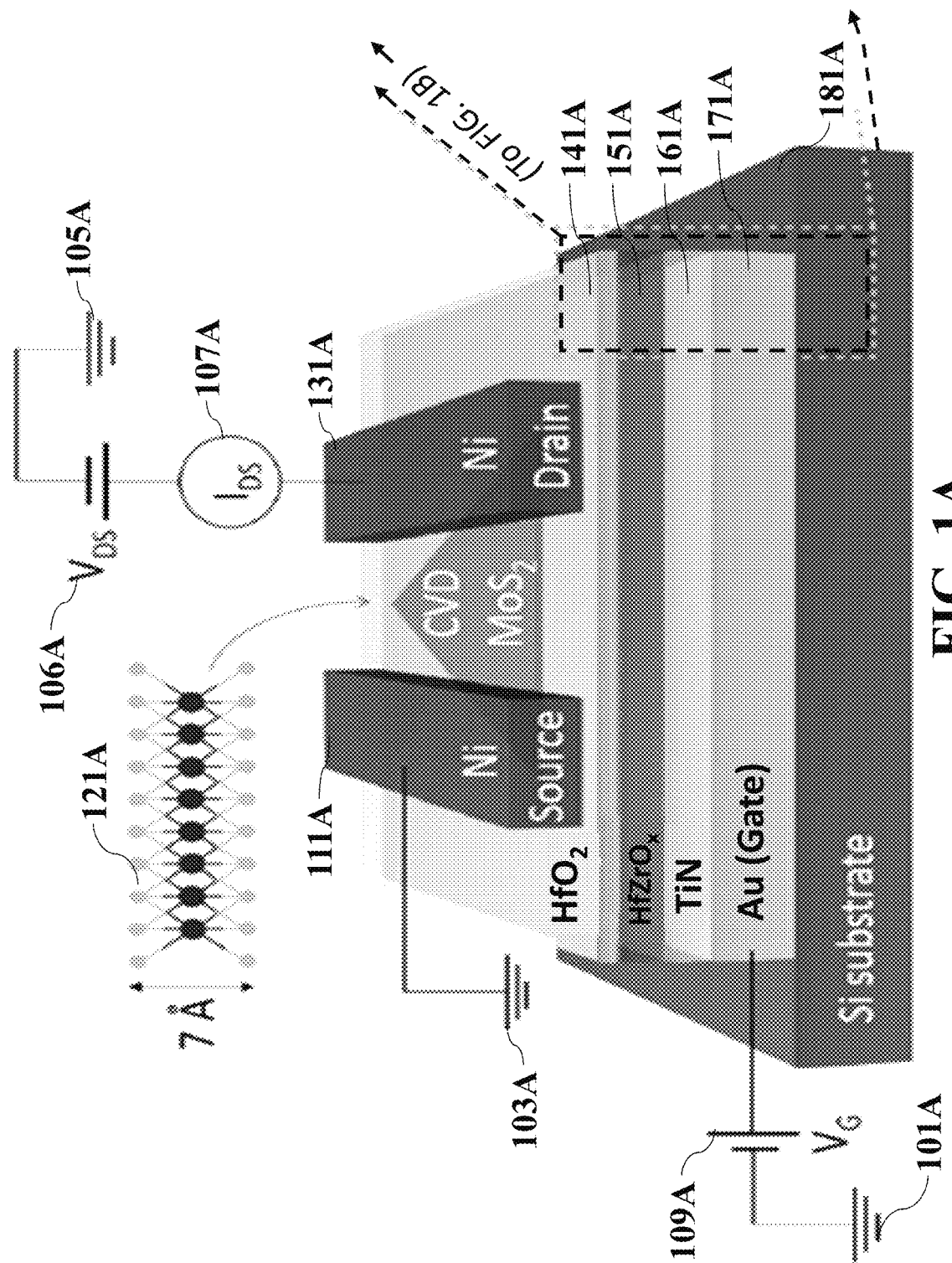
FIG. 1A is a schematic illustrating a three dimensional (3D) view of a single-layer $MoS_2$ FeFET, with CVD-grown single-crystal $MoS_2$ used as a transistor channel, a gate stack is composed of Ti/Au as a gate electrode, TiN, $HfZrO_x$ as a ferroelectric layer, and thin $HfO_2$ as a passivation layer, according to an embodiment of the present disclosure.

FIG. 1A is a schematic illustrating a three dimensional (3D) view of a single-layer $MoS_2$ FeFET, with CVD-grown single-crystal $MoS_2$ used as a transistor channel. The structure of the single-layer $MoS_2$ FeFET includes a substrate 181A for the base with a gate stack composed of Ti/Au as a gate electrode 171A, position on a top surface of the substrate 181A.

Further, the gate electrode 171A has a length less than the substrate 181A creating edges on both sides. $V_G$ 109A is a gate voltage applied to operate the device for the write or erase programs with a ground 101A. The applied $V_G$ 109A can switch the polarizations of the ferroelectric. The polarization orientation in the ferroelectric depends on the polarity of the applied $V_G$ 109A (positive or negative relative to ground). The $V_G$ 109A controls how many currents will come out from the device, playing in the role in resistance switching of the device. Next, a TiN layer 161A is place on a top surface of the gate electrode 171A, that has a length approximate the gate electrode 171A.

Still referring to FIG. 1A, an $HfZrO_x$ as a ferroelectric layer 151A, is place on a top surface of the TiN layer 161A, that has a length approximate the gate electrode 171A. A unique feature, among many, is that the ferroelectric layer 151A is positioned in an approximate middle of the structure, which reduces voltage to turn on voltage, which reduces power consumption for the device, along with extending the device range of operation. To ensure a low leakage current, a low operation voltage, and a good ferroelectricity in the device, the thickness of the ferroelectric layer 151A can range from 5 nm to 50 nm.

The next layer is a thin $HfO_2$ as a passivation layer 141A is place on a top surface of the ferroelectric layer 151A, which has a length approximate the ferroelectric layer 151A. At least one important feature, among many, is a ratio between the thin $HfO_2$ as a passivation layer 141A to the ferroelectric layer 151A. The thin $HfO_2$ as a passivation layer 141A can range be up to 30 nm and the thickness of the ferroelectric layer 151A can range from 5 nm to 50 nm. The ratio of thickness of 141A to 151A is 0~2 (see FIG. 1D). The write/erase voltage of a ferroelectric-based memory device is determined by the threshold energy barrier between the two polarization states of the ferroelectric layer 151A. By inserting an $HfO_2$ layer 141A connected to the ferroelectric layer 151A, the total energy of the gate stack can be redistributed and the energy barrier of the two polarizations in the device is reduced. Such that the level of reduced energy barrier can be controlled by the thickness ratio of 141A to 151A, which should range from 0~2. Prior art teachings did not claim the use of the passivation layer and the concept of lowering the device operation voltage by tuning the ratio of thickness between 141A and 151A.

Still referring to FIG. 1A, another important feature includes the ability to reduce the operating voltage for the device to make the device energy efficient. This is achieved by inserting the $HfO_2$ as a passivation layer 141A. The $HfO_2$ layer 141A was not seen in any of the prior teachings. The $HfO_2$ layer 141A inserted between the semiconducting channel 121A and the ferroelectric layer 151A could play two crucial roles: (i) preserving the ferroelectricity of the underlying ferroelectric layer 151A through surface passivation and (ii) lowering the threshold poling voltage of the device (see FIG. 1C). There exists polarization fluctuation at the semiconductor/ferroelectric interface. Such the polarization fluctuation can be suppressed by placing a thin buffer layer of $HfO_2$ layer 141A between the channel 121A and ferroelectric insulator 151A, thus improving the device performance. Accordingly, the thin layer of $HfO_2$ in our device could act as a buffer layer that suppresses the polarization fluctuation and retains the ferroelectricity. Second, since the thin dielectric $HfO_2$ layer 141A exhibits a finite capacitance, when connected in series to the ferroelectric layer, the energy of the hybrid gate stack (141A+151A) can be redistributed with a lower threshold energy barrier of the polarization switching, which is fundamentally associated with the threshold of the write voltage for a ferroelectric-based devices.

Further, a back gate can be accessed by carrying out reactive ion etch (RIE), etching away the upper oxides (i.e. HfO$_2$ passivation layer 141A, HfZrO$_x$ ferroelectric layer 151A) and TiN layers, wherein a channel material, monolayer MoS$_2$, 221A can be synthesized on a SiO$_2$/Si substrate 223A using a CVD method. Wherein the channel material, monolayer MoS$_2$, is first synthesized on a SiO$_2$/Si substrate using a CVD method. In contrast, to conventional principles related conventional transistor devices, the as-grown MoS$_2$ flakes 221A of the present disclosure can be then transferred onto a hybrid HfO$_2$/ferroelectric HfZrO$_x$ substrate 241A through wet transfer technique. Wherein a height of the as-grown MoS$_2$ flakes 221A can be about 7 angstroms, i.e. two-dimensional material layer.

In regard to conventional like transistor devices, the MOSFETs, a two-dimensional material channel was not placed below the ferroelectric or dielectric layer of the transistor device, since in doing so would result in damaging the two-dimensional material channel when heat from the fabrication process would be applied, thus either destroying the two-dimensional material channel or creating defects in the two-dimensional material channel Those defects created during the high-temperature process reduce the reality and stability of the devices.

Still referring to FIG. 1A, the device of the present disclosure has unique design structure, contrary to conventional like transistor device structures, the present disclosure transistor device includes having a thin, a metal gate placed near the bottom of the transistor device, resulting in less control of the metal gate. However, the metal gate performance is improved based on experimental results. Some features of the transistor device of the present disclosure include being able to have a flexible/bendable circuits, wherein the flexible circuits can be placed on foil, whereas the conventional circuits are not flexible. In prior art teachings, the device substrates are rigid and not bendable. In contrast, our fabrication process allows the use of thin, flexible substrates like metal foils, so that the as-fabricated devices offer flexibility for the applications in wearable electronics.

A source (S) 111A and drain (D) 131A Ni/Au (30 nm/20 nm) metallic contacts are patterned using electron-beam lithography, followed by electron-beam evaporation and lift-off steps. During the device operation, V$_{DS}$ 106A is an applied voltage between the source and the drain of the device to read the state of the device is connected to a ground 105A. V$_{DS}$ 106A is the read voltage and can be positive or negative relative to the ground. I$_{DS}$ 107A is the drain-to-source current coming out from the device. I$_{DS}$ 107A is the resistance state of the device. It can be either a high resistance state or a low resistance state, depending on the polarity of the applied gate voltage V$_G$ 109A.

Further, a height of the metal layers 111A, 131A can depend on amount of protection the as-grown MoS$_2$ flakes or 2D materials, a two-dimensional material layer, 121A may require, and to reduce contact resistance. However, if the height of the metal layers 111A, 131A are too high, then there is a potential of damaging the 2D material layer 121A. Further, the shape of the metal layers 111A, 131A can be uniform, non-uniform shape or even flat. Noted, from experimentation is that performance increase when the metal layers 111A, 131A were wave-like or non-uniform shape.

Figure 1B:
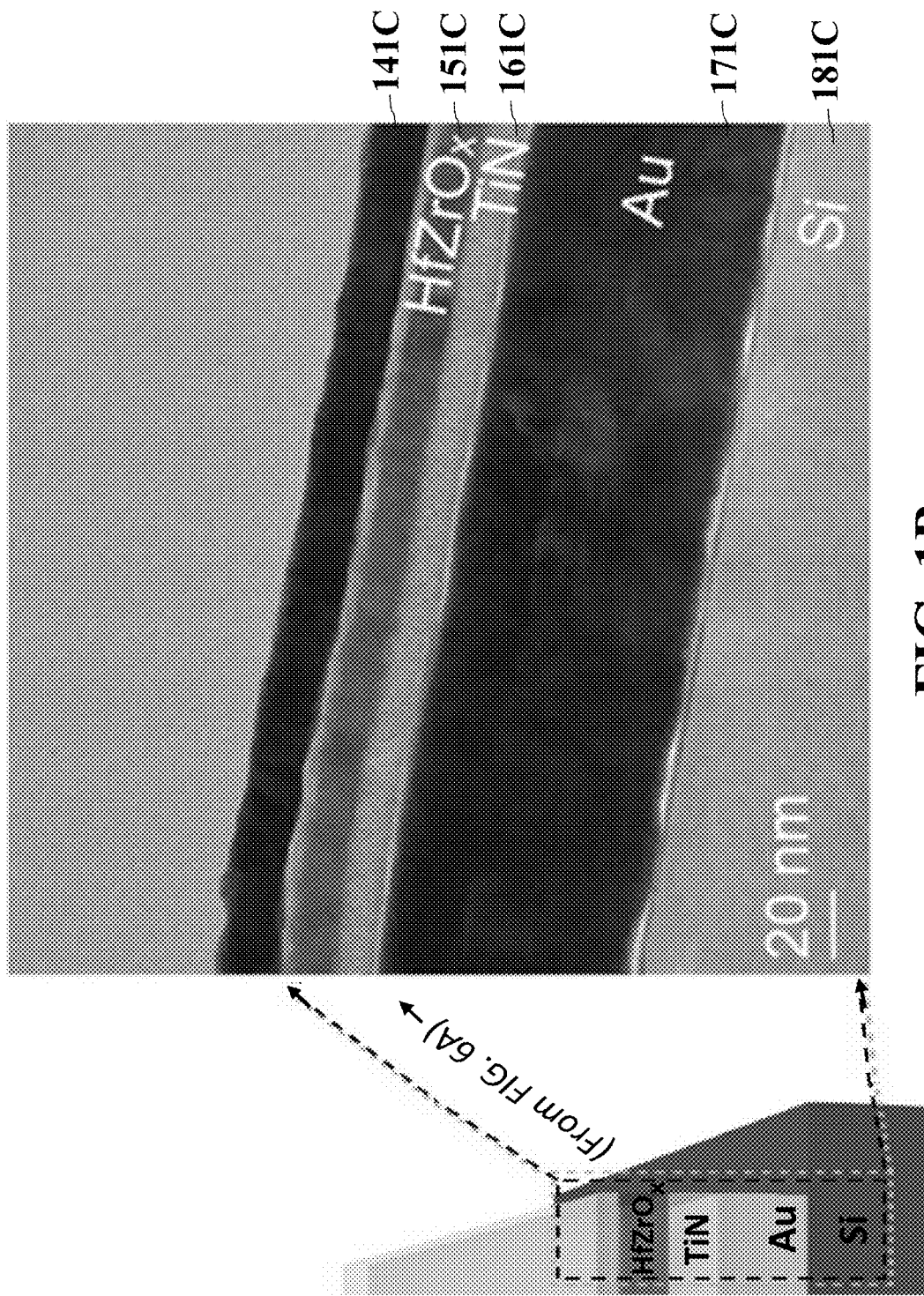
FIG. 1B is a schematic illustrating a cross-sectional view of FIG. 1A, showing the structure and thicknesses of the gate stack, the topmost layer (dark region) in image is a 20 nm coating layer of Au for a TEM characterization, according to some embodiments of the present disclosure.

FIG. 1B is a schematic illustrating a cross-sectional view of FIG. 1A, showing the structure and thicknesses of the gate stack, the topmost layer (dark region) in image is a 20 nm coating layer of Au for a TEM characterization, according to some embodiments of the present disclosure. The 141C in FIG. 1B is a 20 nm Au layer that we deposited on the surface of the devices. For the transmission electron microscopy (TEM) characterization, a conductive layer on the sample surface is required to get clear image.

Figure 1C:
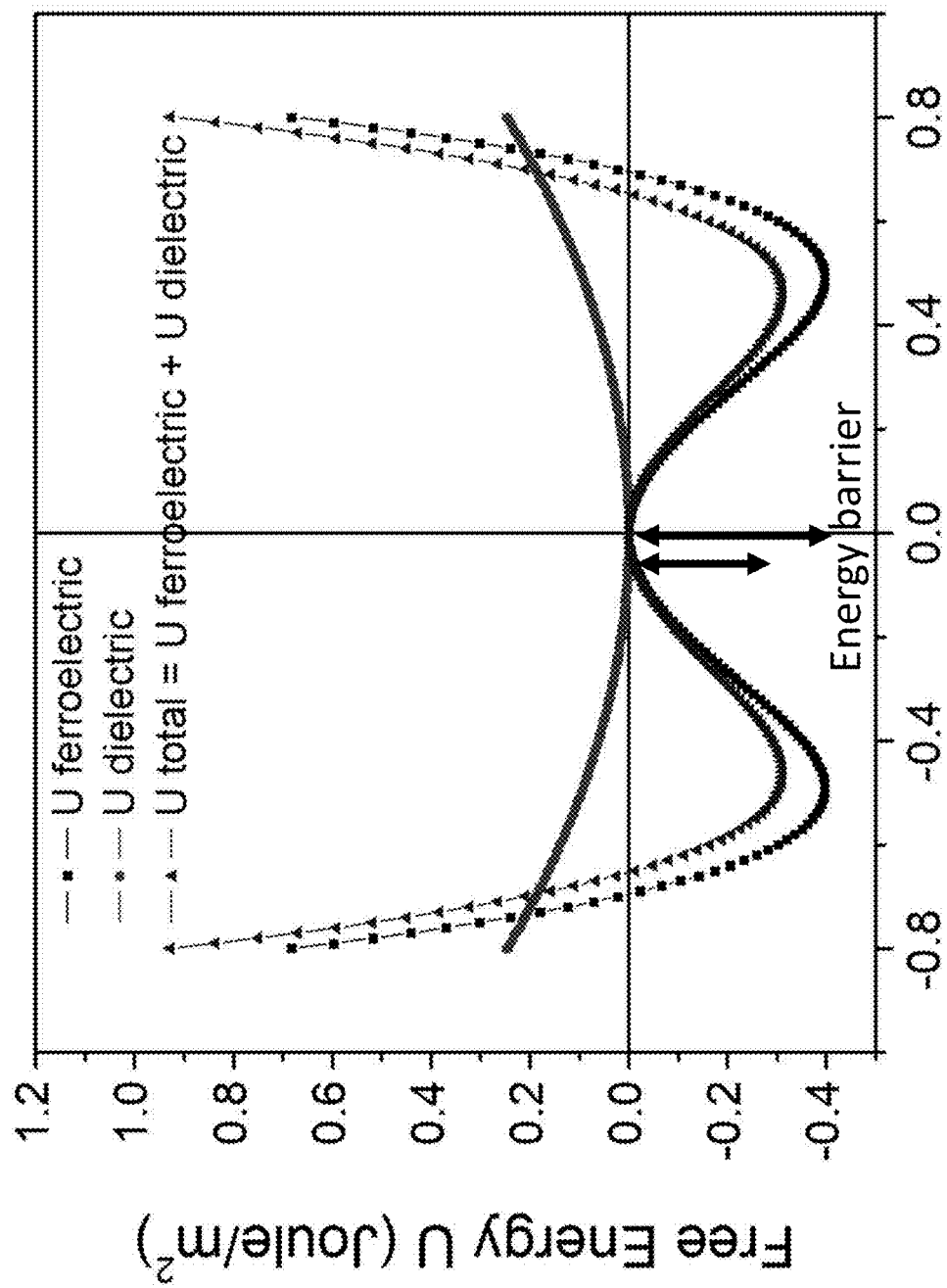
FIG. 1C is a graph illustrating aspects of threshold poling voltage of the device, according to some embodiment of the present disclosure.

FIG. 1C is a graph illustrating aspects of threshold poling voltage of the device, according to some embodiment of the present disclosure. For example, the U$_{ferro}$ line shows prior art potential E, voltage that defines an amount of voltage to operate device. The U$_{dielectric}$ line illustrates redistributes voltage. FIG. 1C further shows the reduce circuit operational voltage via dielectric/ferroelectric ratio, the tuneable circuit operation voltage via Die/ferro ratio, per application.

$$V_{ferroelectric} = 2\alpha t_{fe}P + 4\beta t_{fe}P^3 + 6\gamma t_{fe}P^5 + \rho t_{fe}\frac{dP}{dt}$$

$$U_{ferroelectric} = \alpha P^2 + \beta P^4 + \gamma P^6$$

$$U_{dielectric} = \frac{Q^2}{2C_{dielectric}}$$

Figure 1D:
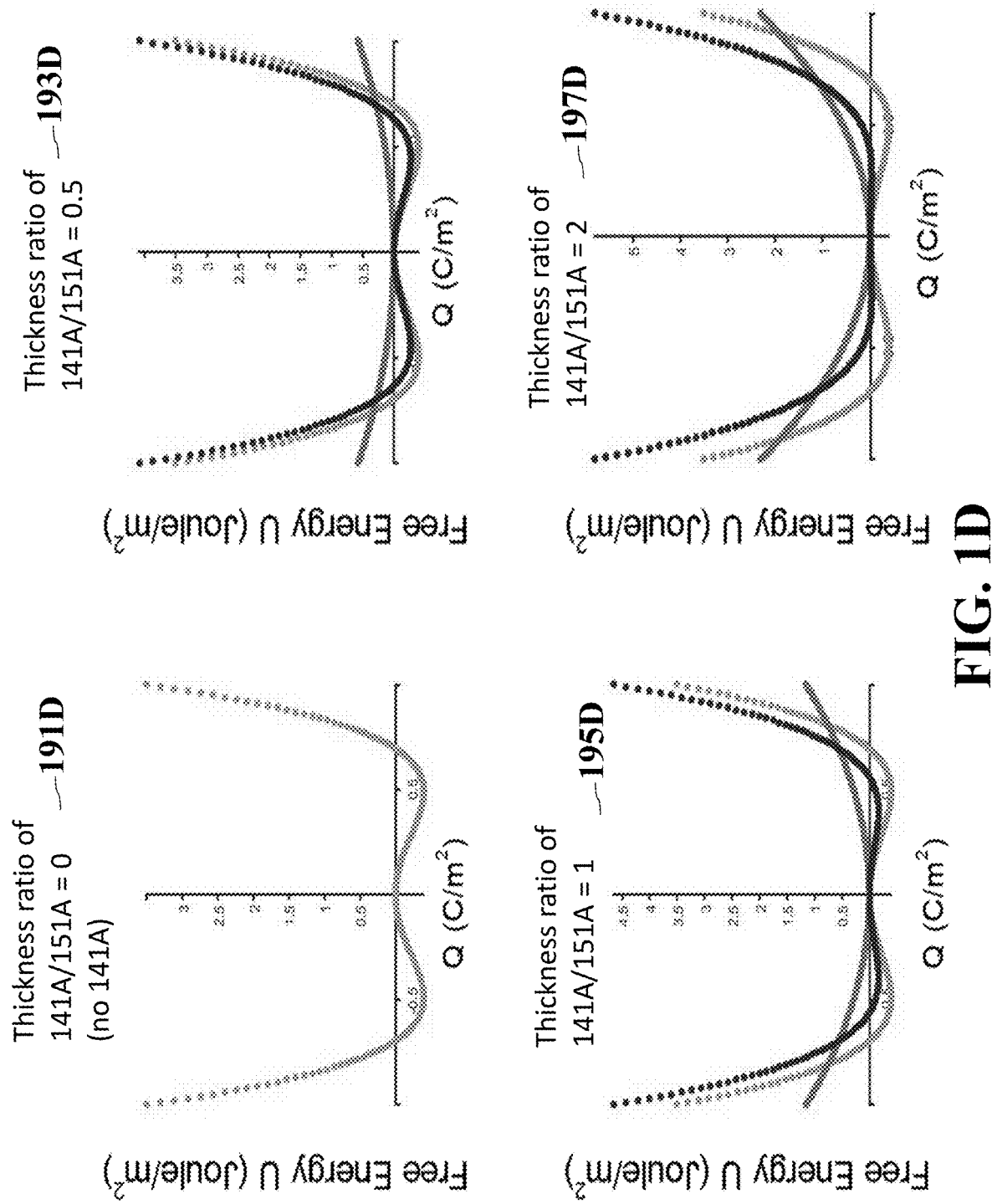
FIG. 1D is a graph illustrating a thickness ratio between the thin $HfO_2$ layer (dielectric layer) to the ferroelectric $HfZrO_x$ (ferroelectric layer), according to some embodiment of the present disclosure.

FIG. 1D is a graph illustrating a thickness ratio between the thin HfO$_2$ layer (dielectric layer) to the ferroelectric HfZrO$_x$ (ferroelectric layer), according to some embodiment of the present disclosure. For example, the thickness ratio 191D of the thin HfO$_2$ layer (dielectric layer) to the ferroelectric HfZrO$_x$ (ferroelectric layer) is illustrated as equal to zero (0). The thickness ratio 193D of the thin HfO$_2$ layer (dielectric layer) to the ferroelectric HfZrO$_x$ (ferroelectric layer) is illustrated as equal to 0.5. The thickness ratio 195D of the thin HfO$_2$ layer (dielectric layer) to the ferroelectric HfZrO$_x$ (ferroelectric layer) is illustrated as equal to one (1). The thickness ratio 197D of the thin HfO$_2$ layer (dielectric layer) to the ferroelectric HfZrO$_x$ (ferroelectric layer) is illustrated as equal to two (2).

Figure 2A:
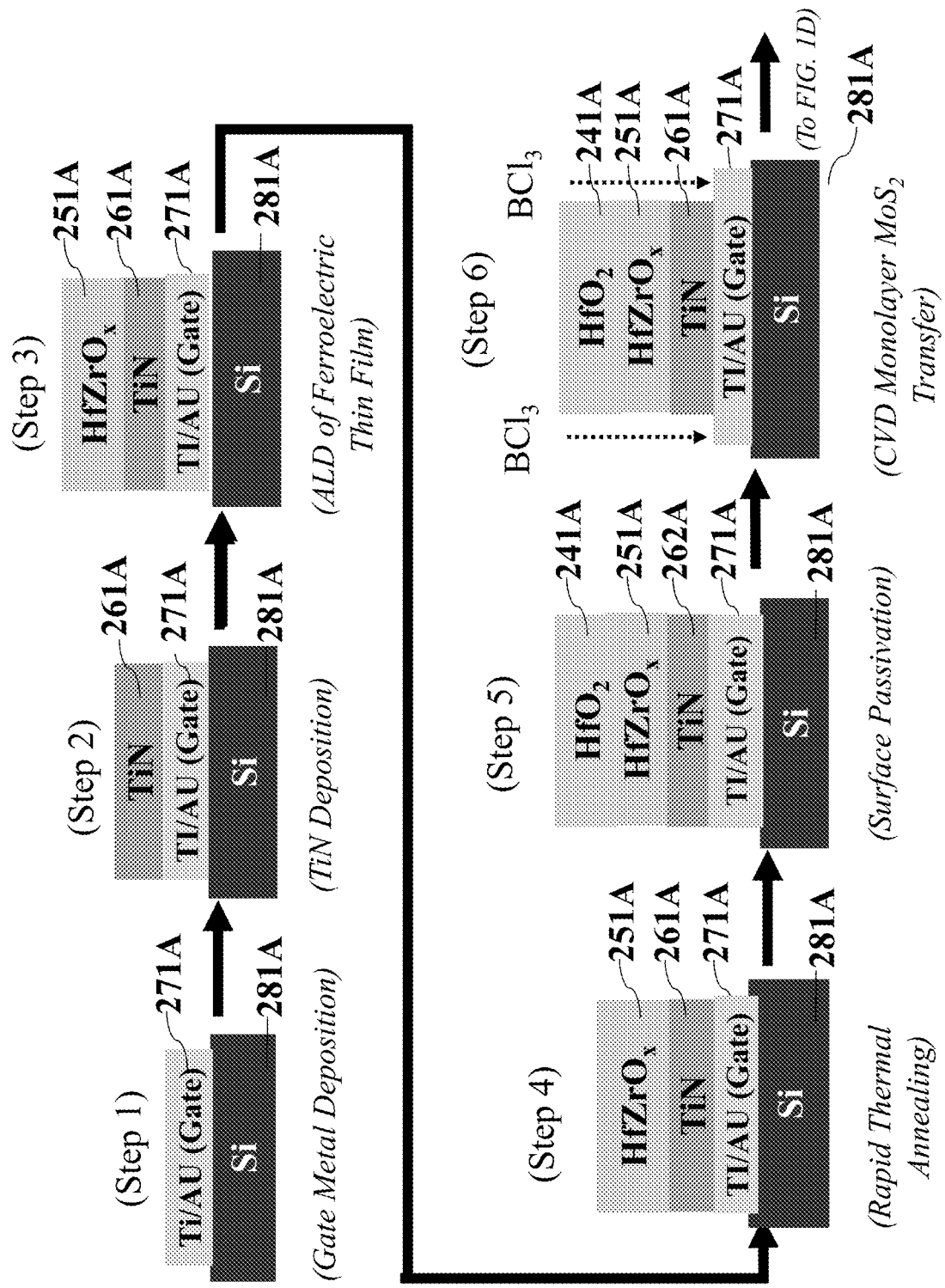
FIG. 2A is a schematic illustrating a fabrication process of the CVD single-layer $MoS_2$ FeFETs, showing fabrication process steps one (1) to step six (6) and materials, according to some embodiments of the present disclosure.

FIG. 2A is a schematic illustrating a fabrication process of the CVD single-layer MoS$_2$ FeFETs of FIG. 1A, or a fabrication process of CVD monolayer MoS$_2$/HfZrO$_x$ heterostructure ferroelectric memory transistors, showing fabrication process steps one (1) to step six (6) and materials, according to some embodiments of the present disclosure.

FIG. 2A details the fabrication process flow that includes step 1, a layer of Ti/Au (5 nm/70 nm) serving as the metal gate (G) 271A was first deposited on a supporting Si substrate 281A by electron-beam evaporation. Step 2 includes a layer of ~10 nm TiN 261A was then deposited on the Au layer 271A at 250° C. using atomic layer deposition (ALD) with tetrakis(dimethylamido)titanium (TDMAT) and ammonia (NH$_3$) as the precursors. Step 3 includes ALD of a ~15 nm HfZrO$_x$ thin film 251A was immediately carried out at 275° C. through alternating 75 cycles of Tetrakis (dimethylamido)hafnium (TDMAH), water vapor (H$_2$O), Tetrakis(dimethylamido)zirconium (TDMAZ), H$_2$O. Step 4 includes the sample was then rapid thermal annealed (RTA) at 400° C. in N$_2$ for 30 s to form ferroelectricity. The TiN layer 261A sandwiched between the metal gate 271A and HfZrO$_x$ thin film 251A effectively blocks the migrations of metal ions into the ferroelectric layer during the RTA, preventing the device from high gate leakage current. The devices of the present disclosure showed a low gate leakage current of <100 pA during operation (see FIG. 3). During one particular experiment, those samples without the intermediate TiN layer 261A suffered from significant leakage current after RTA.

Step 5 includes, a thin dielectric HfO$_2$ layer (~5 nm) was deposited on the sample at 250° C. using atomic layer deposition (ALD) to passivate the ferroelectric surface. Step 6 includes the back gate that can be accessed by carrying out reactive ion etch (RIE), etching away the upper oxides and TiN layers.

Figure 2B:
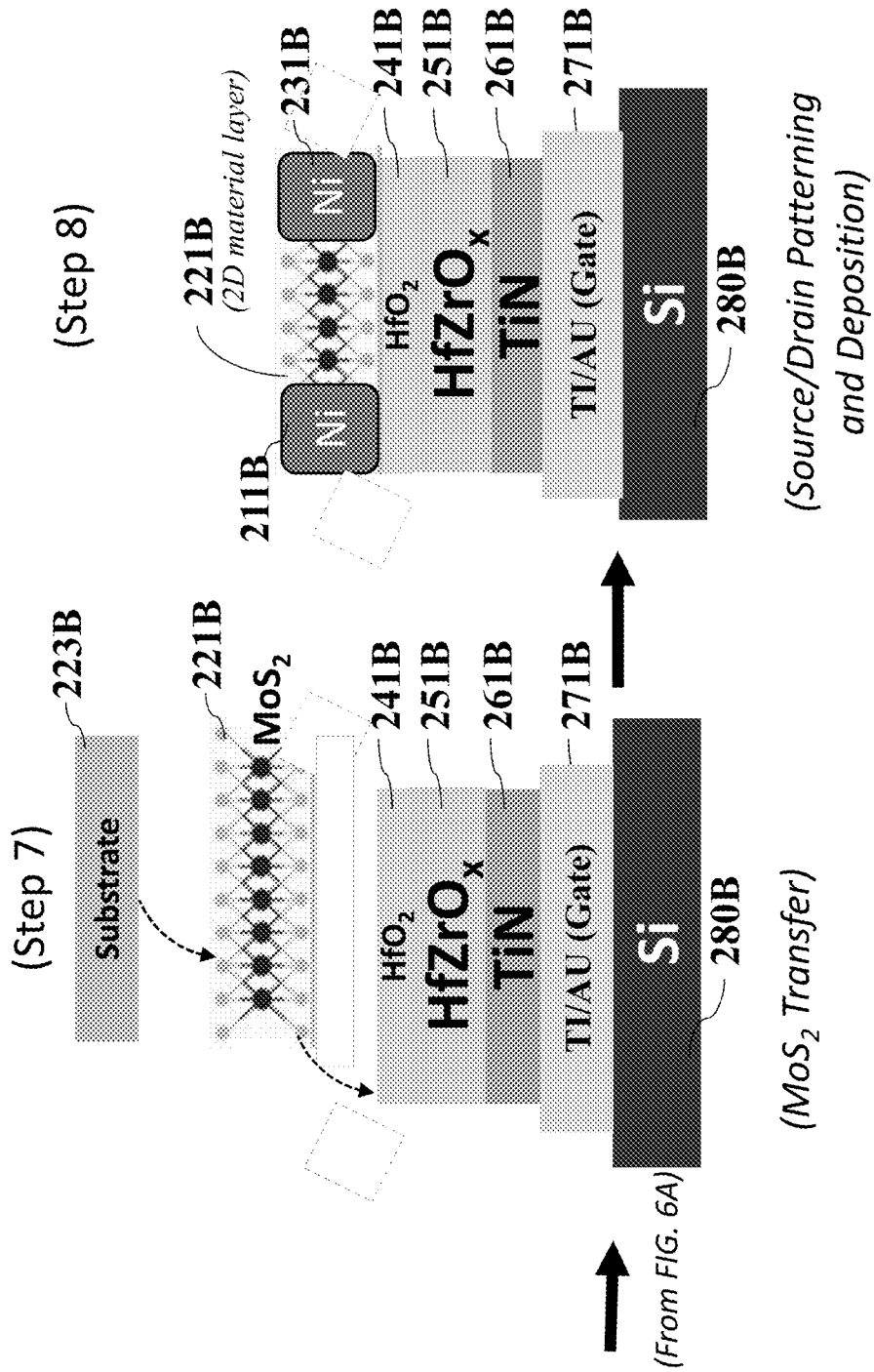
FIG. 2B is a schematic illustrating the fabrication process of FIG. 2A, for the CVD single-layer $MoS_2$ FeFETs, showing fabrication process continued steps seven (7) to step eight (8) and materials, according to some embodiments of the present disclosure.

FIG. 2B is a schematic illustrating the fabrication process of FIG. 2A, for the CVD single-layer MoS$_2$ FeFETs, showing fabrication process continued steps seven (7) to step eight (8) and materials, according to some embodiments of the present disclosure. Step 7 includes the channel material, monolayer MoS$_2$, 221A was first synthesized on a SiO$_2$/Si substrate 223B using a CVD method. The as-grown MoS$_2$ flakes, a two-dimensional material layer 221B, was then removed from the SiO$_2$/Si substrate 223B and transferred onto the hybrid HfO$_2$/ferroelectric HfZrO$_x$ 241B/251B substrate through wet transfer technique.

Step 8 includes the source (S) 211B and drain (D) 231B Ni/Au (30 nm/20 nm) metallic contacts were patterned using electron-beam lithography, followed by electron-beam evaporation and lift-off steps. Ni was chosen as the metallic contacts in the MoS$_2$ devices because typically in our fabrication process, ohmic-like contacts can be achieved at the interface of Ni/CVD MoS$_2$ with a moderate deposition condition (~10$^{-6}$ torr).

Still referring to FIG. 2A and FIG. 2B, some aspects of the MoS$_2$ 221B transfer process, can include the CVD-grown monolayer MoS$_2$ 221B was transferred onto the hybrid HfO$_2$/ferroelectric HfZrO$_x$ 241B/251B substrates by a wet transfer process. First, poly-methyl methacrylate (950 PMMA A4) was spin-coated (4000 rpm for 1 min) onto the as-grown monolayer MoS$_2$ samples. Next, the PMMA/MoS$_2$/SiO$_2$/Si stack was placed in an aqueous KOH solution, and the solution was then heated up to 85° C. After the SiO$_2$ layer was etched away, the PMMA/MoS$_2$ stack was separated from the substrate and remained floating on the solution. The PMMA/MoS$_2$ film was then placed in distilled water using a glass slide for 20 min to remove the KOH residue. This rinsing step was repeated three times. After that, the PMMA/MoS$_2$ film was transferred onto a hybrid HfO$_2$/ferroelectric HfZrO$_x$ 241B/251B substrate, and was then baked at 80° C. for 10 min and 130° C. for another 10 min. This baking step can remove moisture and enhance the adhesion between MoS$_2$ and the substrate. Finally, the PMMA/MoS$_2$/glass stack was immersed in acetone for 12 hr to remove the PMMA layer.

Figure 3:
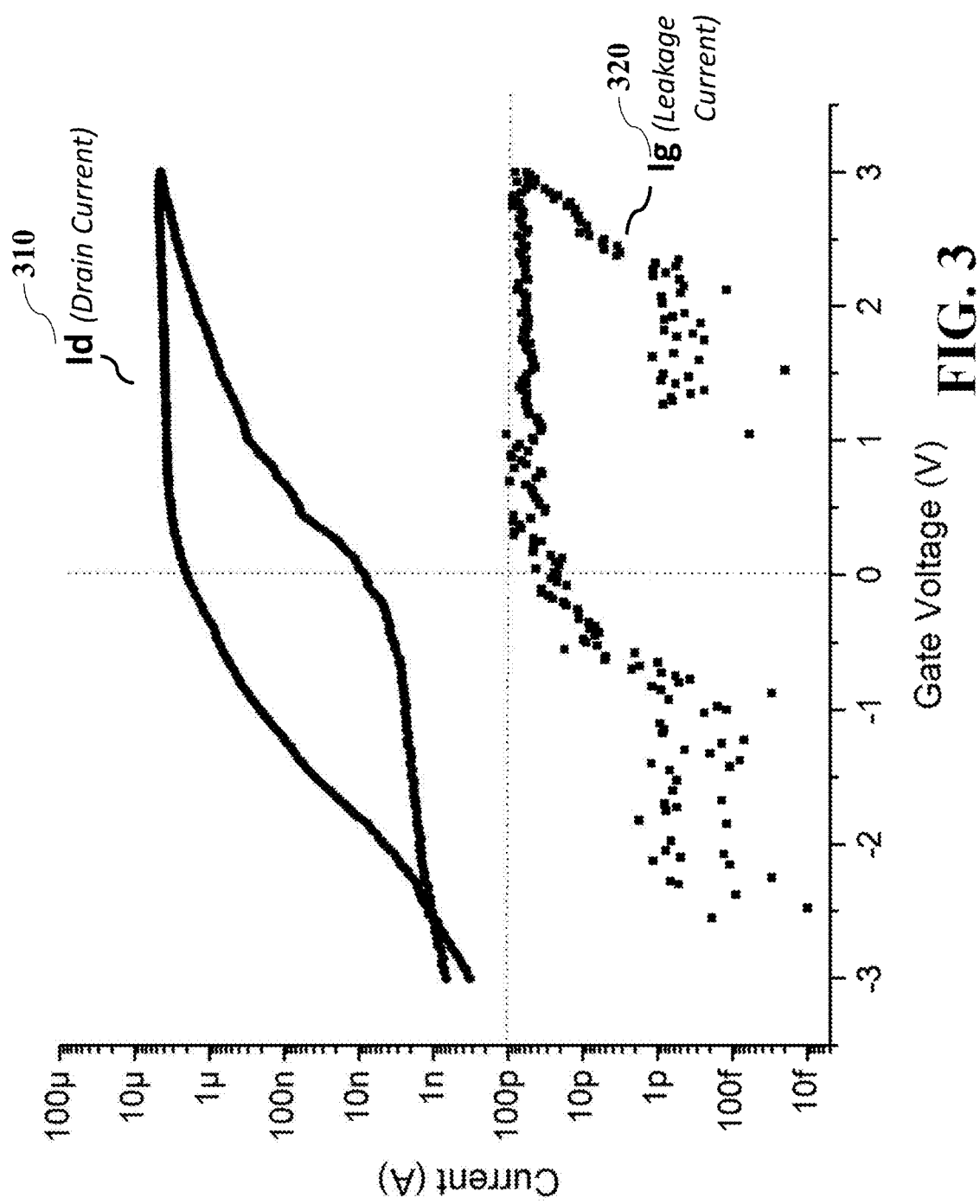
FIG. 3 is a graph illustrating a current versus gate voltage of the fabricated 2D FeFETs, showing a low level of gate leakage current during the operation, according to some embodiments of the present disclosure.

FIG. 3 is a graph illustrating a current versus gate voltage of the fabricated 2D FeFETs, showing a low level of gate leakage current during the operation, according to some embodiments of the present disclosure. "310" is the drain-to-source current, the same as 107A. "Ig 320" is the leakage current from the device. In high-performance memory devices, the leakage current has to be low during the device operation.

Figure 4A:
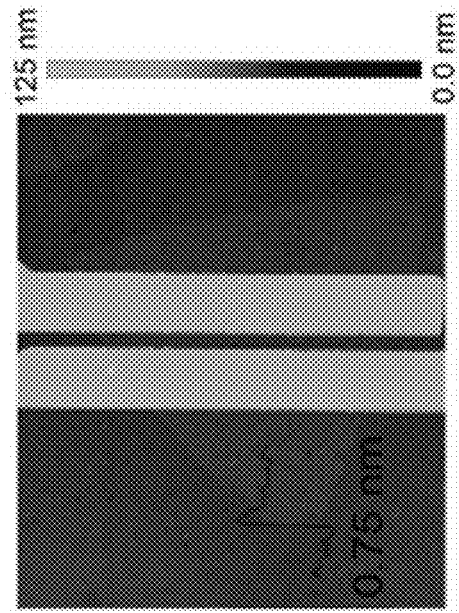
FIG. 4A is a graph illustrating CVD monolayer $MoS_2$ characterizations, including an optical image of a single-layer $MoS_2$ FeFETs (Channel length=1 μm), according to some embodiments of the present disclosure.
Figure 4B:
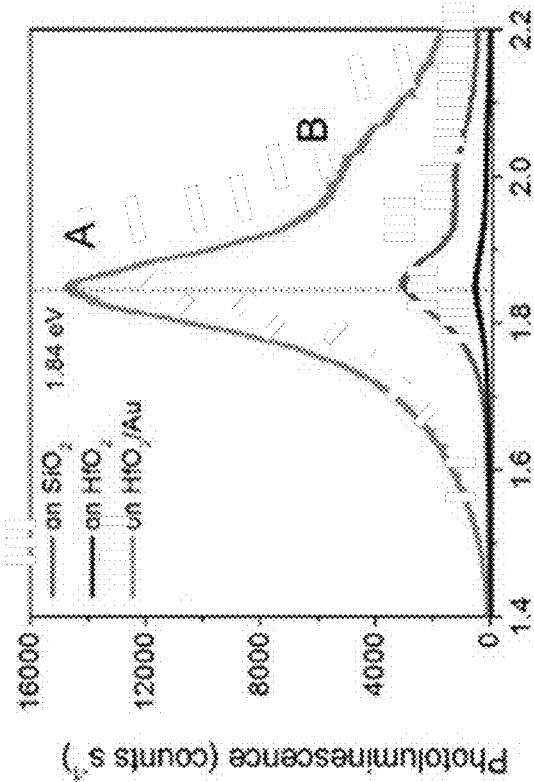
FIG. 4B is a graph illustrating CVD monolayer $MoS_2$ characterizations, showing an atomic force microscope (AFM) image of the single-layer $MoS_2$, with a thickness of <1 nm, according to some embodiments of the present disclosure.

Referring to FIG. 4A to FIG. 4D, FIG. 4A is a graph illustrating CVD monolayer MoS$_2$ characterizations, including an optical image of a single-layer MoS$_2$ FeFETs (Channel length=1 μm), according to some embodiments of the present disclosure. FIG. 4B is a graph illustrating CVD monolayer MoS$_2$ characterizations, showing an atomic force microscope (AFM) image 410A focusing on the MoS$_2$ channel of the single-layer MoS$_2$, with a thickness of <1 nm, according to some embodiments of the present disclosure. For example, a thickness of 0.75 nm evidences the monolayer nature of the MoS$_2$ channel used in the device. Since the underlying substrates could induce strain and charge doping in MoS$_2$, we first investigate the effect of the hybrid HfO$_2$/HfZrO$_x$ ferroelectric substrates on the MoS$_2$.

Figure 4C:
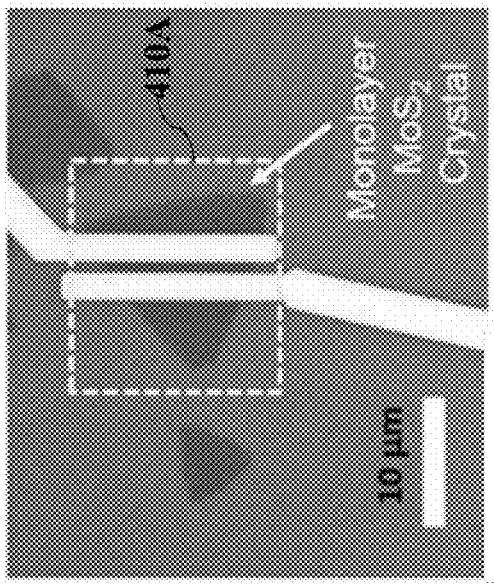
FIG. 4C is a graph illustrating CVD monolayer $MoS_2$ characterizations, showing the vibration frequencies using Raman spectroscopy, according to some embodiments of the present disclosure.

FIG. 4C is a graph illustrating CVD monolayer MoS$_2$ characterizations, showing the MoS$_2$-specific vibrational spectrum using Raman spectroscopy, according to some embodiments of the present disclosure. For example, as noted above, FIG. 4C shows the Raman spectra of the as-grown MoS$_2$ on SiO$_2$/Si and the as-transferred MoS$_2$ on HfO$_2$/HfZrO$_x$. For the as-grown MoS$_2$ on SiO$_2$/Si, the characteristic peaks of $E^1_{2g}$ and $A_{1g}$ Raman modes are located at 385.1 cm$^{-1}$ and 405.8 cm$^{-1}$, respectively. The frequency difference of 20.7 cm$^{-1}$ signifies the monolayer characteristic of MoS$_2$. Interestingly, after being transferred onto the HfO$_2$/HfZrO$_x$ substrate, the $E^1_{2g}$ (386.5 cm$^{-1}$) and $A_{1g}$ (404.6 cm$^{-1}$) modes of the monolayer MoS$_2$ are stiffened and softened, respectively, resulting a smaller frequency difference of 18.1 cm$^{-1}$. Essentially, the in-plane phonon vibration ($E^1_{2g}$) of MoS$_2$ is highly sensitive to the in-plane strain, while its out-of-plane phonon mode ($A_{1g}$) reveals the electron doping induced at the interface. It has been reported that for MoS$_2$ crystals grown on SiO$_2$/Si, the samples typically exhibit tensile strain due to the smaller thermal coefficient of expansion of SiO$_2$ than that of MoS$_2$, leading to phonon softening. Therefore, the observed blue shift of the $E^1_{2g}$ for the MoS$_2$ transferred on the HfO$_2$/HfZrO$_x$ substrate can be attributed to the relaxation of the built-in tensile strain after the transfer process. The 1.4 cm$^{-1}$ shift of the $E^1_{2g}$ peak roughly corresponds a tensile strain of ~1% in the as-grown MoS$_2$. In addition, the relaxation of the strain narrows the full width at half maximum (FWHM) of $E^1_{2g}$ from 4.67 cm 1 to 3.84 cm$^{-1}$. The sharp $E^1_{2g}$ peak also suggests that no significant defective crystal structure was formed during the transfer process. On the other hand, the softening of $A_{1g}$ indicates that there exists electron transfer from the HfO$_2$/HfZrO$_x$ substrate to the as-transferred MoS$_2$, yielding an n-type doping effect on the MoS$_2$ channel. The broadening of the $A_{1g}$ FWHM from 5.22 cm$^{-1}$ to 6.59 cm$^{-1}$ is also consistent with the effect of an increase in electron doping that was observed in previous studies. It is known that oxygen vacancies are the common intrinsic defects in many transition metal oxides including HfO$_2$ and ZrO$_2$. The electron doping induced in the as-transferred MoS$_2$ likely originates from the oxygen vacancies on the atomic layer deposition (ALD)-grown HfO$_2$ surface, which act as either donors or charge traps that results in the charge transfer at the MoS$_2$/HfO$_2$ interface.

Figure 4D:
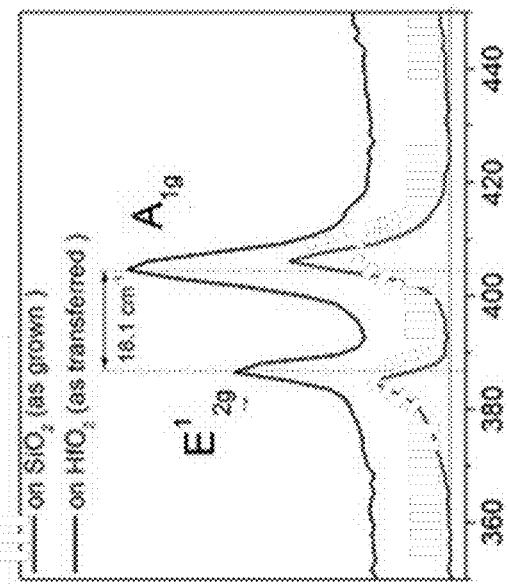
FIG. 4D is a graph illustrating CVD monolayer $MoS_2$ characterizations, showing a photoluminescence spectra of the single-layer $MoS_2$ at room temperature in air (532 nm excitation wavelength), according to some embodiments of the present disclosure.

FIG. 4D is a graph illustrating CVD monolayer MoS$_2$ characterizations, showing a photoluminescence spectra of the single-layer MoS$_2$ at room temperature in air (432 nm excitation wavelength), according to some embodiments of the present disclosure. For example, FIG. 5D compares the PL spectra of MoS$_2$ before and after the transfer processes. The PL peak at 1.85 eV in the as-grown MoS$_2$ on SiO$_2$/Si corresponds to the A exciton, originating from a direct transition between the conduction band minimum and the valence band maximum, while the weaker PL peak at ~2.0 eV is attributed to the B exciton due to a direct transition from the conduction band minimum to a lower lying valence band.

After being transferred onto the atomic layer deposition (ALD)-grown HfO$_2$/HfZrO$_x$ substrate, the PL intensity of MoS$_2$ is significantly quenched. The existence of abundant oxygen vacancies on the HfO$_2$ surface might induce trap states at the MoS$_2$/HfO$_2$ heterointerface, mediating additional recombination routes that are non-radiative. However, for the MoS$_2$ flake located on a region where an Au gate electrode is lain under the HfO$_2$/HfZrO$_x$ stack, observed is that the MoS$_2$ PL intensity is greatly amplified. The underlying Au gate electrode serves as a mirror layer that enhances the light-matter interaction of a MoS$_2$ monolayer through an enhanced optical absorption and Fabry-Perot cavity reflection. The slight red shift of the A exciton peak (1.84 eV) in the as-transferred MoS$_2$ also suggests an increased contribution from charged excitons (or trions), revealing that there are additional electrons transferred from the HfO$_2$ surface to the MoS$_2$.

Figure 5A:
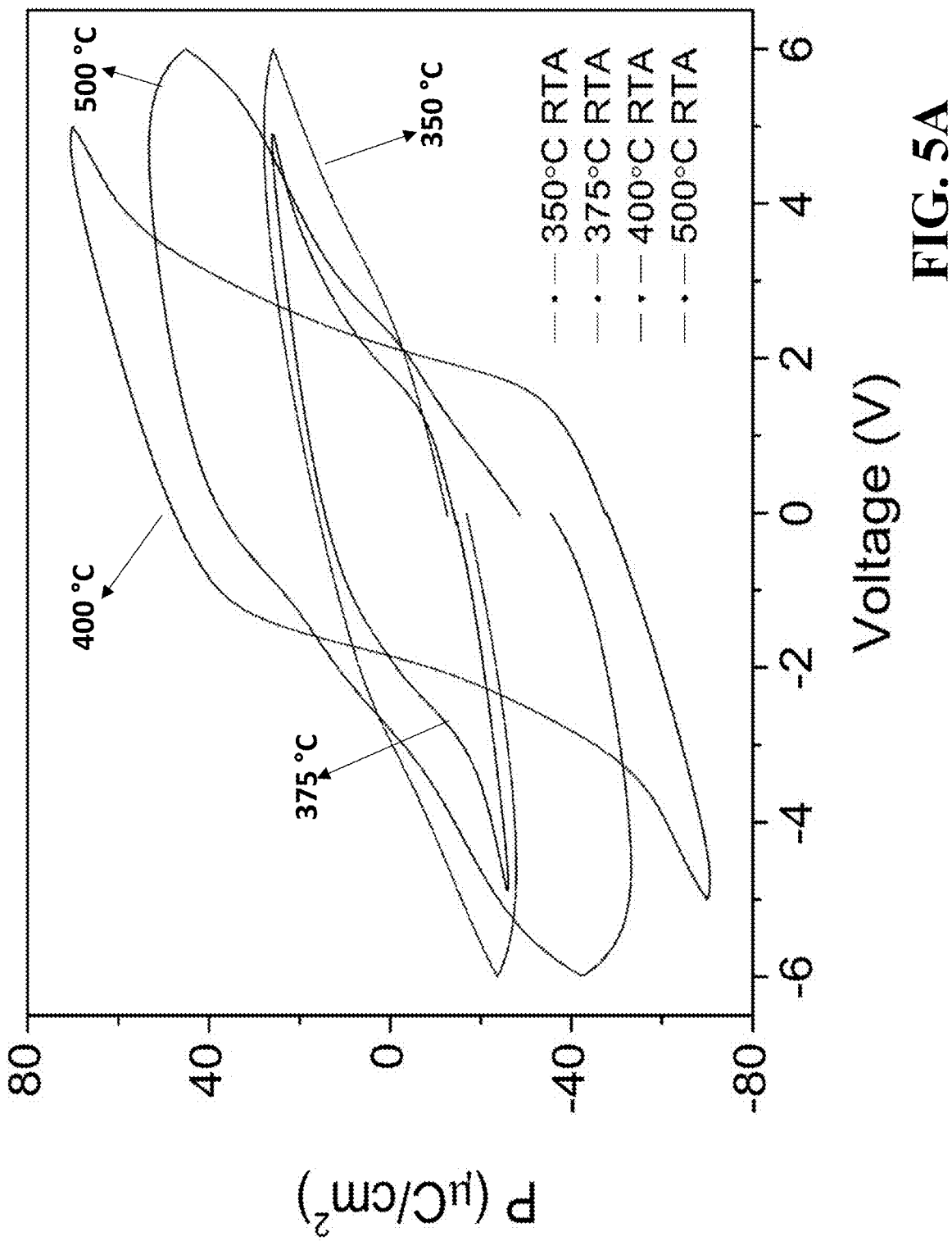
FIG. 5A is a graph illustrating polarization-voltage (P-V) hysteresis of the fabricated $HfZrO_x$ ferroelectric capacitors with different annealing temperatures, according to some embodiments of the present disclosure.
Figure 5C:
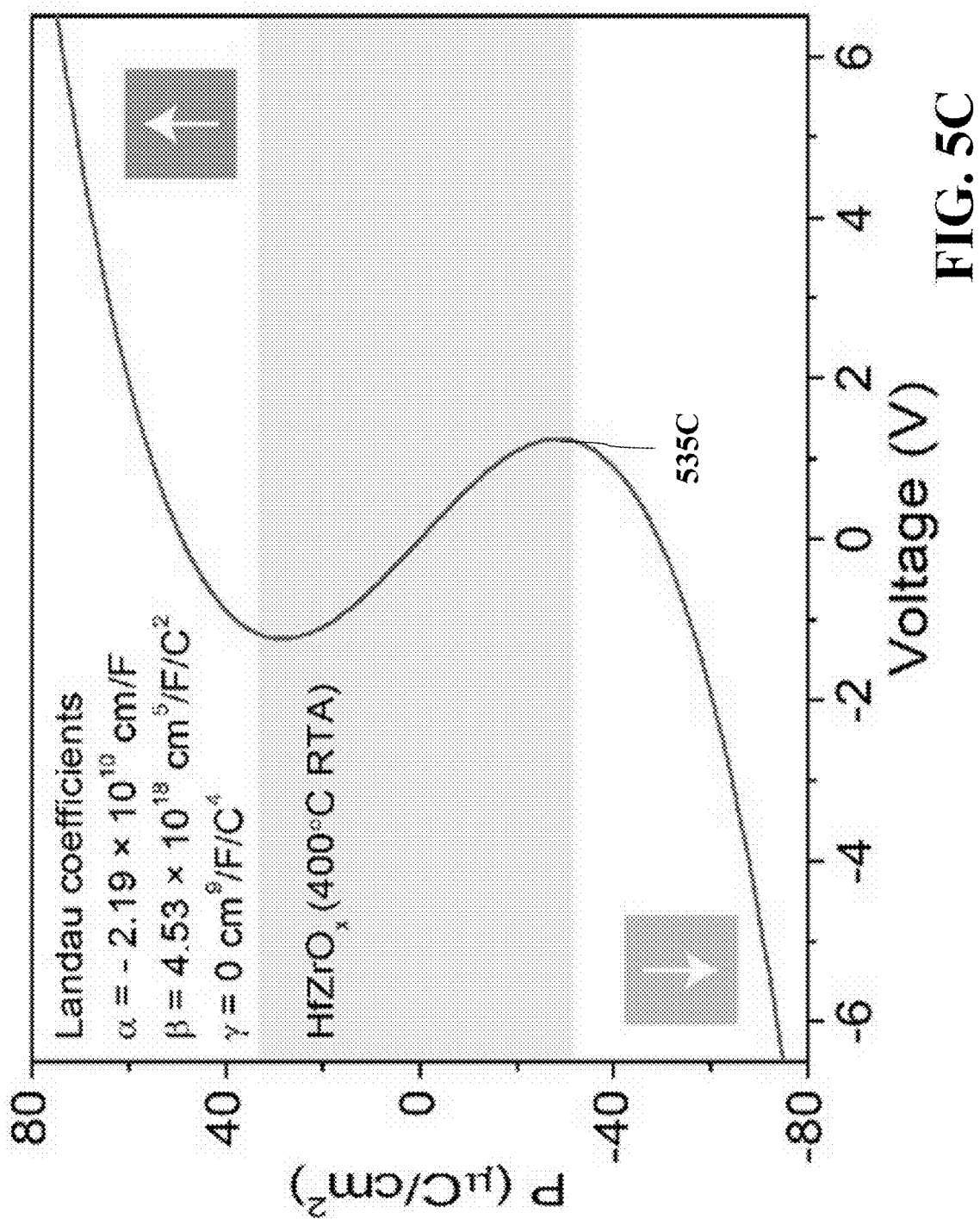
FIG. 5C is a graph illustrating landau coefficients extracted from FIG. 6A, and the corresponding P-V characteristic, according to some embodiments of the present disclosure.
Figure 5D:
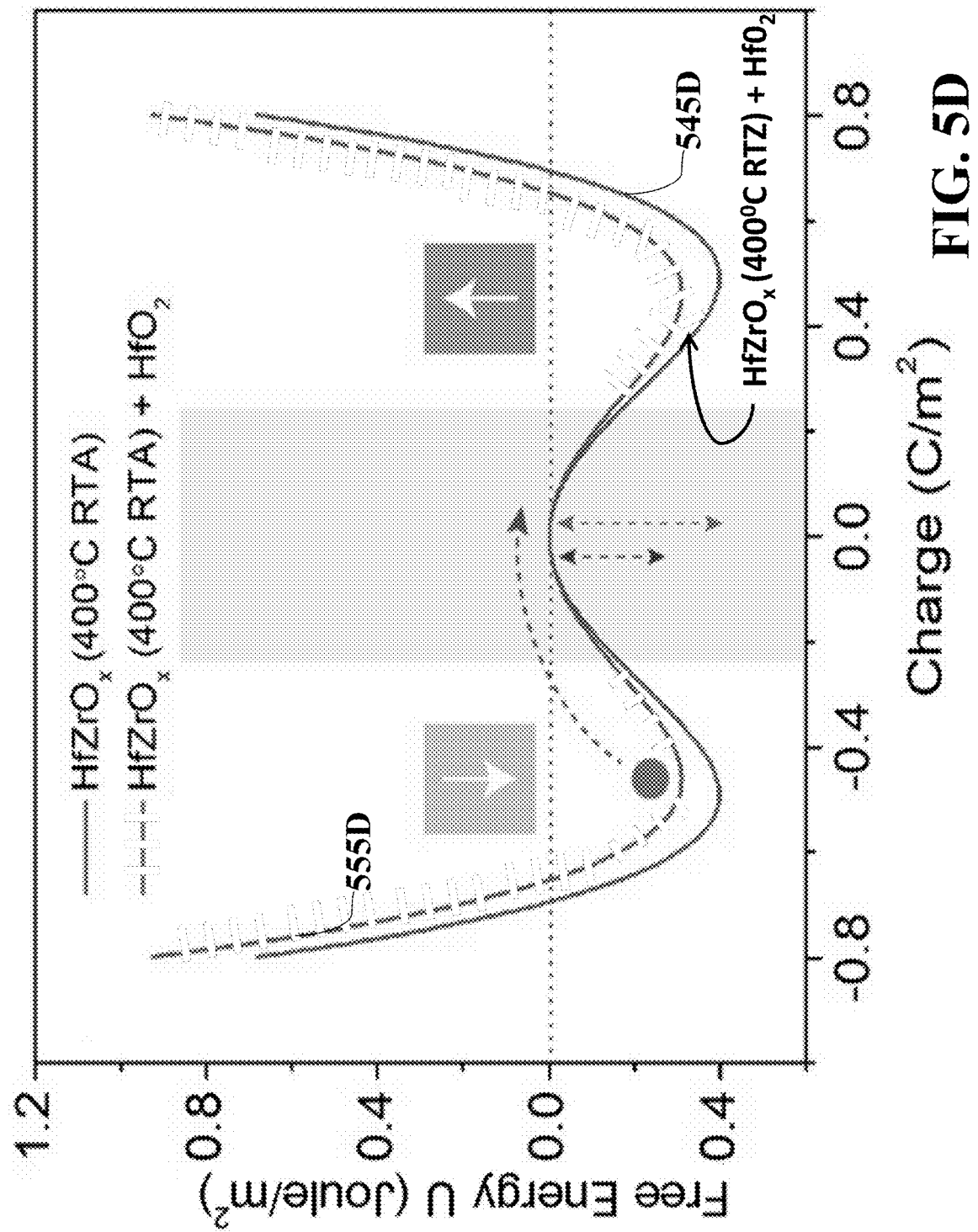
FIG. 5D is a graph illustrating free energy landscape (energy vs charge) of the as-grown ferroelectric (green curve) and the total energy of the hybrid $HfO_2/HfZrO_x$ gate stack in equilibrium, according to some embodiments of the present disclosure.

Referring to FIG. 5A to FIG. 5D, FIG. 5A is a graph illustrating polarization-voltage (P-V) hysteresis of the fabricated HfZrO$_x$ ferroelectric capacitors with different annealing temperatures, according to some embodiments of the present disclosure. For example, the ferroelectric properties of the as-grown HfZrO$_x$ thin film was first characterized through fabricating ferroelectric capacitors of Au/TiN/HfZrO$_x$/TiN/Ni with a metal/insulator/metal (MIM) structure, is shown in the insets of FIG. 5A. By applying an electric field across the ferroelectric capacitors, the capacitors can be polarized and their polarizations can be switched through changing the polarity of the applied electric field. Wherein, FIG. 5A shows the typical polarization-voltage (P-V) characteristic of the ferroelectric capacitors treated with different annealing temperatures.

A clear ferroelectric hysteresis loop starts appearing at 375° C. A lower temperature rounds the hysteresis loop likely due to a decreased portion of the desired ferroelectric phase in the HfZrO$_x$. As the annealing temperature increases to 400° C., the ferroelectric capacitor reaches a stronger remnant polarization (P) of 48 µC/cm$^2$ with a coercive voltage (V$_c$) at ~2 V. Such the sharp P-V hysteresis loop also suggests that the leakage current through the MIM capacitors is sufficiently low, reinforcing its candidacy of being a gate insulator for the applications in transistors. However, a higher annealing temperature of 500° C. results in a rounder hysteresis loop, which is indicative of a resistive leakage within the ferroelectric capacitor. From the above results, a ferroelectric HfZrO$_x$ thin film annealed at 400° C. was selected for further characterization and fabrication of our MoS$_2$ FeFETs.

Referring to FIG. 5B1 and FIG. 5B2, FIG. 5B1 is a graph illustrating capacitance-voltage (C-V) measurements of the ferroelectric capacitor annealed at 400° C. and a typical dielectric capacitor based on undoped HfO$_2$, with a schematic of polarization orientations with different electric field polarities, according to some embodiments of the present disclosure. For example, FIG. 5B1 shows the capacitance-voltage (C-V) characteristic at 1 kHz of the ferroelectric capacitor annealed at 400° C. 510B1 is the capacitance when the applied voltage changes from +4V to −4V; 520B1 is the capacitance when the applied voltage changes from −4V to +44V. The butterfly-shape hysteresis curve showing the two clear polarization states is another evidence of the good ferroelectricity in the as-grown HfZrO$_x$ thin film. The non-linear response, instead of a monotonic linear curve, again manifests a low leakage current in the as-grown HfZrO$_x$. The capacitance of the ferroelectric capacitor reaches its maximum at 2.8 µF/cm$^2$ at ±1.5 V. As a comparison, a MIM capacitor based on a dielectric HfO$_2$ thin film (~15 nm) shows an almost constant capacitance at ~1.4 µF/cm$^2$. The dielectric constants of the dielectric HfO$_2$ and the ferroelectric HfZrO$_x$ thin film were extracted to be ~23.7 and 47.5, which are consistent with the reposted values.

To investigate the intrinsic properties of the as-grown HfZrO$_x$ ferroelectric, the P-V characteristic was modeled using Landau-Khalatnikov (L-K) equation, which is expressed as $$V_{HfZrO_x} = 2\alpha tP + 4\beta tP^3 + 6\gamma tP^5 + \rho t \frac{dP}{dt}$$

Where V$_{HfZrO_x}$ is the voltage across the ferroelectric insulator, P is the polarization charge, t is the thickness of the ferroelectric HfZrO$_x$ insulator, α, β, and γ are the Landau coefficients, and ρ is an equivalent damping constant of the ferroelectric. Wherein FIG. 5B2 illustrates a circuit showing polarization orientations with different electric field polarities, according to some embodiments of the present disclosure. 550B2 is the applied voltage, and 552B2 is the corresponding electric field. 554B2 is the gold layer to apply the gate voltage across the whole device. 554B2 and 576B2 are charge induced at the HfZrO$_x$ layer. Similarly, 570B2 is the applied voltage, and 572B2 is the corresponding electric field. The applied voltage is the negative of the 550B2. 554B2 is the gold layer to apply the gate voltage across the whole device. 580B2 and 582B2 are charge induced at the HfZrO$_x$ layer.

FIG. 5C is a graph illustrating landau coefficients extracted from FIG. 5A, and the corresponding P-V characteristic, according to some embodiments of the present disclosure. For example, the Landau coefficients of the as-grown ferroelectric HfZrO$_x$ thin film annealed at 400° C. are extracted to be α=−2.19×10$^{10}$ cm/F, β=4.53×10$^{18}$ cm$^5$/F/C$^2$, and γ=0 cm$^9$/F/C, by fitting the experimental data using the L-K equation and assuming dP/dt=0 for static P-V measurement. The P-V calculated from the L-K equation shows S-shape 635C, where the dP/dV is negative corresponding to the negative capacitance regime of the as-grown HfZrO$_x$.

However, the negative capacitance state is unstable, which yields the observed hysteresis loops in the experimental P-V measurement. In addition, Gibb's free energy of the as-grown ferroelectric HfZrO$_x$ can be further calculated based on the relationship of $$V_{HfZrO_x} = dU_{HfZrO_x}/dP.$$

FIG. 5D is a graph illustrating free energy landscape (energy vs charge) of the as-grown ferroelectric (green curve, 545d) and the total energy of the hybrid HfO$_2$/HfZrO$_x$ gate stack in equilibrium, according to some embodiments of the present disclosure. 555D is the free energy for the hybrid HfO$_2$/HfZrO$_x$. Inclusion of the HfO$_2$ reduces the energy barrier. For example, plots the free energy versus charge of the HfZrO$_x$ thin film annealed at 400° C. based on the experimental Landau coefficients. The energy of the as-grown ferroelectric thin film exhibits a two-valley shape, of which the two local minimums manifest that there are two stable polarization states available in the as-grown HfZrO$_x$ thin film. Again, the region between those two valleys where $$d^2U_{HfZrO_x}/dP^2 < 0$$

suggests there exists an unstable negative capacitance states in the ferroelectric, resulting in the observed hysteresis characteristics in the HfZrO$_x$ thin film. The above results based on both experiment and simulation indicate the good ferroelectricity in the as-grown HfZrO$_x$ and reinforce its suitability for the fabrication of ferroelectric-based memory devices.

Figure 6A:
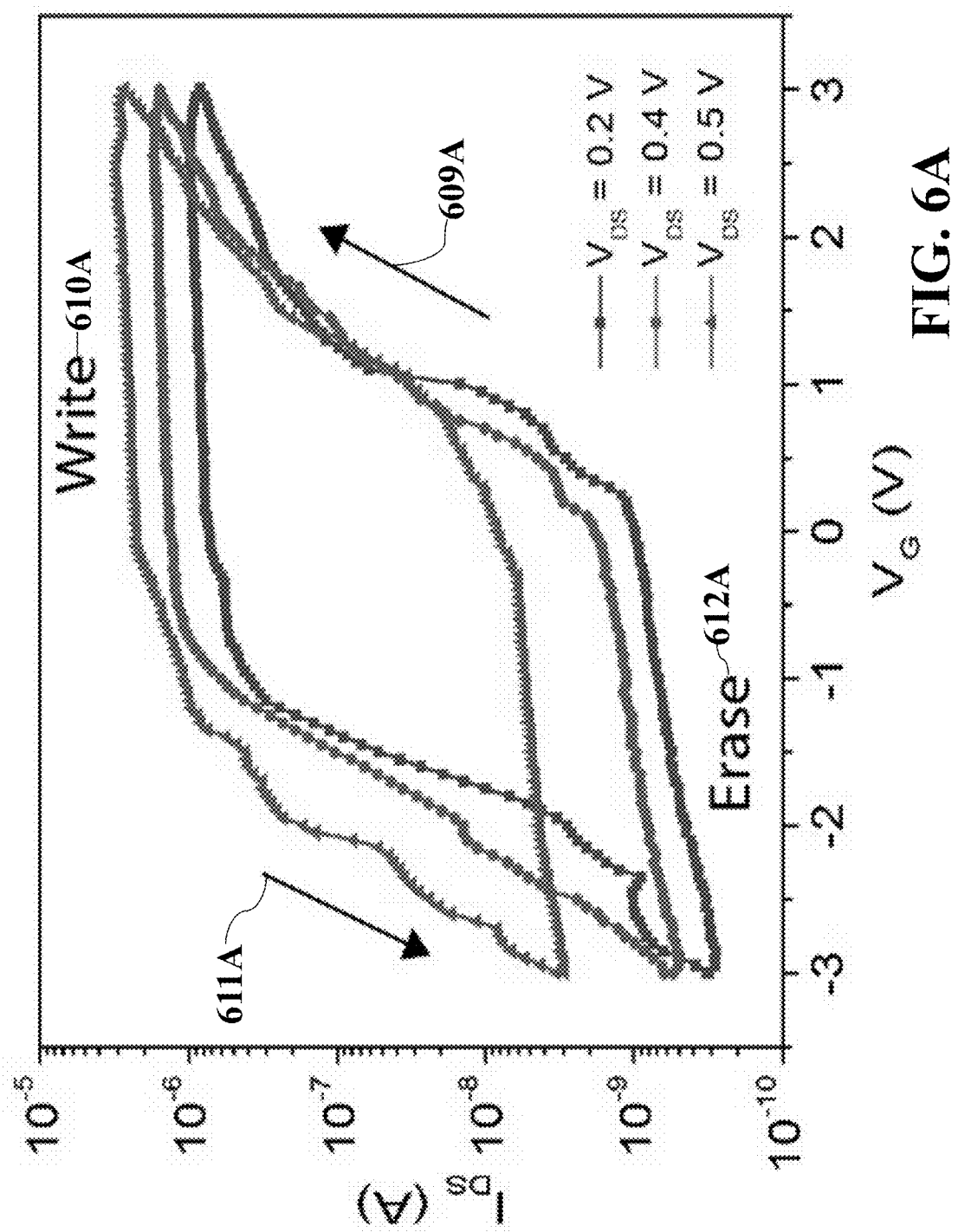
FIG. 6A is a graph illustrating electrical performance of the single-layer CVD $MoS_2$ FeFET, including transfer curves ($I_{DS}$-$V_G$) of the $MoS_2$ FeFET measured at room temperature with various $V_{DS}$. The device has a channel length of 1 μm and channel width of 10 μm, according to some embodiments of the present disclosure.

FIG. 6A is a graph illustrating electrical performance of the single-layer CVD MoS$_2$ FeFET, including transfer curves (I$_{DS}$-V$_G$) of the MoS$_2$ FeFET measured at room temperature with various V$_{DS}$. The device has a channel length of 1 µm and channel width of 10 µm, according to some embodiments of the present disclosure. In order to demonstrate back-gate FeFETs based on our CVD-grown monolayer MoS$_2$ 121A combined with the as-grown ferroelectric HfZrO$_x$ thin film 151A. As shown in FIG. 2B, step 8, the surface of the ferroelectric HfZrO$_x$ 151A is passivated by a thin HfO$_2$ layer (~5 nm) 141A to prevent the degradation of the ferroelectricity that could originate from the oxidation and moisture in air or trapping and de-trapping centers formed due to the ferroelectric 151A/metal electrode 111A, 131A heterointerface.

For example, FIG. 6A shows the electronic transport properties ($I_{DS}$-$V_G$) of a fabricated CVD monolayer MoS$_2$ transistor driven by the bottom gate of the ferroelectric HfZrO$_x$ thin film. The transfer characteristics were measured at gate voltages ($V_G$) sweeping between −3 V to 3 V with various drain-to-source voltages ($V_{DS}$). The sweeping direction is from negative to positive 609A and then back to negative 711A. The gate leakage current is several orders of magnitude smaller than the drain current at all the sweeping gate voltages (see FIG. 3), so that the gate leakage current does not affect the transfer characteristics of the MoS$_2$ FeFET. The device shows an n-type behavior with a clear counterclockwise, ferroelectric hysteresis loop, which is opposite to the transfer characteristic of a MoS$_2$ transistor modulated by a dielectric gate insulator (clockwise hysteresis loop).

Still referring to FIG. 6A, the counterclockwise hysteresis from 609A to 611A suggests that the polarization switching nature of underlying ferroelectric HfZrO$_x$ is preserved in the FETs and strongly couples to the single-layer semiconducting MoS$_2$, giving rise to the resistive switching of the transistor channel. Specifically, during the device operation, when a positive $V_G$ is applied, the polarization of the ferroelectric layer is directed to the MoS$_2$ channel, which brings the MoS$_2$ into the electron accumulation regime and results in a high drain current as the on state [or the low resistance state (LRS) 710A. After the $V_G$ is removed, the HfZrO$_x$ layer remains polarized and provides a locally positive electric field on the channel. Therefore, the channel remains conductive as the LRS 610A for the write program until the $V_G$ become negative. Once a suitable negative $V_G$ is applied, the ferroelectric polarization changes sign (pointing to the gate), which depletes the electron in the MoS$_2$ channel and produces the off state, corresponding to the high resistance state (HRS) 612A for the erase program. Such two LRS 610A and HRS 612A retain at $V_G$=0 V, which signifies the desire nature of a data storage device. The on current of the MoS$_2$ FeFET increases as the $V_{DS}$ increases and a large write/erase ratio of >10$^3$ between the LRS 610A and HRS 612A can be obtained at lower $V_{DS}$.

Figure 6B:
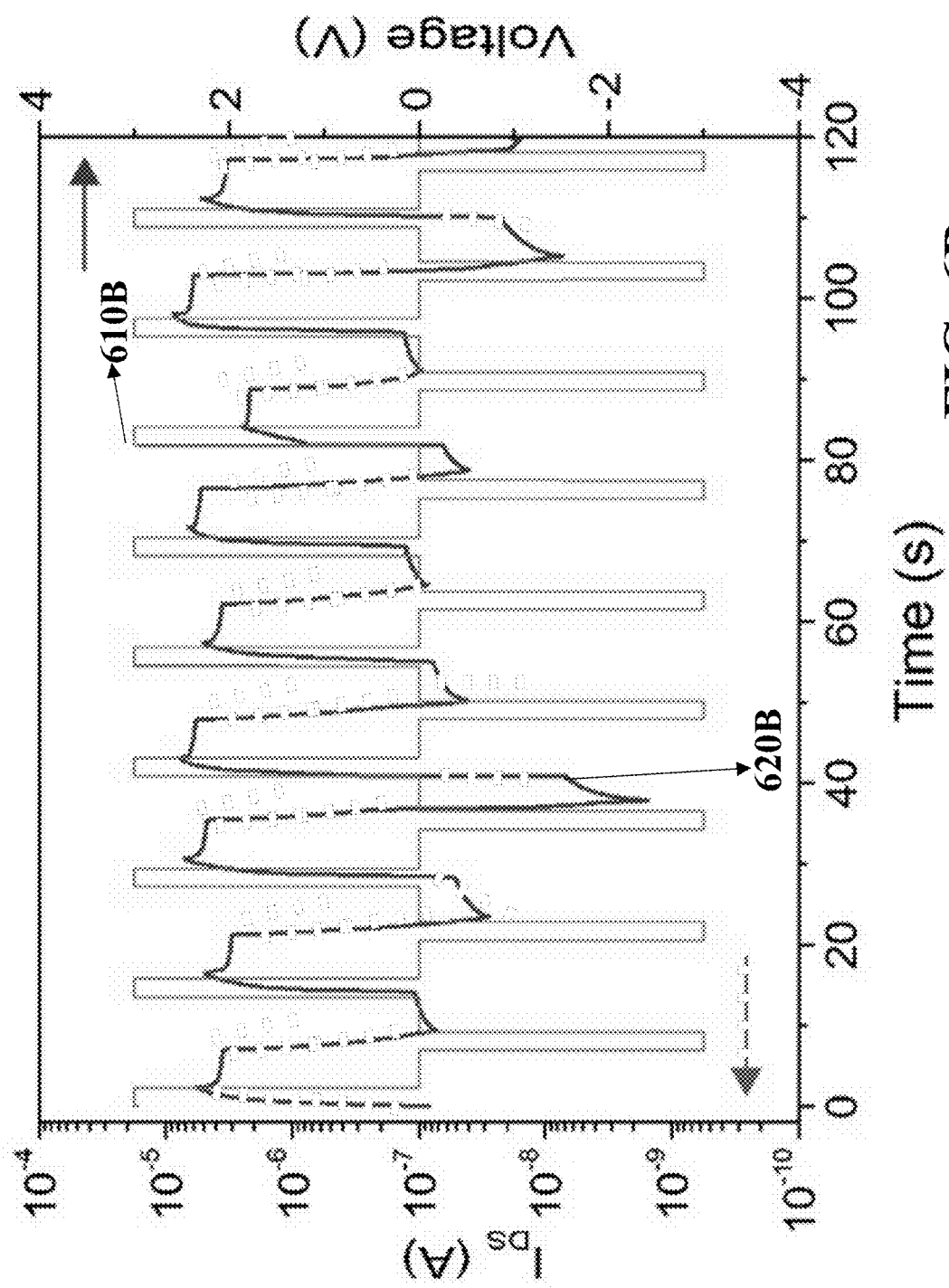
FIG. 6B is a graph illustrating electrical performance of the single-layer CVD $MoS_2$FeFET, showing current dynamics of the $MoS_2$FeFET with periodic gate bias pulse ($V_{DS,\ read}$=0.4 V), according to some embodiments of the present disclosure.

FIG. 6B is a graph illustrating electrical performance of the single-layer CVD MoS$_2$ FeFET, showing current dynamics of the MoS$_2$ FeFET with periodic gate bias pulse ($V_{DS, read}$=0.4 V), according to some embodiments of the present disclosure. For example, FIG. 6B shows the dynamic write/read/erase/read processes of the MoS$_2$ FeFET by applying alternating pulses onto the gate 610B. Voltages applied to the gate of write, erase, and read were +3 V, −3V, and 0 V, respectively. The dynamic write/read ratio is over 10$^2$ under $V_{DS}$=0.4 V (720B). From the transfer characteristic, noted is that the MoS$_2$ FeFET shows as a higher off current of 10$^{-9}$ A than that of our conventional CVD MoS$_2$ transistor using a SiO$_2$ dielectric gate stack, suggesting a higher degree of electron doping level in the channel of the MoS$_2$ FeFET. This can be attributed to the charge transfer between the CVD MoS$_2$ and the HfO$_2$ passivation layer that leads to n-type doping of the MoS$_2$ channel, as observed from the Raman and PL spectra, as noted above, in FIG. 4C and FIG. 4D.

Figure 7:
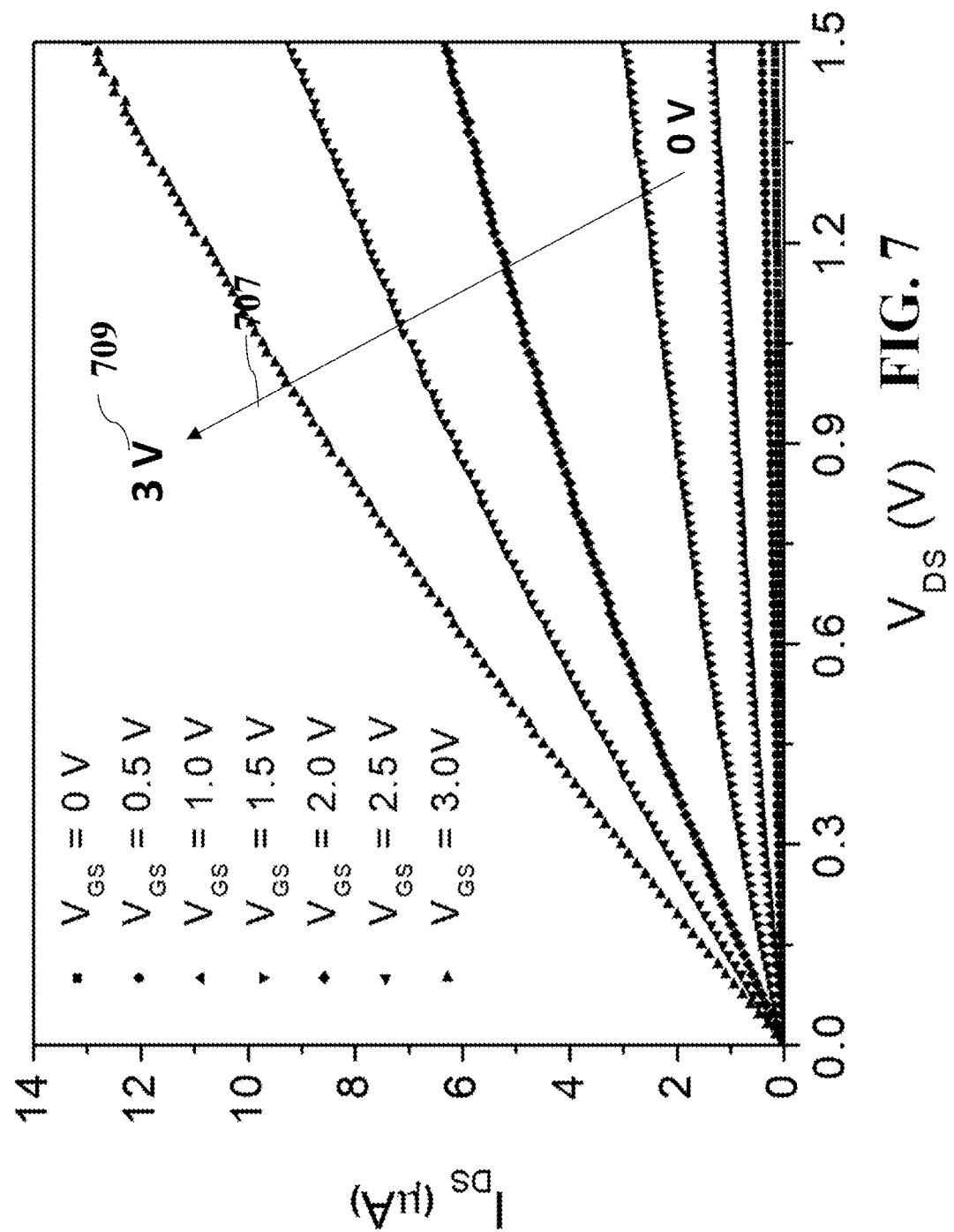
FIG. 7 shows a graph illustrating output characteristics of the $MoS_2$ FeFET with various $V_G$, according to some embodiments of the present disclosure.

Further improvement in the on/off current ratio of the MoS$_2$ FeFETs should be able to achieve through reducing the charge transfer at the MoS$_2$/HfO$_2$ surface, for example, by introducing a few layers of chemically inert 2D hexagonal boron nitride (hBN) that physically separate the MoS$_2$ channel and HfO$_2$. The output characteristics ($I_{DS}$, $V_{DS}$) of the MoS$_2$ FeFET with $V_G$ swept from 0 to 3 V with $V_{DS}$ scanning from 0 to 1.5 V are shown in FIG. 7, see below. A linear current-voltage response at low $V_{DS}$ indicates a good contact property at the Ni electrode/MoS$_2$ interface. The output current displays a trend toward saturation as the $V_{DS}$ increases, suggesting that a high electron density can be reached through the ferroelectric gate. Hence, the channel resistance is significant reduced and contact resistance become dominant.

Figure 6C:
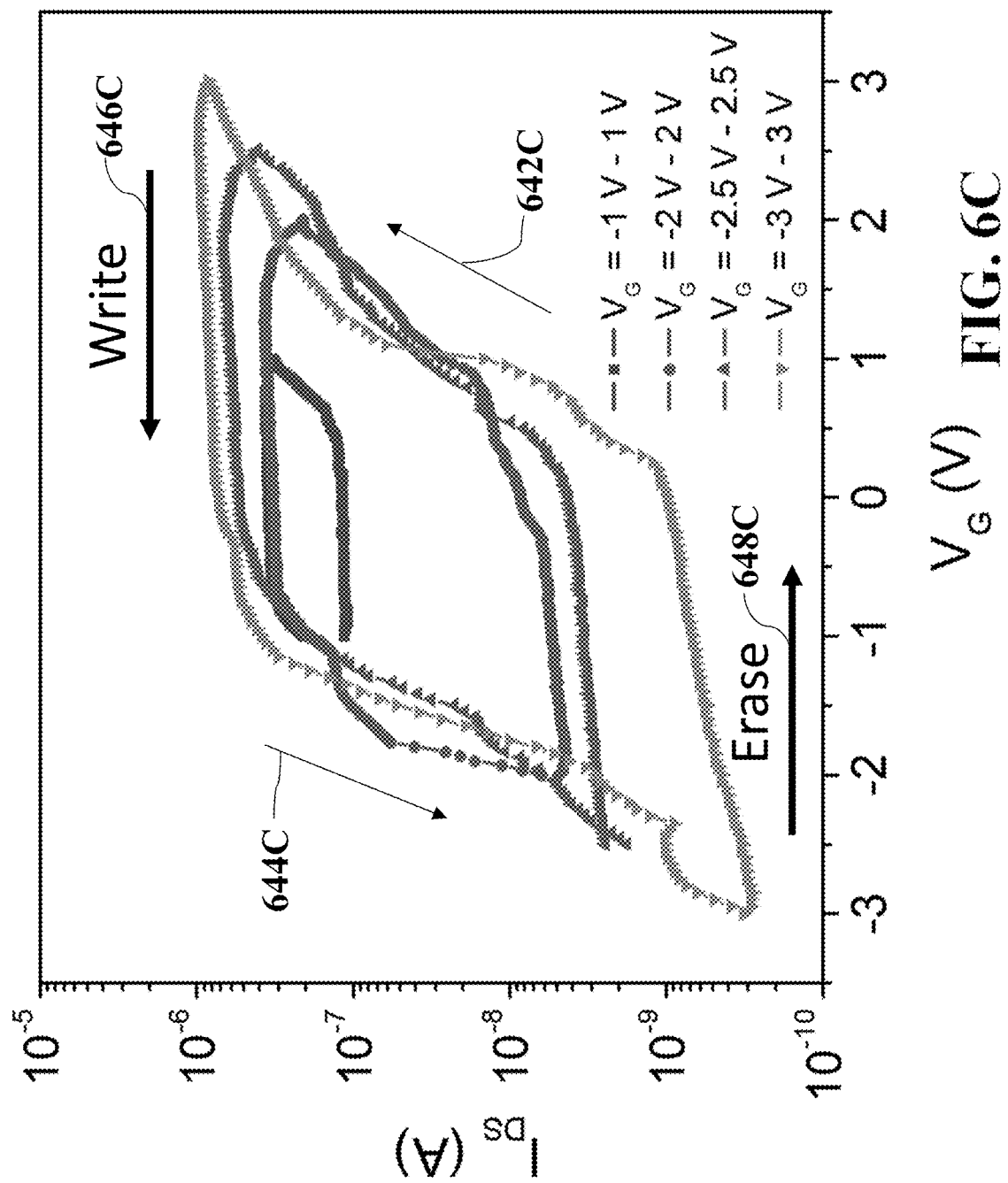
FIG. 6C is a graph illustrating electrical performance of the single-layer CVD $MoS_2$ FeFET, showing transfer curves ($I_{DS}$-$V_G$) of the $MoS_2$ FeFET, measured under different $V_G$ scan ranges at $V_{DS}$=0.2 V, according to some embodiments of the present disclosure.

On the other hand, compared to other 2D FeFETs reported in previous studies, we note that our MoS$_2$ FeFET exhibits one order of magnitude higher current at the low-resistance state with a much smaller driving voltage (±3V), indicating a more efficient gate control in our device. For example, the 2D FeFETs using ferroelectric P(VDF-TrFE) and 2D CuInP$_2$S$_6$ show a on current of ~10$^{-7}$ A with poling violates of ±40 V and ±5 V, respectively[16-17]. The ferroelectric hysteresis loop in the $I_{DS}$-$V_G$ characteristics of the MoS$_2$ FeFET can be further modulated by applying different gate biases, as shown in FIG. 6C. With a larger $V_G$, a larger hysteresis loop can be obtained, suggesting the on/off current ratio of the MoS$_2$ FeFET is controllable through adjusting the gate bias. A clear ferroelectric hysteresis characteristic with two distinct states can support even for a smaller $V_G$ range, although the corresponding on/off ratio decreases. This feature of low-driven voltage promises the future applications in synaptic electronics and neuromorphic computing where low-power consumption is highly required to bring them into practice. It is likely that the thin HfO$_2$ layer inserted between the semiconducting MoS$_2$ channel and the ferroelectric HfZrO$_x$ layer could play two crucial roles: (i) preserving the ferroelectricity of the underlying HfZrO$_x$ through surface passivation and (ii) lowering the threshold poling voltage of the device. First, it has been reported in the organic FeFETs that there exists polarization fluctuation at the semiconductor/ferroelectric interface[36]. Such the polarization fluctuation can be suppressed by placing a thin buffer layer of PMMA between the channel and ferroelectric insulator, thus improving the device performance. Accordingly, the thin layer of HfO$_2$ in our device could act as a buffer layer that suppresses the polarization fluctuation and retains the ferroelectricity. Second, since the thin dielectric HfO$_2$ layer exhibits a finite capacitance with a free energy of $U_{HfO2}$=$Q^2$/$2C_{HfO2}$ (the measured capacitance of a thin dielectric HfO$_2$ MIM capacitor), when connected in series to the ferroelectric layer, the energy of the hybrid HfO$_2$/HfZrO$_x$ gate stack can be redistributed to $U_{gate}$ ($U_{HfZrOx}$+$U_{HfO2}$).

Figure 8:
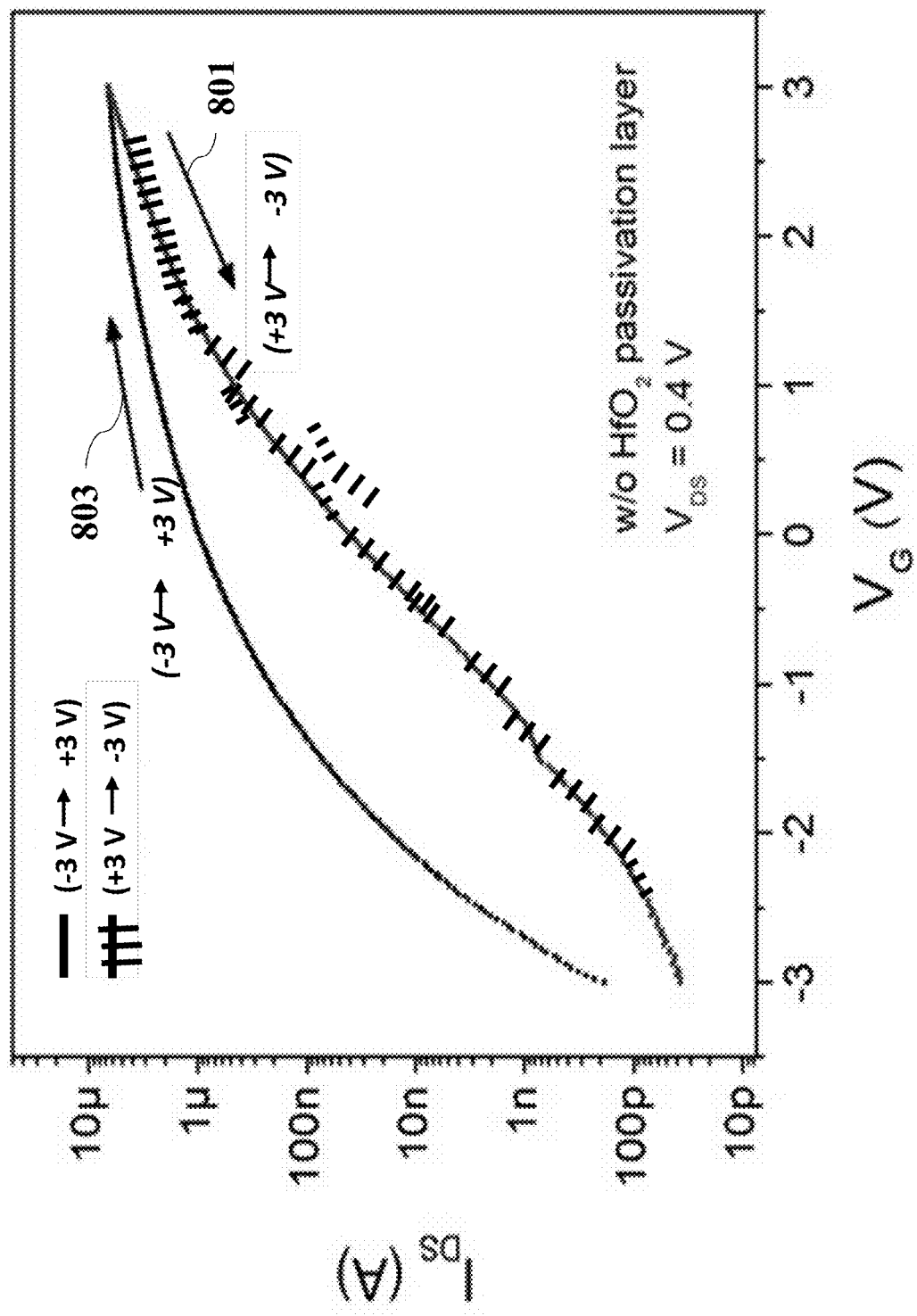
FIG. 8 shows a graph illustrating transfer characteristic of a CVD $MoS_2$ transistor without the thin $HfO_2$ passivation layer on the ferroelectric surface, according to some embodiments of the present disclosure.

As noted above, FIG. 4D illustrates the total energy of the hybrid HfO$_2$/HfZrO$_x$ gate stack based on the experimentally extracted Landau coefficients and the measured capacitance. It can be seen that the presence of the thin HfO$_2$ passivation layer in the gate stack effectively lowers the energy barrier between the two polarization states in the ferroelectric, which is fundamentally associated with the threshold of the poling voltage for a ferroelectric-based devices. Therefore, the ferroelectric characteristic in FeFETs starts to appear when a sufficient gate bias is applied. Also, as can be seen in FIG. 8, see below, a MoS$_2$ FeFET without the thin HfO$_2$ passivation layer shows no ferroelectric characteristics at the same range of gate bias, indicating the significance of the presence of the thin HfO$_2$ passivation layer. Finally, we show the synaptic-like behavior of the MoS$_2$ FeFET.

FIG. 6C is a graph illustrating electrical performance of the single-layer CVD MoS$_2$ FeFET, showing transfer curves (I$_{DS}$-V$_G$) of the MoS$_2$ FeFET, measured under different V$_G$ scan ranges at V$_{DS}$=0.2 V, according to some embodiments of the present disclosure. For example, FIG. 6C provides the electrical performance of the single-layer CVD MoS$_2$ channel memory. Wherein the transfer curve (I$_{DS}$-V$_{GS}$) of the MoS$_2$ FeFETs at room temperature at V$_{DS}$=0.5 V. The room temperature can be within a range of 65 F degrees to 77 F degrees. Two obvious memory states of write and erase can be observed. The device has a channel length of 1 µm and channel width of 10 µm. The output curve of the MoS$_2$ memory device driven by various back voltages, showing a n-type transistor characteristic. Energy band diagrams for on (c) write and (d) erase states of a HfZrO$_x$ ferroelectric gated MoS$_2$ FET.

Figure 6D:
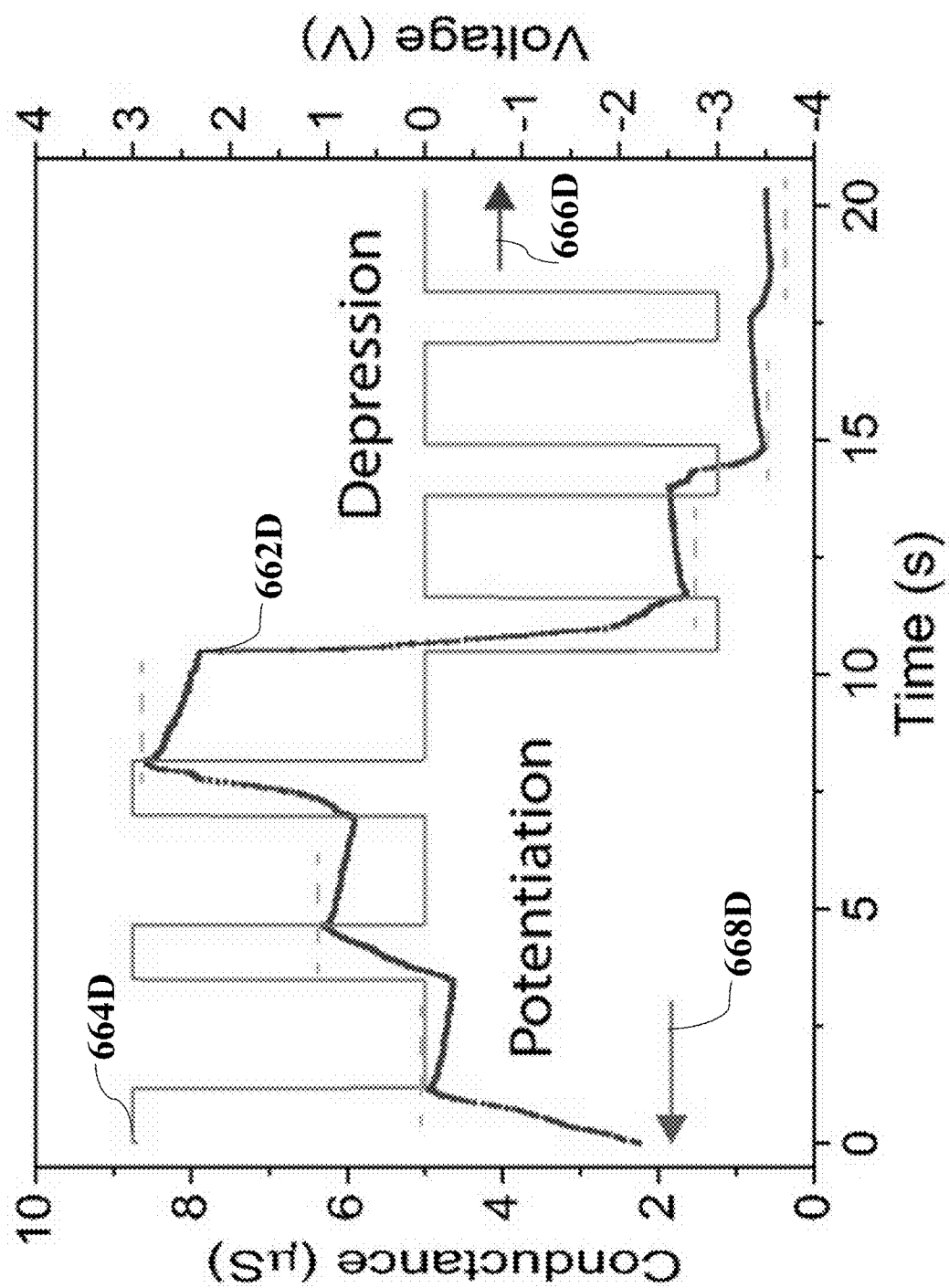
FIG. 6D is a graph illustrating electrical performance of the single-layer CVD $MoS_2$ FeFET, showing a sequence of pulsed voltage stimulations showing multiple conductance states with synaptic-like potentiation and depression from the $MoS_2$ FeFET ($V_{DS,\ read}$=0.4 V), according to some embodiments of the present disclosure.

FIG. 6D is a graph illustrating electrical performance of the single-layer CVD MoS$_2$ FeFET, showing a sequence of pulsed voltage stimulations 664D showing multiple conductance states 662D with synaptic-like potentiation and depression from the MoS$_2$FeFET (V$_{DS,\ read}$=0.4 V), according to some embodiments of the present disclosure. For example, FIG. 7D shows the dynamic response of the MoS$_2$ FeFET-based synapse by applying sequences of pulsed voltage stimulations 664D with identical amplitudes, durations and intervals and the change in channel conductance 662D was simultaneously monitored. The conductance of the device increase and decrease with the sequential electrical excitations in a stair-like way, thus producing multiple conductance states. Such programmable and cumulative conductance fundamentally benefits from the nature of multi-domain switching dynamics in the ferroelectric HfZrO$_x$ gate oxide. The fraction of the ferroelectric polarization charge in the certain orientation can be increasing with the sequential pulsed stimulations 664D. Then the changes in the net polarization charge modulate the transistor threshold voltage, and therefore, the channel conductance (at a fixed gate read voltage. The observed potentiation and depression of the conductance dynamics and the low-driven-voltage feature of the CVD MoS$_2$ FeFETs promise the future applications in neural networks and deep learning[37-38]. Our results have provided preliminary but important insights into the design and integration of synthetic TMDs and HfO$_2$-based ferroelectrics for energy-efficient 2D memory devices.

FIG. 7 shows a graph illustrating output characteristics of the MoS$_2$FeFET with various V$_G$, according to some embodiments of the present disclosure. FIG. 7 shows the good transistor performance of our device. The drain-to source current is controlled by the applied gate voltage.

FIG. 8 shows a graph illustrating transfer characteristic of a CVD MoS$_2$ transistor without the thin HfO$_2$ passivation layer on the ferroelectric surface, according to some embodiments of the present disclosure.

Upon an overview of the present disclosure, a 2D FeFETs using CVD-grown monolayer MoS$_2$ and a hybrid HfO$_2$/HfZrO$_x$ ferroelectric gate insulator with a back-gated architecture is presented, among other aspects. Further, the fabricated devices of the present disclosure show memory hysteresis characteristics and feature low-operational voltages, reasonable on/off ratio (>10$^3$), and insignificant leakage current (<100 pA) at room temperature ranging between 65 degrees to 77 degrees Fahrenheit. In addition, some of the ferroelectric characteristics of the devices of the present disclosure can be modulated by the gate biases. The thin HfO$_2$ layer in the gate stack effectively passivates the ferroelectric surface to stabilize the device operation and enables lower poling voltages though the energy redistribution of the gate stack. Further still, the fabricated 2D FeFETs exhibit programmable, cumulative conductance enabled by the dynamic polarization switching in the HfZrO$_x$ for electronic synapse applications. The PL and Raman spectra both reveal that the HfO$_2$ interfacial layer induces n-type doping effect to the MoS$_2$ channel, and the back-gated architecture of the 2D FeFETs offers an amplification of the PL through the bottom metal mirror layer. Further, based on our FeFETs structure of the present disclosure, the integration of synthetic 2D semiconducting TMDs and inorganic HfO$_2$-based ferroelectrics illustrate results for future applications in large-scale high-performance nonvolatile memory and neuromorphic computing systems, among other applications.

FIG. 9 shows a table illustrating a comparison of the main features among several types of FeFET memory devices, according to some embodiments of the present disclosure. Our poling voltage is smaller than 3V, significantly smaller than all other prior teaching, implying that our device is more energy efficient.

Figure 10A:
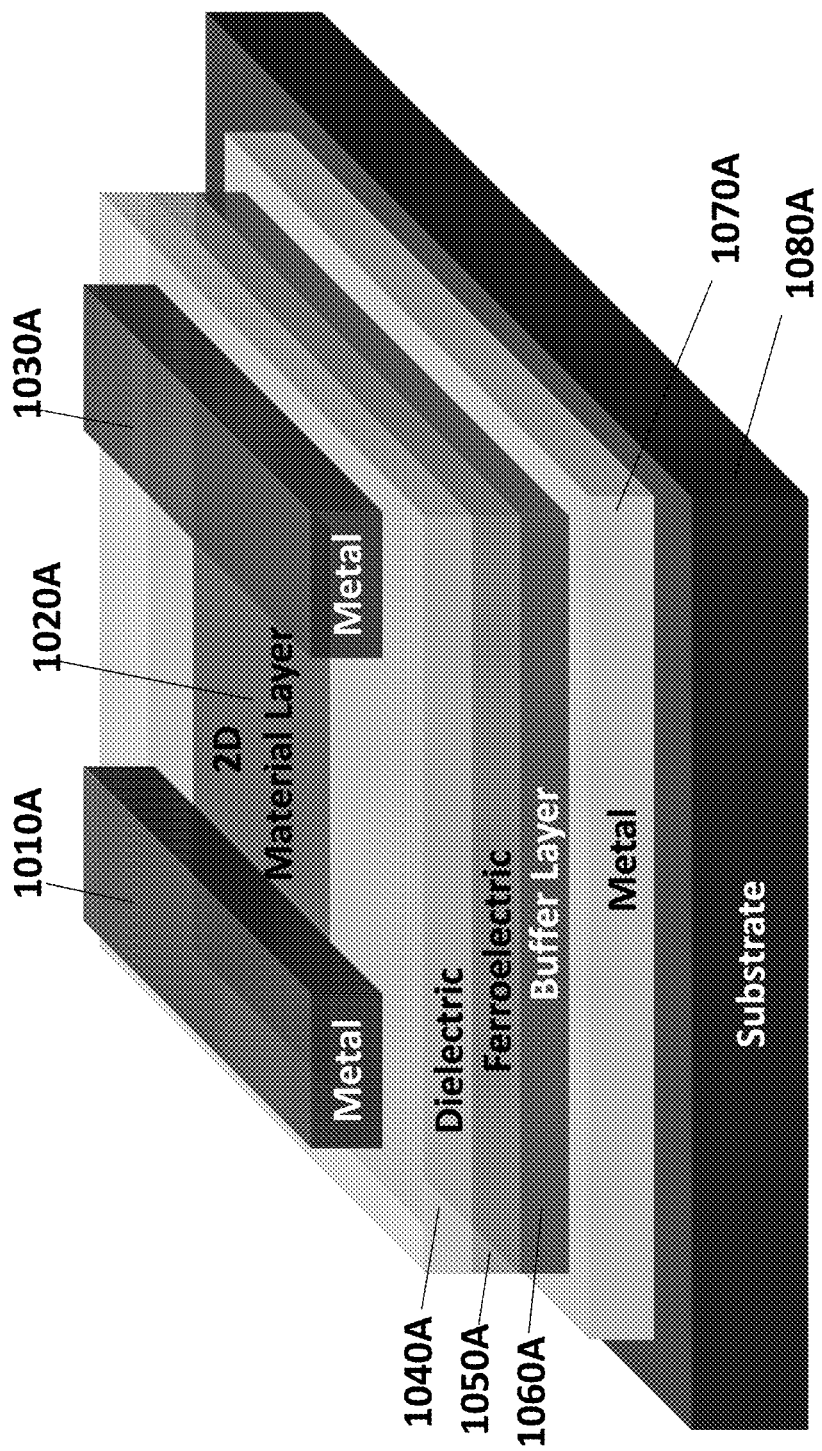
FIG. 10A is a schematic illustrating a three-dimensional (3D) view of a device first structure, according to an embodiment of the present disclosure.
Figure 10B:
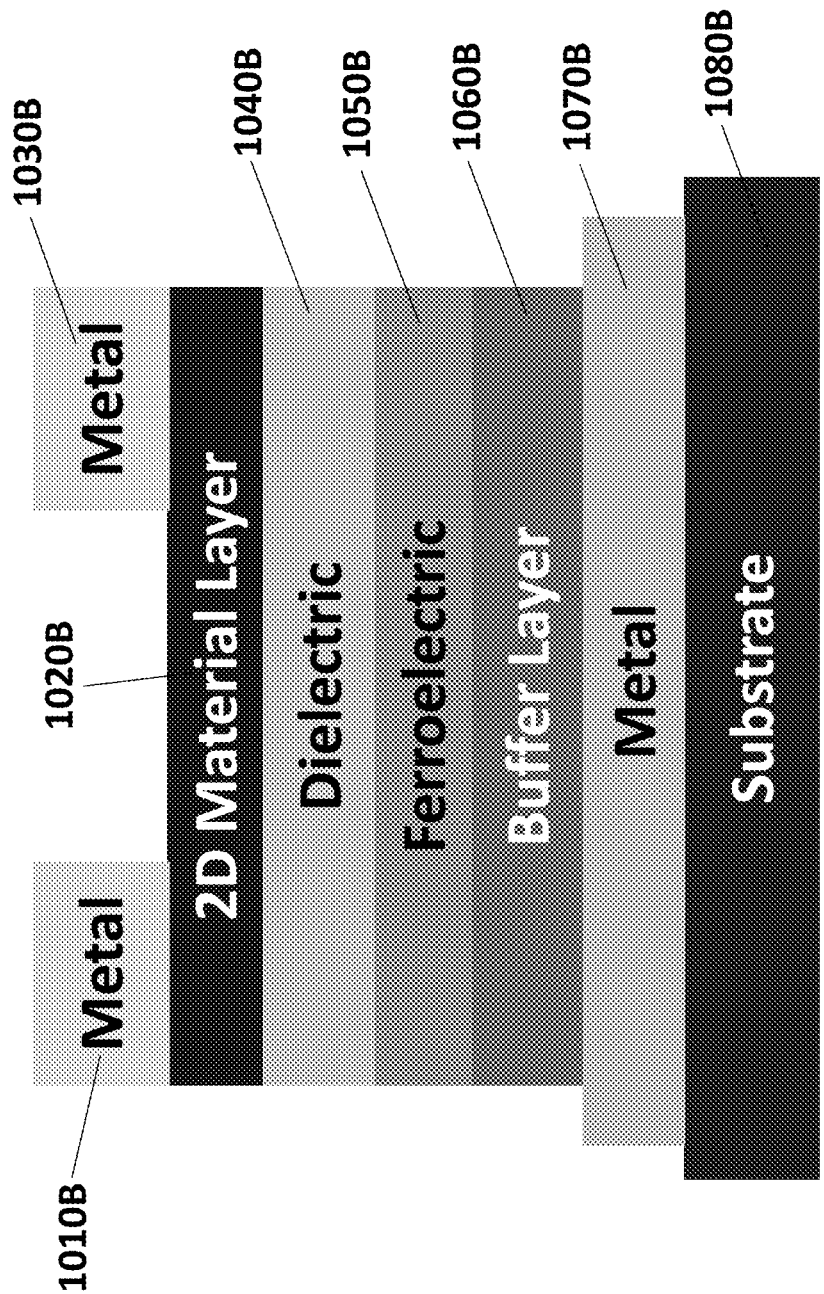
FIG. 10B is a schematic illustrating a side view of the device first structure of FIG. 10A, according to an embodiment of the present disclosure.

Referring to FIG. 10A and FIG. 10B, FIG. 10A is a schematic illustrating a three-dimensional (3D) view of a device first structure, according to an embodiment of the present disclosure. FIG. 10B is a schematic illustrating a side view of the device first structure of FIG. 10A, according to an embodiment of the present disclosure.

FIG. 10A and FIG. 10B show the device first structure including a 1080A is a substrate. 1070A is a metal layer serving as the gate electrode. 1060A is a buffer layer (e.g. TiN, ITO) for enhancing the ferroelectric properties of the ferroelectric layer 1050A. 1050 A is the ferroelectric layer. 1040A is the dielectric layer to passivate the ferroelectric surface and lowering the switching energy. 1010A and 1030A are the electrodes for the source and drain of the ferroelectric transistor. 1020A is the two-dimension material, serving as the device channel. a substrate 1080A, 1080B metal layer 1070A, 1070B or gate having a length less than the substrate 1080A, 1080B to create edges on both sides. Next, a buffer layer 1060A, 1060B having a length less than the metal layer 1070A, 1070B to create edges on both sides. Wherein a ferroelectric layer 1050A, 1050B having a same length as the buffer layer 1060A, 1060B.

A 2D material layer 1020A, 1020B having a same length as the ferroelectric layer 1050A, 1050B is placed on the dielectric layer 1040A, 1040B. Further two metal layers 1010A, 1010B, 1030A, 1030B are placed on each end length of the 2D material layer 1020A, 1020B creating a cavity between the two metal layers 1010A, 1010B, 1030A, 1030B.

Some aspects of FIG. 10B can include that a ratio of 1040B to 1050B provides for: (a) tuning overall circuit operating voltage; (b) height of 1040B, if too high damages 2D material 1020B; (c) at least one goal of 1040B thickness (ratio to 1050B) is to protect 2D material from wrinkling; (d) an effect of height of 1040B reduces contact resistance; (e) a shape of 1040B can be any shape (round, square); and (f) however, a uniform shape of 1040B can improve performance.

Figure 10C:
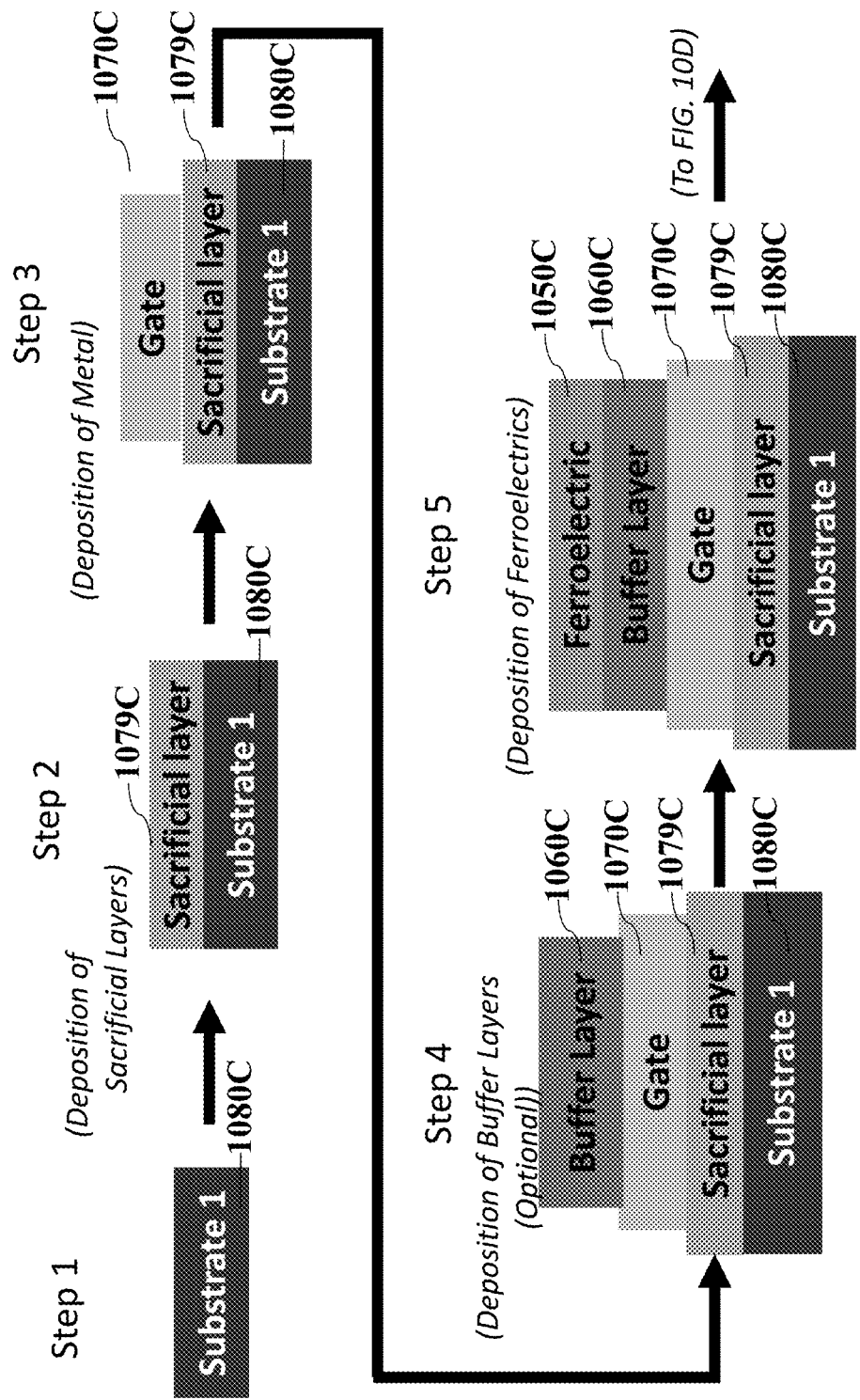
FIG. 10C is a schematic illustrating a fabrication process of the device first structure, showing fabrication process steps one (1) to step five (5) and materials, according to some embodiments of the present disclosure.

FIG. 10C is a schematic illustrating details of a fabrication process of the device first structure of FIG. 10A, showing fabrication process steps one (1) to step five (5) and materials, according to some embodiments of the present disclosure. For example, step 1 includes starting with a substrate 1080C, wherein step 2 includes depositing of sacrificial layers 1079C on the substrate 1080C.

Step 3 of FIG. 10C includes depositing of metal on the sacrificial layer 1079C, serving as the metal gate (G) 1070C by electron-beam evaporation, wherein a length of the metal layer 1070C is less than the sacrificial layer 1079C creating edges on both sides of the metal layer 1070C, which is for contact and connecting with outside world. Step 4 includes an optional buffer layer 1060C deposited on the metal gate layer 1070C at 250° C. using atomic layer deposition (ALD) with tetrakis(dimethylamido)titanium (TDMAT) and ammonia ($NH_3$) as the precursors, wherein the buffer layer 1060D is shorter than the metal gate 1070D, creating edges on both sides of the buffer layer 1060D, which is for contact and connecting with outside world. Step 5 includes depositing a ferroelectric layer 1050C on top of the buffer layer 1060C; at the approximate length of the buffer layer 1060D, continuing the edges on both sides of both the buffer layer 1060C and ferroelectric layer 1050C.

Figure 10D:
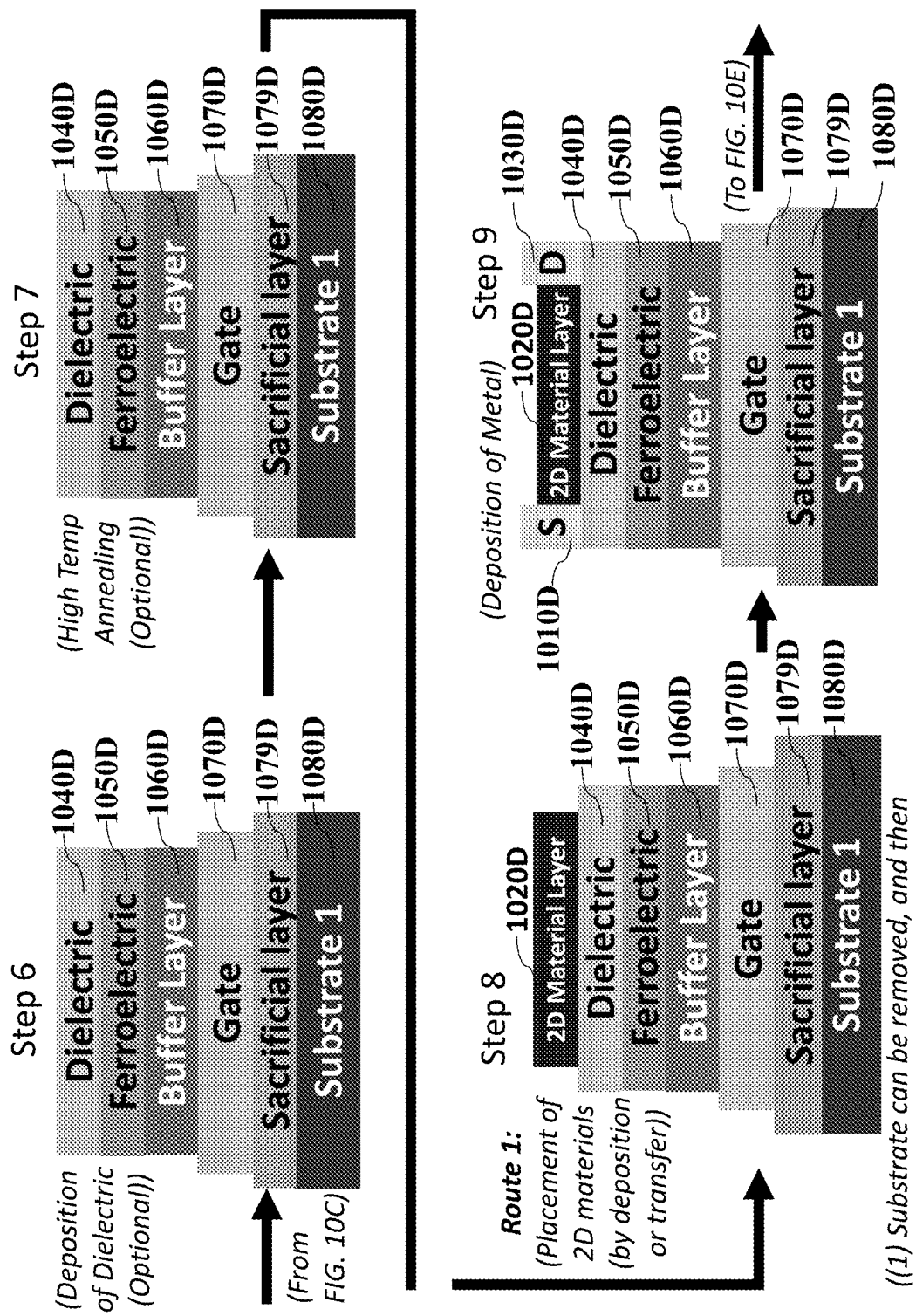
FIG. 10D is a schematic illustrating the device first structure continued fabrication process of FIG. 10C, showing fabrication process continued steps six (6) to step nine (9) and materials, completing the fabrication process for the device first structure, according to some embodiments of the present disclosure.

FIG. 10D is a schematic illustrating the device first structure continued fabrication process of FIG. 10C, showing fabrication process continued steps six (6) to step nine (9) and materials, according to some embodiments of the present disclosure. For example, step 6 includes optionally depositing a dielectric layer 1040D on top of the ferroelectric layer 1050D, continuing the edges on both sides of the dielectric layer 1040D, the ferroelectric layer 1050C and buffer layer 1060C.

Step 7 of FIG. 10D includes positioning a 2D material layer 1020D on top of the dielectric layer 1040D, wherein a length of the 2D material layer 1020D is shorter than the dielectric layer 1040D, creating edge on both sides of the 2D material layer 1020D. Notes is that the substrate 1080D can be removed and then 3162 flexible electronics with memory functions can be applied to a skin of a human, by non-limiting example, which may be later referred as substrate 2. Step 9 includes depositing metal layers 1010D, 1030D on the edges of both sides of the 2D material layer 1020D, completing the fabrication process for the device first structure.

Figure 10E:
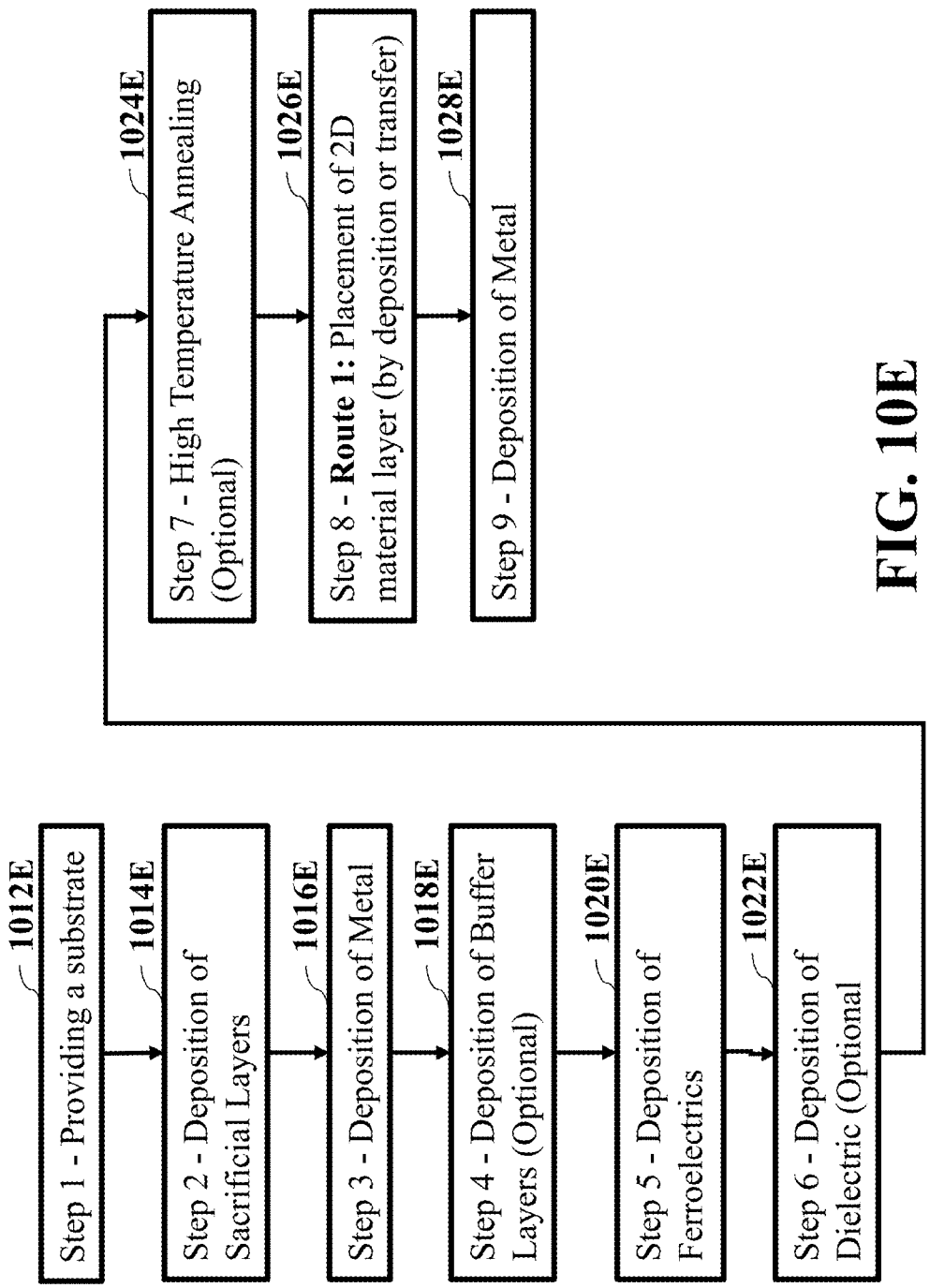
FIG. 10E is a block diagram illustrating all the fabrication process steps one (1) to eleven (9) of the device first structure, according to some embodiments of the present disclosure.

FIG. 10E is a block diagram illustrating all the fabrication process steps one (1) to eleven (9) of the device first structure, according to some embodiments of the present disclosure. For example, step 1 includes providing a substrate 1012E; step 2 includes depositing sacrificial layers 1014E on the substrate 1012E. Step 3 includes depositing metal 1016E on top of the sacrificial layers 1014E, with the length shorter than the sacrificial layer 1014E and creating edges on both sides. Step 4 includes depositing buffer layers 1018E on the metal layer or gate 1016E, wherein the buffer layers 1018E have a length less than the metal layer 1016E to create edges on both sides of the buffer layers 1018E. Step 5 includes depositing a ferroelectric layer 1020E on top of the buffer layers 1018E, along with have the same configuration as the buffer layers 1018E, maintaining the edges on both side of the two materials. Step 6 includes optionally depositing a dielectric material 1022E on the ferroelectric layer 1020E, along with have the same configuration as the ferroelectric layer 1020E.

Step 7 of FIG. 10E includes optionally providing a high temperature annealing process. Step 8 includes a first route 1, placing 2D material layer 1020E via depositing or transfer on top of the dielectric layer 1040E, wherein a length of the 2D material layer 1020E is less than a length of the dielectric material 1040E, so as to create edges on both sides of the 2D material layer 1020E. Step 9 includes depositing metal layers 1010E, 1030E on the edges of both sides of the 2D material layer 1020E, to complete the fabrication process of the device first structure.

Figure 11:
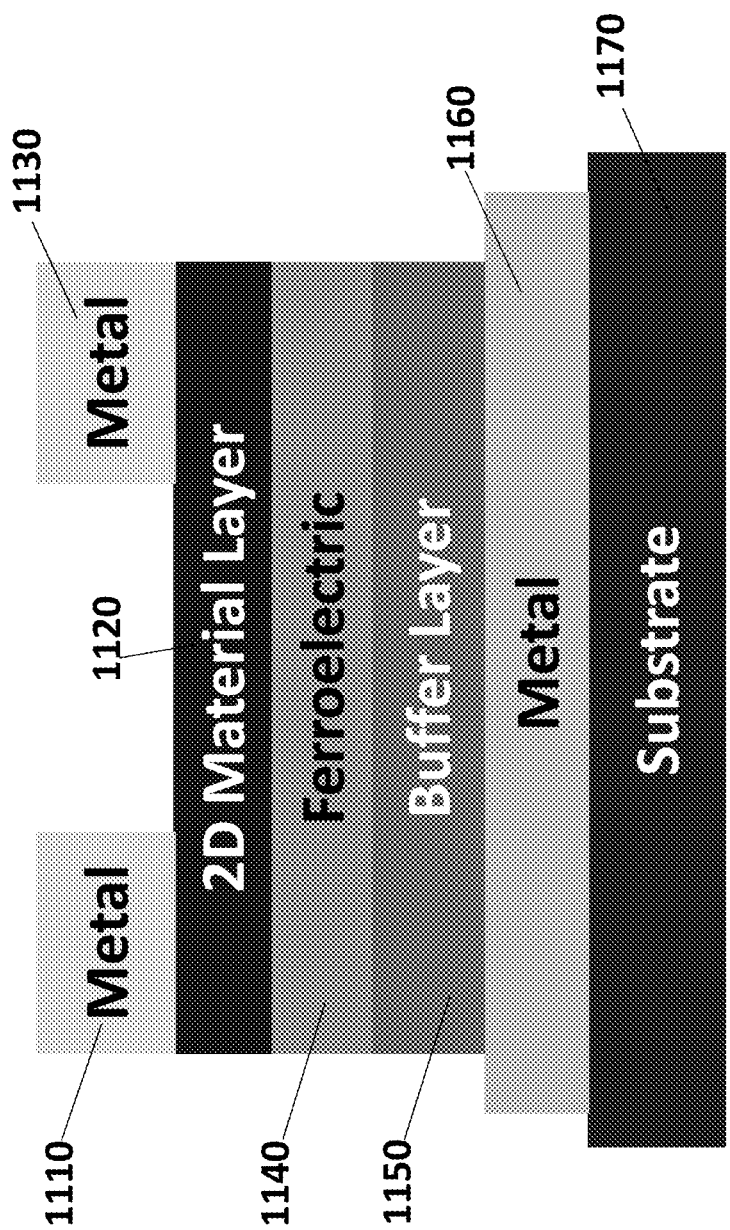
FIG. 11 is a schematic illustrating a view of a device second structure, according to an embodiment of the present disclosure.

FIG. 11 is a schematic illustrating a side view of a device second structure, according to an embodiment of the present disclosure. The device second structure includes a substrate 1170, metal layer 1160 or gate having a length less than the substrate 1170 to create edges on both sides, a buffer layer 1150 having a length less than the metal layer 1160 to create edges on both sides, a ferroelectric layer 1140 having a same length as the buffer layer 1150, 2D material layer having a same length as the ferroelectric layer 1140 and two metal layers 1110, 1130 on each end length of the 2D material layer 1120 creating a cavity between the two metal layers 1110, 1130.

Figure 12A:
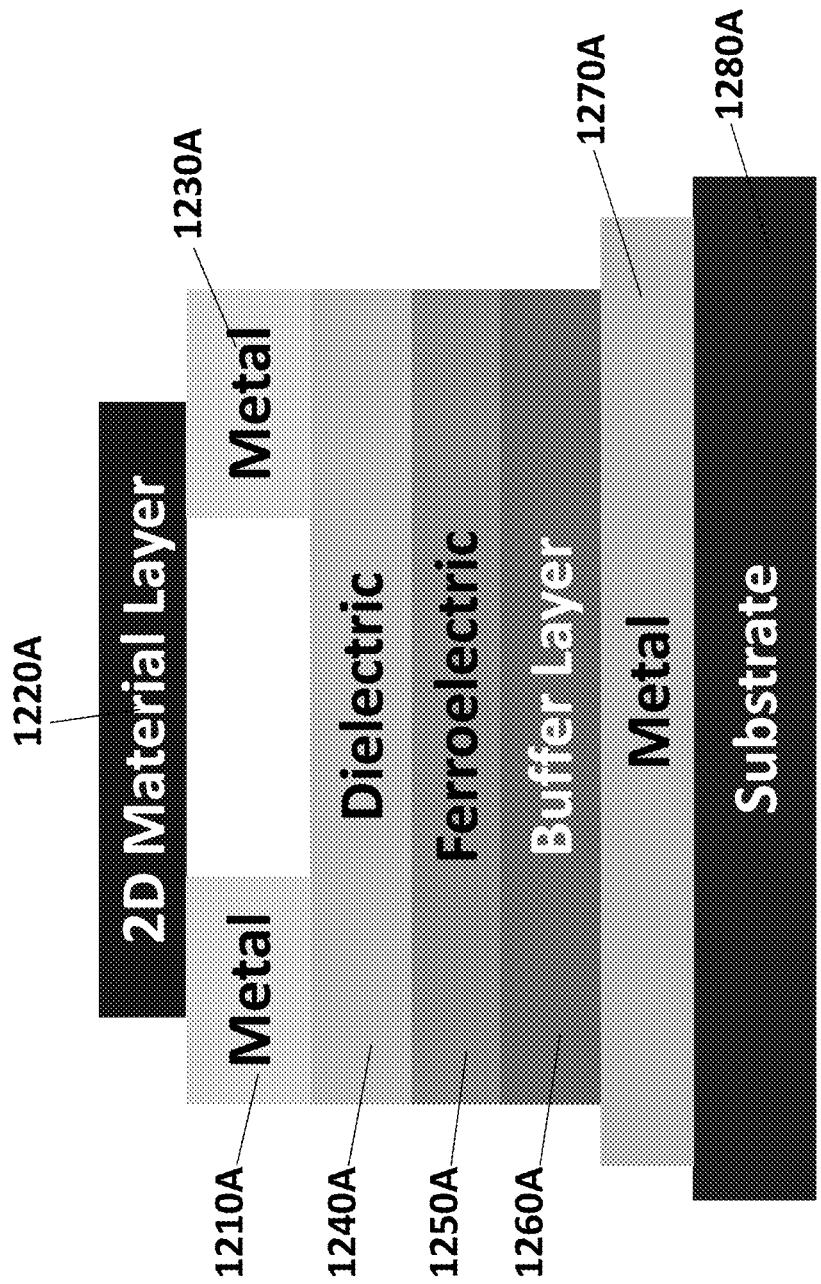
FIG. 12A is a schematic illustrating a view of a device third structure, according to an embodiment of the present disclosure.

FIG. 12A is a schematic illustrating a view of a device third structure, according to an embodiment of the present disclosure. For example, FIG. 12A shows the device third structure including a 1280A is a substrate. 1270A is a metal layer serving as the gate electrode. 1260A is a buffer layer (e.g. TiN, ITO) for enhancing the ferroelectric properties of the ferroelectric layer (1250A). 1250 A is the ferroelectric layer. 1240A is the dielectric layer to passivate the ferroelectric surface and lowering the switching energy. 1210A and 1230A are the electrodes for the source and drain of the ferroelectric transistor. 1220A is the two-dimension material serving the device channel. a substrate 1280A, metal layer 1270A or gate having a length less than the substrate 1280A to create edges on both sides, for future contact and connecting to the outside world] a buffer layer 1260A having a length less than the metal layer 1270A to create edges on both sides to facilitate the voltage supply, which is for future contact and connecting to the outside world. A ferroelectric layer 1250A having a same length as the buffer layer 1260A, a dielectric layer 1240A having a same length as the ferroelectric layer 1250A, two metal layers 1210A, 1230A on each end length of the dielectric layer 1240A creating a cavity between the two metal layers 1210A, 1230A, and a 2D material layer 1220A, positioned on top of the metal layers 1210A, 1230A covering the cavity, wherein a length of the 2D material layer 1220A is less than the length of the dielectric layer 1240A, creating edges on both sides of the 2D material layer 1220A, which is for future contact and connecting to the outside world.

Figure 12B:
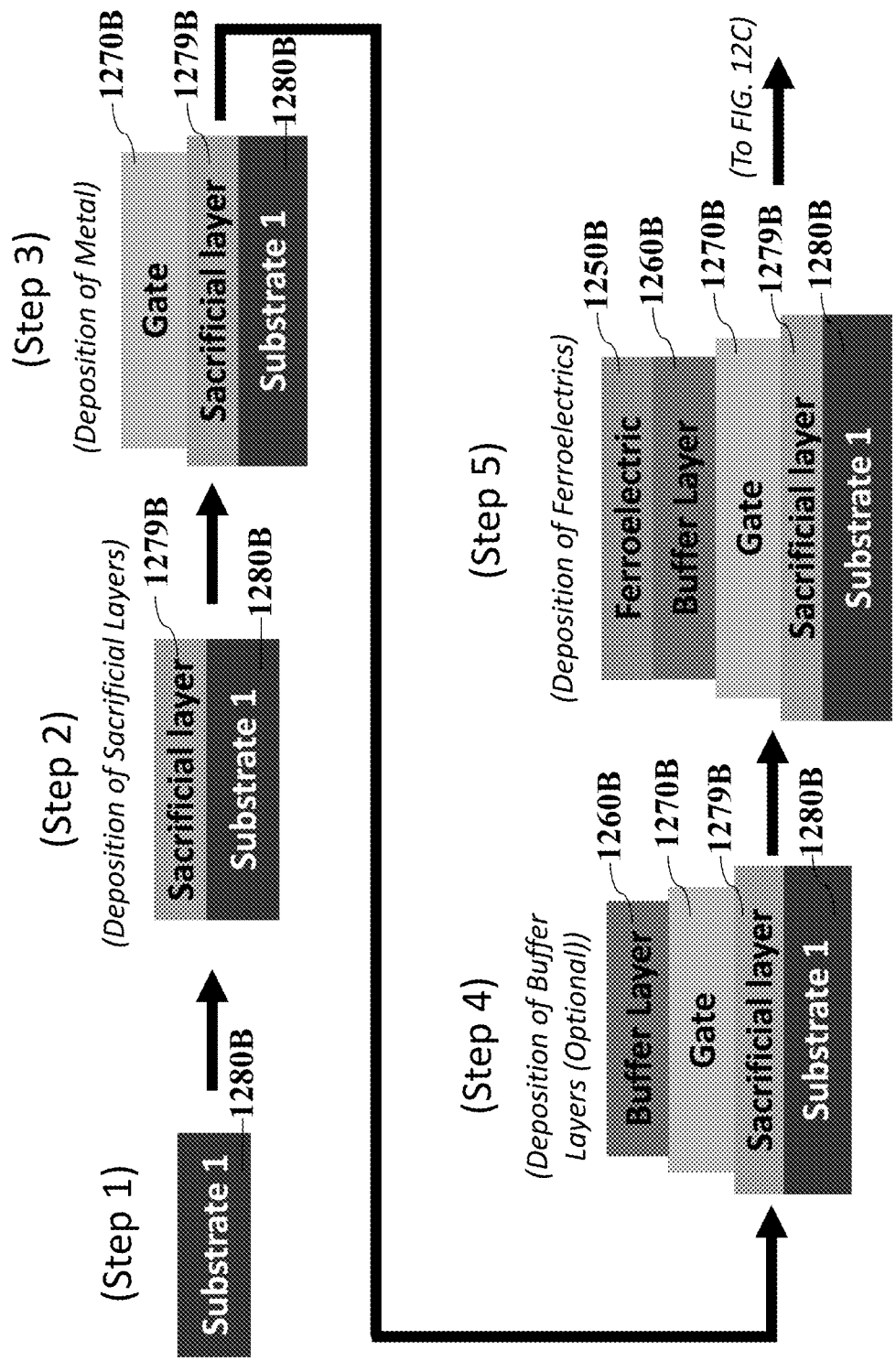
FIG. 12B is a schematic illustrating a fabrication process of the device third structure, showing fabrication process steps one (1) to step five (5) and materials, according to some embodiments of the present disclosure.

FIG. 12B is a schematic illustrating details of a fabrication process of the device third structure of FIG. 12A, showing fabrication process steps one (1) to step five (5) and materials, according to some embodiments of the present disclosure. For example, step 1 includes starting with a substrate 1280B, wherein step 2 includes depositing of sacrificial layers 1279B on the substrate 1280B.

Step 3 of FIG. 12B includes depositing of metal on the sacrificial layer 1279B, serving as the metal gate (G) 1270B by electron-beam evaporation. Step 4 includes an optional buffer layer 1260B deposited on the metal gate layer 1270B at 250° C. using atomic layer deposition (ALD) with tetrakis (dimethylamido)titanium (TDMAT) and ammonia ($NH_3$) as the precursors, wherein the buffer layer 1260B is shorter than the metal gate 1270B, creating edges on both sides of the buffer layer 1260B which is for future contact and connecting to the outside world. Step 5 includes depositing a ferroelectric layer 1250B on top of the buffer layer 1260B, at the approximate length of the buffer layer 1260B, continuing the edges on both sides of both the buffer layer 1260B and ferroelectric layer 1250B.

Figure 12C:
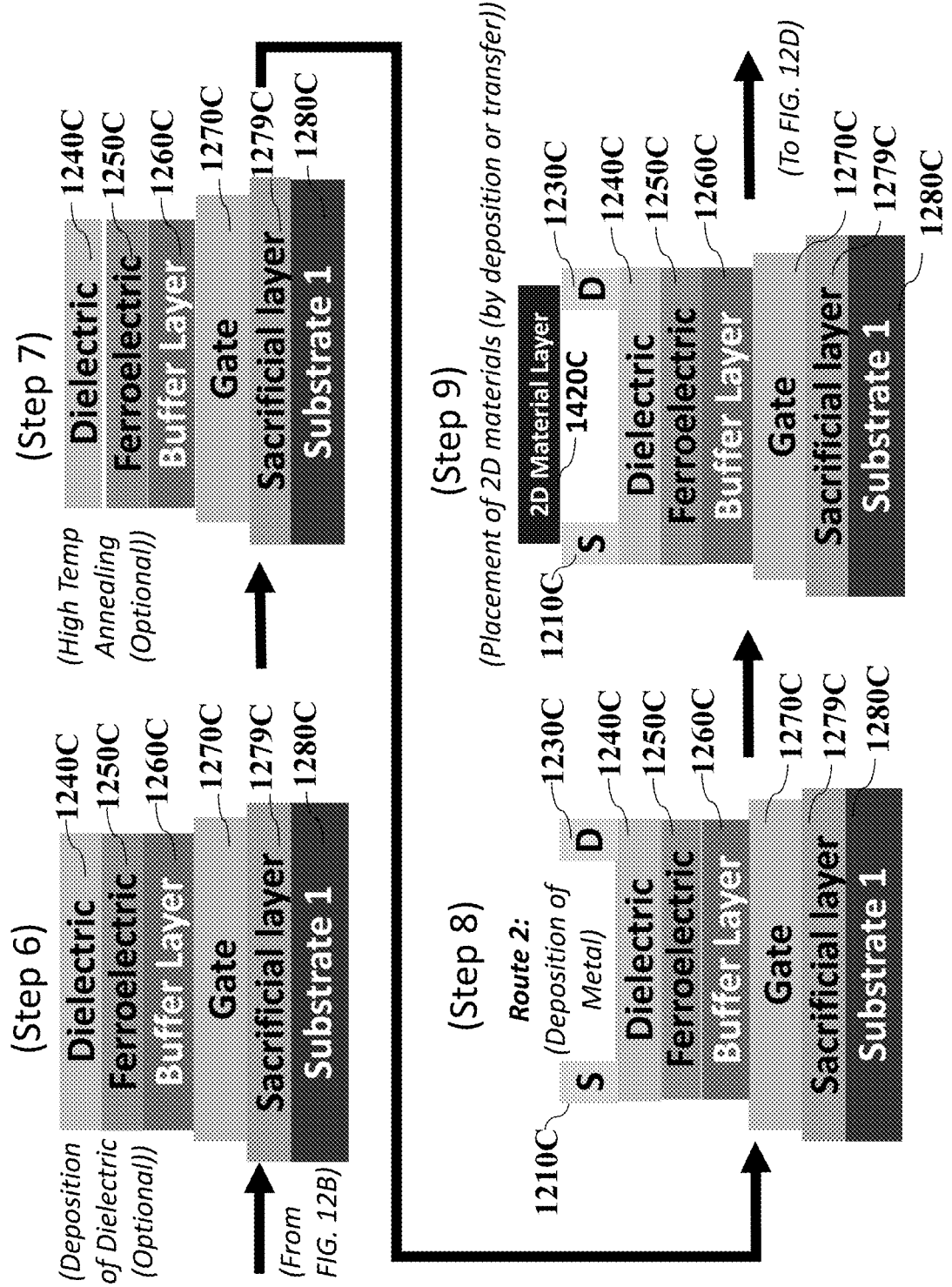
FIG. 12C is a schematic illustrating the device third structure continued fabrication process of FIG. 12B, showing fabrication process continued steps six (6) to step nine (9) and materials, according to some embodiments of the present disclosure.

FIG. 12C is a schematic illustrating the device third structure continued fabrication process of FIG. 14C, showing fabrication process continued steps six (6) to step nine (9) and materials, according to some embodiments of the present disclosure. For example, step 6 includes optionally depositing a dielectric layer 1240C on top of the ferroelectric layer 1250C, continuing the edges on both sides of the dielectric layer 1240C, the ferroelectric layer 1250C and buffer layer 1260C.

Step 7 of FIG. 12C includes optionally applying a high temperature annealing to the structure of step 6. Step 8 includes applying metal portioned layers 1210C, 1230C on the top surface ends of the dielectric layer 1240C, leaving a cavity between the metal layers 1210C, and 1230C. Step 9 includes depositing 2D material layer 1220C over the top surfaces of the metal layers 1210C, 1230C, covering the cavity, and completing the fabrication process for the device third structure. By putting the 2D material layer on the top of the device. The properties of the 2D materials can be preserved.

Figure 12D:
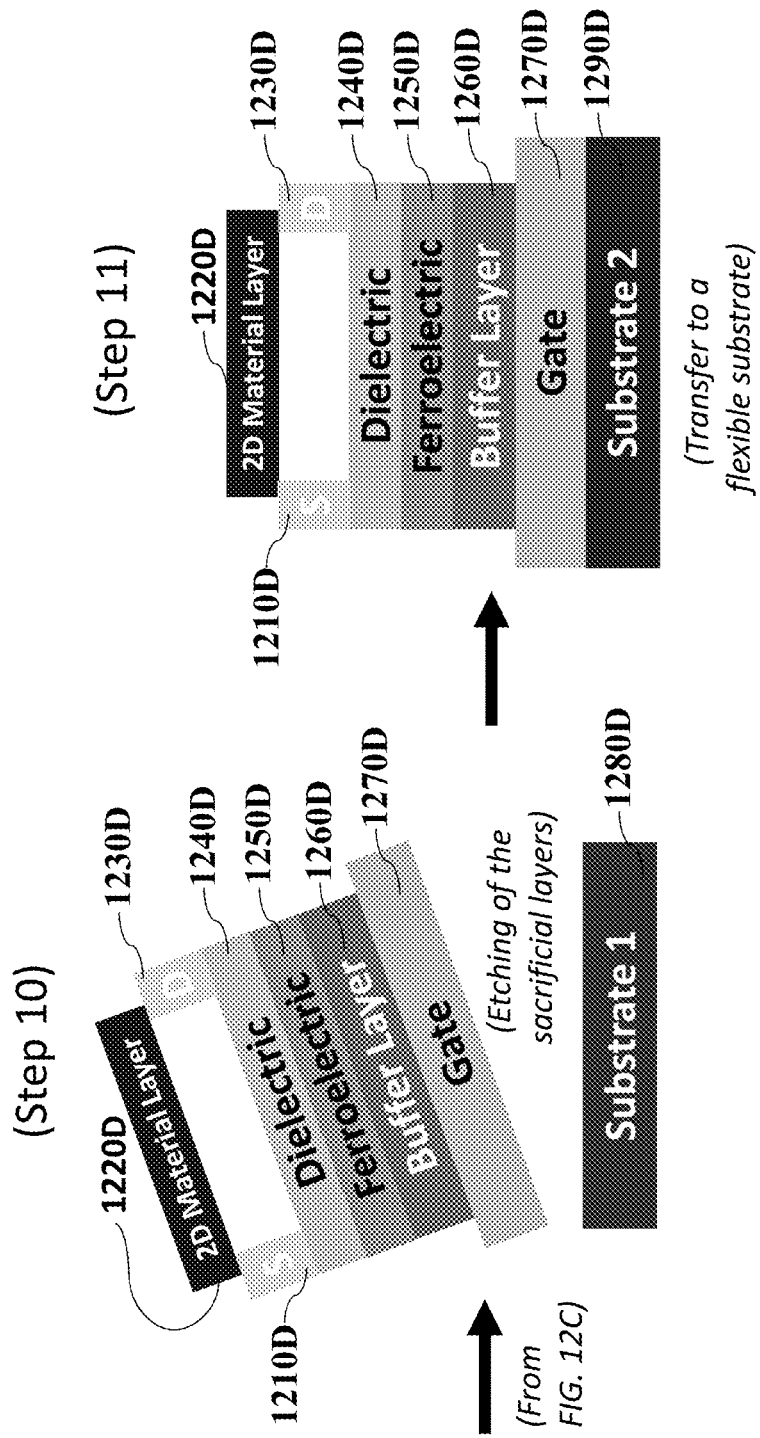
FIG. 12D is a schematic illustrating the device third structure continued fabrication process of FIG. 10D, showing fabrication process continued steps ten (10) to step eleven (11) and materials, according to some embodiments of the present disclosure.

FIG. 12D is a schematic illustrating the device third structure continued fabrication process of FIG. 12C, showing fabrication process continued steps ten (10) to step eleven (11) and materials, according to some embodiments of the present disclosure. Step 10 includes etching of the sacrificial layer 1279C The sacrificial layer can be oxides such as silicon oxide or aluminum oxide, which can be chemically etched by alkaline solution (Sodium hydroxide or Potassium hydroxide). After removing the sacrificial layer, the device can be separated from the original substrate. Step 11 includes transferring the device to a flexible substrate, and then the device can be placed on any desirable substrate such as skin and cloth. As noted above, the 2D material layer 1220D is place on top of the source 1210D and drain 1230D, creating a cavity underneath the 2D material layer 1220D.

Figure 12E:
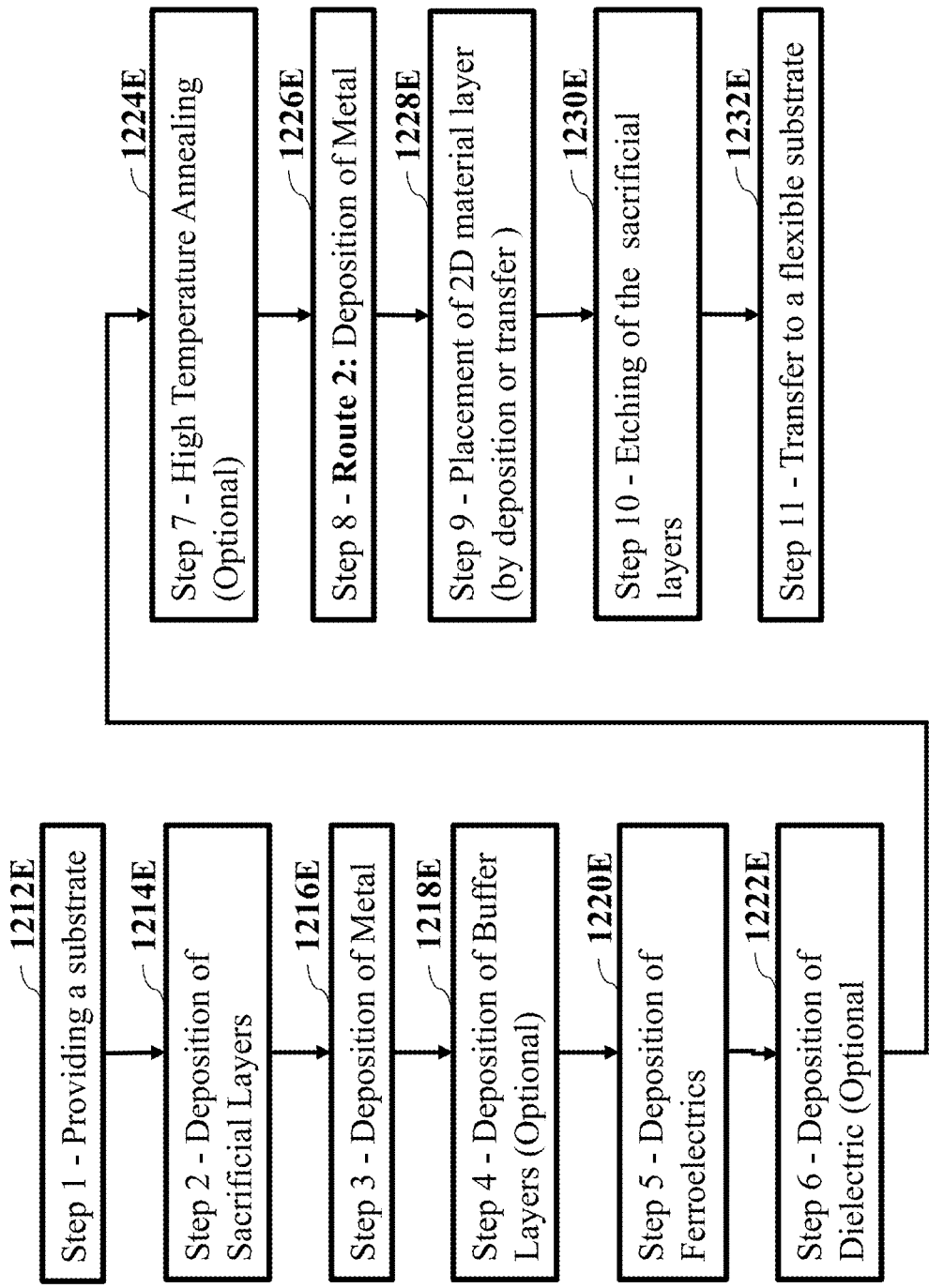
FIG. 12E is a block diagram illustrating all the fabrication process steps one (1) to eleven (11) of the device third structure, according to some embodiments of the present disclosure.

FIG. 12E is a block diagram illustrating all the fabrication process steps one (1) to eleven (9) of the device third structure, according to some embodiments of the present disclosure. For example, step 1 includes providing a substrate 1212E; step 2 includes depositing sacrificial layers 1214F on the substrate 1212E. Step 3 includes depositing metal 1216E on top of the sacrificial layers 1214E, with the length smaller than the sacrificial layers 1214E. Step 4 includes depositing buffer layers 1218E on the metal layer or gate 1216E, wherein the buffer layers 1218E have a length less than the metal layer 1216E to create edges on both sides of the buffer layers 1218E. Step 5 includes depositing a ferroelectric layer 1220E on top of the buffer layers 1218E, along with have the same configuration as the buffer layers 1218E, maintaining the edges on both side of the two materials. Step 6 includes optionally depositing a dielectric material 1222E on the ferroelectric layer 1220E, along with have the same configuration as the ferroelectric layer 1220E.

Step 7 of FIG. 12E includes optionally providing a high temperature annealing process. Step 8 includes a second route 2, placing depositing metal 1210E, 1230E on the edges of both sides of the dielectric 1240E. Step 9 includes placing of the 2D material layer 1220E on top surfaces of the metal layers 1210E, 1230E covering the cavity, wherein a length of the 2D material layer 1220E is less than the length of the dielectric layer 1240E creating edges on both sides, to complete the fabrication process of the device third structure.

Figure 13:
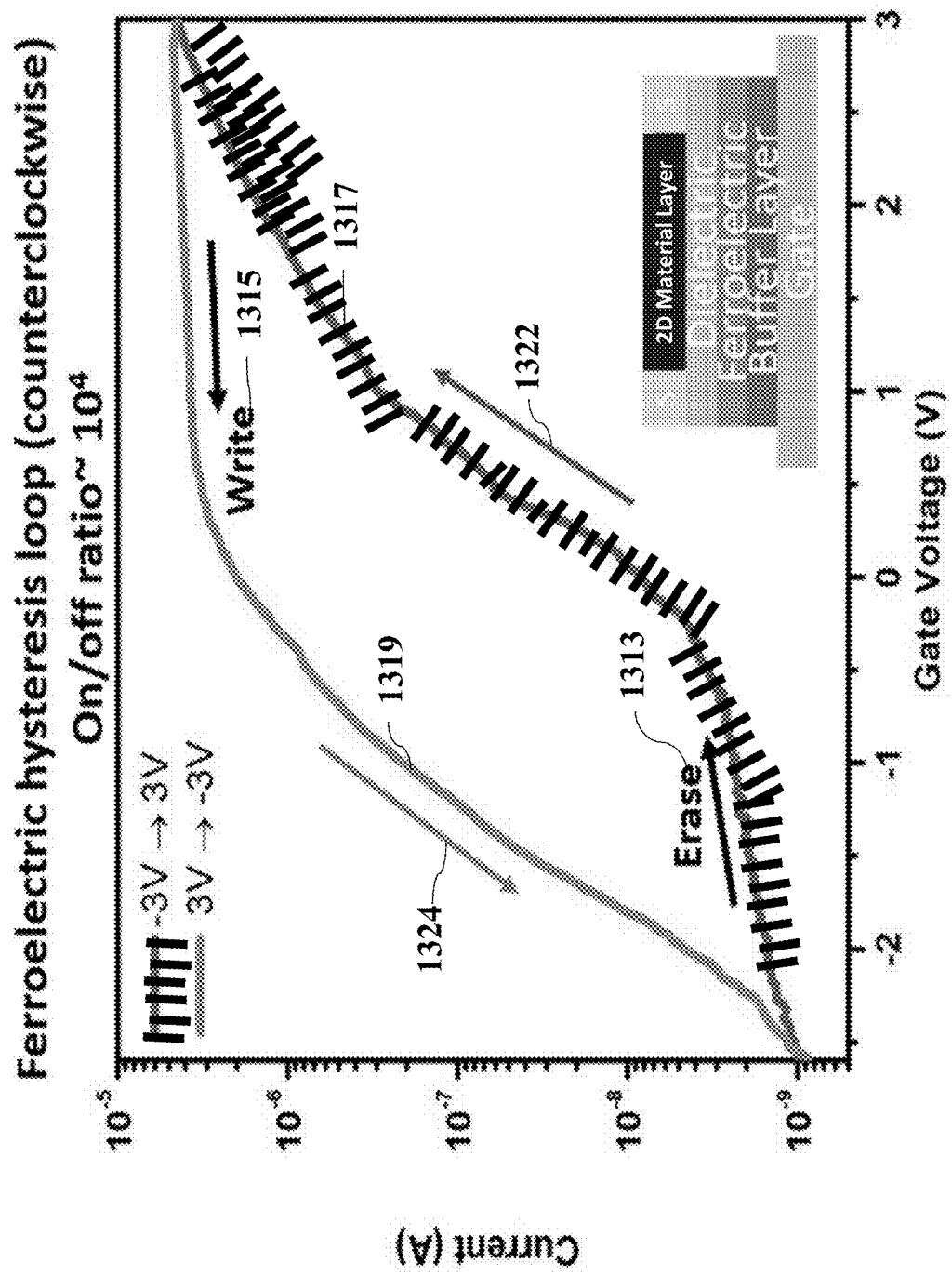
FIG. 13 shows a graph illustrating a first performance of a ferroelectric hysteresis loop (counterclockwise) on/off ratio~$10^4$, according to some embodiments of the present disclosure.

FIG. 13 shows a graph illustrating a first performance of a ferroelectric hysteresis loop (counterclockwise) on/off ratio~$10^4$, according to some embodiments of the present disclosure. 1315 is the low resistance state (or write program) of the device. 1313 is the high resistance state (or erase program) of the device. 1322 represents the gate voltage sweeping from negative to positive, resulting the 1317 curve. Wherein 1324 represents the gate voltage sweeping from positive to negative, resulting the 1319 curve. Further, aspects of FIG. 13 include that the 3162 structure performs at a higher current than prior art structures, because the 2D material layer is not degraded from manufacture. Some aspects provide for: (a) allowing for higher conductance over prior art structures at 10-6, rather than 10-7 of prior art; (b) resistance switching device, from POS to NEG, or NEG to POS; and (c) prior art operates at 20V rather than at 3V—3162, of the present disclosure.

Figure 14:
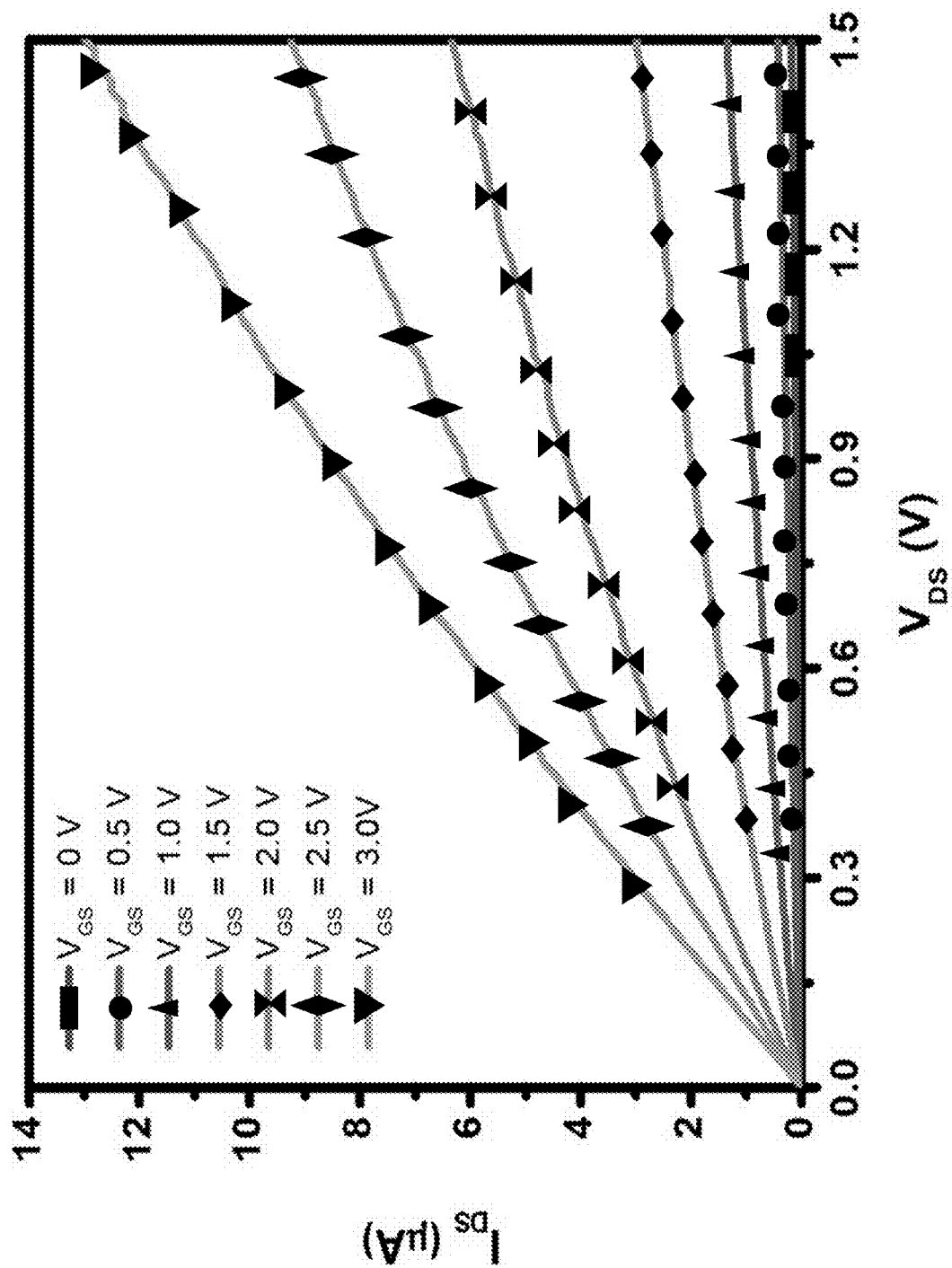
FIG. 14 shows a graph illustrating a second performance a good transistor behavior from a 2D channel, indicating that a quality of the 2D material layer does not degrade during the fabrication process, according to some embodiments of the present disclosure.

FIG. 14 shows a graph illustrating a second performance a good transistor behavior from a 2D channel, indicating that a quality of the 2D material of the 2D layer does not degrade during the fabrication process, according to some embodiments of the present disclosure. The drain-to-source is controlled by the applied gate voltage, indicating a good transistor characteristic. Some aspects include good transistor behavior from the 2D channel, indicating that the quality of the 2D material does not degrade during the fabrication.

Features

An embodiment of the present disclosure includes a transistor device including a flexible memory cell. The flexible memory cell including a gate stack with sidewalls provided over a substrate. The gate stack including a metal gate layer provided over the substrate. A buffer layer provided over the metal gate layer. A ferroelectric layer provided over the buffer layer. A dielectric layer provided over the ferroelectric layer. Further, a two-dimensional (2D) material layer provided over a portion of a top surface of the dielectric layer. Source and drain regions provided on separate portions of the top surface of the dielectric layer so as to create a cavity that the 2D material layer are located. Wherein the following aspects below are contemplated as configuring a modified embodiment of the above embodiment.

An aspect can include the 2D material layer include grown molybdenum disulfide ($MoS_2$) flakes transferred to the portion of the top surface of the dielectric layer. Another aspect can include a ratio between the dielectric material layer and the ferroelectric layer, operatively provide tuneability of an operating voltage of the transistor device along with an ability to reduce the operating voltage of the transistor device.

Another aspect of the present disclosure can include a structural configuration of the 2D material layer location positioned on a top of the gate stack, provides for metal foils or conductive foils as a gate electrode, resulting a transferring of the transistor device to substrates having material properties including one of, ductility including stretching and bending, elasticity including flexing and a tensile strength.

An aspect of the present disclosure includes the metal gate layer is a titanium (Ti)/gold (Au) layer acting as a gate electrode, the buffer layer is a titanium nitride (TiN) layer, the ferroelectric layer is an inorganic ferroelectric film of zirconium-doped hafnium oxide ($HfZrO_x$) layer, and the dielectric layer is an dielectric hafnium(IV) oxide ($HfO_2$) layer acting as a passivation layer.

According to another aspect of the present disclosure, the dielectric layer is an dielectric hafnium(IV) oxide ($HfO_2$) layer that is inserted between the 2D material layer, and the ferroelectric layer is inorganic ferroelectric film of zirconium-doped hafnium oxide ($HfZrO_x$). Wherein the $HfZrO_x$ layer operates as preserving a ferroelectricity of the underlying HfZrO$_x$ layer through a surface passivation, and as lowering a threshold poling voltage of the transistor device.

According to another aspect of the present disclosure, the dielectric layer is an dielectric hafnium(IV) oxide (HfO$_2$) layer placed between the 2D material layer and the ferroelectric layer, and the 2D material layer are a semiconducting MoS$_2$ channel. Wherein a structural configuration of the semiconducting MoS$_2$ channel and the ferroelectric layer in the gate stack, act as a passivation layer that stabilizes a ferroelectricity of the transistor device.

According to another aspect of the present disclosure, the transistor device is a single-layer MoS$_2$ ferroelectric field-effect transistor (FeFET), such that a structural configuration of the gate stack includes positioning the dielectric layer on the ferroelectric layer with the underlying metal gate, which the structural configuration operatively provides an amplification of a MoS$_2$ photoluminescence (PL), that originates from Fabry-Perot cavity reflection of a bottom gate mirror created by the structural configuration. Further, another aspect can include the transistor device is a single-layer MoS$_2$ ferroelectric field-effect transistor (FeFET), such that the MoS$_2$ FeFET driving voltage (±3V).

Another aspect can include the source and the drain regions provided on separate portions of the top surface of the dielectric layer, together cover one of, at least 15%, at least 20%, at least 30% or less than 45%, of an overall surface of the top surface of the dielectric layer. Further still, another aspect can include the 2D material layer cover one of, at least 50%, at least 60% or less than 70% of a total overall surface of the top surface of the HfO$_2$ layer.

According to another embodiment of the present disclosure, a transistor device having a flexible resistive switching memory cell. The flexible resistive switching memory cell including a gate stack with sidewalls provided over a supporting substrate. The gate stack including a metal gate layer provided over the substrate. A buffer layer provided over the metal gate layer. A ferroelectric layer provided over the buffer layer. A dielectric layer provided over the ferroelectric layer. Two-dimensional (2D) materials that are a MoS$_2$ monolayer including grown MoS$_2$ flakes transferred over a portion of a top surface of the dielectric layer. Source and drain regions provided on separate portions of the top surface of the dielectric layer which create a cavity that the 2D material layer are located. Wherein the following aspects below are contemplated as configuring a modified embodiment of the above embodiment.

An aspect of the present disclosure can include the buffer layer is titanium nitride (TiN) material, the ferroelectric layer is an inorganic ferroelectric film of zirconium-doped hafnium oxide (HfZrO$_x$), and the dielectric layer is a dielectric hafnium(IV) oxide (HfO$_2$) material.

Another aspect can include a structural configuration of the gate stack of arranging the HfO$_2$ layer on the HfZrO$_x$ layer along with the underlying metal gate, operatively acts as a mirror layer that enhances a light-matter interaction of the MoS$_2$ monolayer, through an enhanced optical absorption and Fabry-Perot cavity reflection.

Another aspect can include a dynamic write/read/erase/read processes of the MoS$_2$ FeFET is obtained by applying alternating pulses onto the metal gate, such that voltages applied to the metal gate of dynamic write, erase, measured +3 V, −3V, and 0 V, respectively, by a measuring device, and a dynamic write/read ratio is determined as over 10$^2$ under various drain-to-source voltages (V$_{DS}$) equaling 0.4 V.

According to another embodiment of the present disclosure, a single-layer molybdenum disulfide (MoS$_2$) ferroelectric field-effect transistor (FeFET) including a flexible memory cell. The flexible memory cell includes a gate stack with sidewalls provided over a supporting substrate. The gate stack includes a metal layer acting as a metal gate provided over a supporting substrate. A titanium nitride (TiN) buffer layer provided over the metal layer. Inorganic ferroelectric film of zirconium-doped hafnium oxide (HfZrO$_x$) provided over the TiN buffer. A dielectric hafnium(IV) oxide (HfO$_2$) layer provided over the HfZrO$_x$ film. Two-dimensional (2D) materials including grown MoS$_2$ flakes transferred on to a portion of a top surface of the HfO$_2$ layer. Source and drain regions provided on separate portions on the top surface of the HfO$_2$ layer so as to create a cavity that the 2D material layer are located. Wherein the following aspects below are contemplated as configuring a modified embodiment of the above embodiment.

An aspect can include a structural configuration of the 2D material layer location positioned on a top of the gate stack, operatively provides for metal foils or conductive foils as a gate electrode, resulting a transferring of the transistor device to flexible substrates. Wherein a shape of the source and the drain regions are non-uniform, and the flexible memory cell is a flexible resistive switching nonvolatile memory cell.

An aspect can include a structural configuration of the 2D material layer location positioned on a top of the gate stack, is arranged so the 2D material layer cover one of at least 60%, at least 75% or less than 80% of a total overall surface of the top surface of the HfO$_2$ layer.

According to another embodiment of the present disclosure, a method of fabricating a flexible non-volatile memory cell. The method including providing a gate stack with sidewalls over a supporting substrate. The gate stack including providing a metal gate layer over the supporting substrate. Providing a buffer layer over the metal gate layer. Providing a ferroelectric layer over the buffer layer, then initial a rapid thermal annealing. Providing a dielectric layer over the ferroelectric layer. Providing two-dimensional (2D) materials over a portion of a top surface of the dielectric layer. Providing source and drain regions on separate portions of the top surface of the dielectric layer creating a cavity, wherein the 2D material layer is positioned in the cavity. Wherein the following aspects below are contemplated as configuring a modified embodiment of the above embodiment.

An aspect can include the 2D material layer is a single-layer molybdenum disulfide (MoS$_2$) ferroelectric field-effect transistor (FeFET), that includes a monolayer MoS$_2$, synthesized on a silicon dioxide (SiO$_2$)/silicon (Si) substrate, to obtain as-grown MoS$_2$ flakes 221A, the as-grown MoS$_2$ flakes are then transferred onto a hybrid dielectric layer/ferroelectric layer substrate or a dielectric hafnium(IV) oxide (HfO$_2$)/inorganic ferroelectric film of zirconium-doped hafnium oxide (HfZrO$_x$) substrate, through wet transfer technique.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided.

Two layers in direct contact: Two layers that are in direct contact can be understood to be an arrangement where two contacting layers have no other intervening layer(s) present. That is, a direct physical contact between the two layers.

Two-dimensional (2D) semiconductor layer: A two-dimensional (2D) semiconductor layer refers to a semiconductor layer comprising a 2D material layer. Such materials have interesting properties in terms of anisotropic mobility and therefore allow for future scaling of transistor performance. For example, in some embodiments, a 2D material layer may have a dimension in one direction that is smaller than dimensions in other orthogonal directions, such that at least one physical property in the one direction may be different compared to the physical property in the other orthogonal directions. For example, physical properties that may be direction-dependent include band gap, electrical and/or thermal conductivities, density of states, carrier mobility's, etc. For example, when a 2D material layer is formed as a sheet in a plane formed by x and y directions and has a dimension in an orthogonal z direction that is sufficiently smaller compared to dimensions in the x and y directions, the 2D material layer may have a band gap that is different, e.g., greater, than a band gap in x and/or y directions. In addition, in some embodiments, 2D material layer may be a material having a layered structure, where atoms of the 2D material layer may have one type of bonding in x and y directions while having a different type of bonding in the z direction. For example, the atoms of the 2D material layer may be covalently bonded in x and y directions while being weakly bound, e.g., by Van der Waals forces, in the z direction.

Components connected in series: Components of an electrical circuit or electronic circuit can be connected in series, wherein the components connected in series are connected along a single path, so the same current flows through all of the components.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

What is claimed is:

1. A transistor device including a memory cell, the memory cell comprising:
    a gate stack with sidewalls provided over a supporting substrate, the gate stack including:
        a metal gate layer provided over the supporting substrate;
        a titanium nitride (TiN) buffer layer provided between the metal gate layer and a ferroelectric layer; and
        a dielectric layer provided over the ferroelectric layer;
    a two-dimensional (2D) material layer provided onto a portion of a top surface of the dielectric layer; and
    source and drain regions provided on separate portions of the top surface of the dielectric layer so as to create a cavity in which the 2D material layer is positioned in the cavity.

2. The memory cell of claim 1, wherein the 2D material layer include grown molybdenum disulfide ($MoS_2$) flakes transferred to the portion of the top surface of the dielectric layer.

3. The memory cell of claim 1, wherein a ratio of thicknesses of the dielectric material layer and the ferroelectric layer, operatively provide tuneability of an operating voltage of the transistor device along with an ability to reduce the operating voltage of the transistor device.

4. The memory cell of claim 1, wherein a structural configuration of the 2D material layer location positioned on a top of the gate stack, resulting a transferring of the transistor device including the supporting substrate or not including the supporting substrate, then to other substrates having material properties including one of, ductility including stretching and bending, elasticity including flexing and a tensile strength.

5. The memory cell of claim 1, wherein the metal gate layer is a titanium (Ti)/gold (Au) layer acting as a gate electrode, the ferroelectric layer is an inorganic ferroelectric film of zirconium-doped hafnium oxide ($HfZrO_x$) layer, and the dielectric layer is a dielectric hafnium(IV) oxide ($HfO_2$) layer acting as a passivation layer.

6. The memory cell of claim 1, wherein the dielectric layer is a dielectric hafnium(IV) oxide ($HfO_2$) layer that is inserted between the 2D material layer and the ferroelectric layer, such that the ferroelectric layer is inorganic ferroelectric film of zirconium-doped hafnium oxide ($HfZrO_x$),
    such that the $HfZrO_x$ layer serves as a passivation layer as preserving a ferroelectricity of the underlying $HfZrO_x$ layer through a surface passivation, and as lowering a threshold poling voltage of the transistor device, such that a lowering of a voltage results in a change of resistance which initiates a memory effect of a state of resistance transition to either a first state of resistance or to a second state of resistance.

7. The memory cell of claim 1, wherein the dielectric layer is a dielectric hafnium(IV) oxide ($HfO_2$) layer placed between the 2D material layer and the ferroelectric layer, and the 2D material layer is a semiconductor $MoS_2$ channel,
    and wherein the stabilization of the ferroelectricity of the transistor device is by the addition of HfO2 layer which widens a ferroelectric hysteresis loop in polarization as a function of voltage, but also reduces fluctuations of hysteresis loop, such that the $HfO_2$ layer serves as a passivation layer.

8. The memory cell of claim 1, wherein the transistor device is a single-layer $MoS_2$ ferroelectric field-effect transistor (FeFET), such that a structural configuration of the gate stack includes positioning the dielectric layer on the ferroelectric layer with the underlying metal gate, which the structural configuration operatively provides an amplification of a $MoS_2$ photoluminescence (PL).

9. The memory cell of claim 1, wherein the transistor device is a single-layer $MoS_2$ ferroelectric field-effect transistor (FeFET), such that the $MoS_2$ FeFET driving voltage ($\pm 3V$).

10. The memory cell of claim 1, wherein the source and the drain regions provided on separate portions of the top surface of the dielectric layer, together cover at least 15% of an overall surface of the top surface of the dielectric layer.

11. The memory cell of claim 1, wherein the 2D material layer covers at least 50% of a total overall surface of the top surface of the dielectric layer.

12. The memory cell of claim 3, wherein the dielectric material layer is connected to the ferroelectric layer, such that a total energy of the gate stack is redistributed and an energy barrier of two polarizations in the device is reduced, and wherein a level of reduced energy barrier is controlled by a thickness ratio of dielectric material layer to the ferroelectric layer, such that the thickness ratio of the dielectric material layer to the ferroelectric layer is equal to or less than 2.

13. A transistor device having a resistive switching memory cell, the resistive switching memory cell comprising:
a gate stack with sidewalls provided over a supporting substrate, the gate stack including:
a metal gate layer provided over the supporting substrate;
a titanium nitride (TiN) buffer layer provided between the metal gate layer and a ferroelectric layer; and
a dielectric layer provided over the ferroelectric layer;
two-dimensional (2D) materials that are a MoS$_2$ monolayer including grown MoS$_2$ flakes transferred onto a portion of a top surface of the dielectric layer; and
source and drain regions provided on separate portions of the top surface of the dielectric layer which create a cavity in which the 2D material layer is positioned in the cavity.

14. The resistive switching memory cell of claim 13, wherein the ferroelectric layer is an inorganic ferroelectric film of zirconium-doped hafnium oxide (HfZrO$_x$), and the dielectric layer is a dielectric hafnium(IV) oxide (HfO$_2$) material.

15. The resistive switching memory cell of claim 13, wherein a structural configuration of the gate stack of arranging the dielectric layer on the ferroelectric layer along with the underlying metal gate, operatively acts as a mirror layer that enhances a light-matter interaction of the MoS$_2$ monolayer, through an enhanced optical absorption.

16. The resistive switching memory cell of claim 13, wherein a dynamic write/read/erase/read processes of the MoS$_2$ FeFET is obtained by applying alternating pulses onto the metal gate, such that voltages applied to the metal gate of dynamic write, erase, measured +3 V, −3V, and 0 V, respectively, by a measuring device, and a dynamic write/read ratio is determined as over 10$^2$ under various drain-to-source voltages ($V_{DS}$) equaling 0.4 V.

17. The resistive switching memory cell of claim 13, wherein the transistor device is a single-layer MoS$_2$ ferroelectric field-effect transistor (FeFET), such that the MoS$_2$ FeFET driving voltage (±3V).

18. The resistive switching memory cell of claim 13, wherein the source and the drain regions provided on separate portions of the top surface of the dielectric layer, together cover at least 20% of an overall surface of the top surface of the dielectric layer.

19. The resistive switching memory cell of claim 13, wherein a structural configuration of the 2D material layer location positioned on a top of the gate stack, is arranged so the 2D material layer covers less than 70% of a total overall surface of the top surface of the dielectric layer.

20. A single-layer molybdenum disulfide (MoS$_2$) ferroelectric field-effect transistor (FeFET) including a memory cell, the memory cell comprising:
a gate stack with sidewalls provided over a supporting substrate, the gate stack including:
a metal layer acting as a metal gate provided over a supporting substrate;
a titanium nitride (TiN) buffer layer provided between the metal layer and an inorganic ferroelectric film of zirconium-doped hafnium oxide (HfZrO$_x$);
a dielectric hafnium(IV) oxide (HfO$_2$) layer provided over the HfZrO$_x$ film;
a two-dimensional (2D) material layer including grown MoS$_2$ flakes transferred on to a portion of a top surface of the HfO$_2$ layer; and
source and drain regions provided on separate portions on the top surface of the HfO$_2$ layer so as to create a cavity in which the 2D material layer is positioned in the cavity.

21. The memory cell of claim 20, wherein a structural configuration of the 2D material layer location positioned on a top of the gate stack, operatively provides for a metal foil used as a gate electrode allows transferring the gate stack together with the 2D material and the source and drain regions disposed on the gate stack to any substrate.

22. The memory cell of claim 20, wherein a shape of the source and the drain regions are non-uniform shape including a wave-like shape, and the memory cell is a resistive switching nonvolatile memory cell.

23. The memory cell of claim 20, wherein a structural configuration of the 2D material layer location positioned on a top of the gate stack, is arranged so the 2D material layer covers at least 60% of a total overall surface of the top surface of the HfO$_2$ layer.

24. The memory cell of claim 20, wherein the transistor device is a single-layer MoS$_2$ ferroelectric field-effect transistor (FeFET), such that the MoS$_2$ FeFET driving voltage (±3V).

25. The memory cell of claim 20, wherein the source and the drain regions provided on separate portions of the top surface of the dielectric layer, together cover less than 45% of an overall surface of the top surface of the dielectric layer.

26. The memory cell of claim 20, wherein a structural configuration of the 2D material layer location positioned on a top of the gate stack, is arranged so the 2D material layer cover less than 80% of a total overall surface of the top surface of the HfO$_2$ layer.

27. A transistor device including a memory cell, the memory cell comprising:
a gate stack with sidewalls provided over a supporting substrate, the gate stack including:
a metal gate layer is a titanium (Ti)/gold (Au) acting as a gate electrode provided over the supporting substrate;
a titanium nitride (TiN) buffer layer provided between the metal gate layer and a ferroelectric layer; and
a dielectric layer provided over the ferroelectric layer, wherein the ferroelectric layer is an inorganic ferroelectric film of zirconium-doped hafnium oxide (HfZrO$_x$) layer, and the dielectric layer is a dielectric hafnium (IV) oxide (HfO$_2$) layer acting as a passivation layer;
a two-dimensional (2D) material layer provided onto a portion of a top surface of the dielectric layer; and
source and drain regions provided on separate portions of the top surface of the dielectric layer so as to create a cavity in which the 2D material layer is positioned in the cavity.

28. A transistor device including a memory cell, the memory cell comprising:
a gate stack with sidewalls provided over a supporting substrate, the gate stack including:
a metal gate layer is a titanium (Ti)/gold (Au) acting as a gate electrode provided over the supporting substrate;
a titanium nitride (TiN) buffer layer provided between the metal gate layer and a ferroelectric layer; and
a dielectric layer provided over the ferroelectric layer, wherein a ratio of thicknesses between dielectric layer and the ferroelectric layer is about 0.3 to 0.5, so as to reduce an amount of switching voltage;

a two-dimensional (2D) material layer provided onto a portion of a top surface of the dielectric layer; and
source and drain regions provided on separate portions of the top surface of the dielectric layer so as to create a cavity in which the 2D material layer is positioned in the cavity.

* * * * *